(12) United States Patent
Lee et al.

(10) Patent No.: US 12,408,437 B2
(45) Date of Patent: Sep. 2, 2025

(54) ELECTROPHORESIS DISPLAY WITH HIGH APERTURE RATIO

(71) Applicant: SUPERC-TOUCH CORPORATION, New Taipei (TW)

(72) Inventors: Hsiang-Yu Lee, New Taipei (TW); Shang Chin, New Taipei (TW); Ping-Tsun Lin, New Taipei (TW); Chia-Cheng Lei, New Taipei (TW); Kun-Yu Chen, New Taipei (TW)

(73) Assignee: SUPERC-TOUCH COPORATION, New Taipei (TW)

( * ) Notice: Subject to any disclaimer, the term of this patent is extended or adjusted under 35 U.S.C. 154(b) by 0 days.

(21) Appl. No.: 18/884,709

(22) Filed: Sep. 13, 2024

(65) Prior Publication Data

US 2025/0098309 A1   Mar. 20, 2025

(30) Foreign Application Priority Data

Sep. 14, 2023   (TW) ................... 112135030

(51) Int. Cl.

| | | |
|---|---|---|
| *G09G 3/34* | (2006.01) | |
| *G02F 1/1362* | (2006.01) | |
| *G02F 1/167* | (2019.01) | |
| *H10D 86/40* | (2025.01) | |
| *H10D 86/60* | (2025.01) | |

(52) U.S. Cl.
CPC ....... *H10D 86/60* (2025.01); *G02F 1/136222* (2021.01); *G02F 1/167* (2013.01); *H10D 86/411* (2025.01); *H10D 86/431* (2025.01); *H10D 86/441* (2025.01)

(58) Field of Classification Search
CPC .... G09G 3/344; G09G 3/2003; G06F 3/0412; G02F 1/136222; G02F 1/167; G02F 1/16755; G02F 1/1676; G02F 1/1685; H10D 30/6757; H10D 86/60; H10D 86/411; H10D 86/431; H10D 86/441
See application file for complete search history.

(56) References Cited

U.S. PATENT DOCUMENTS

| | | | |
|---|---|---|---|
| 11,789,330 B2 * | 10/2023 | Lin ..................... | G09G 3/344 |
| | | | 345/107 |
| 2014/0078035 A1 * | 3/2014 | Sato .................... | G09G 3/344 |
| | | | 345/107 |
| 2023/0326419 A1 * | 10/2023 | Deliwala ............. | G02F 1/1685 |
| | | | 345/212 |

(Continued)

FOREIGN PATENT DOCUMENTS

TW   1780747 B   * 10/2020

*Primary Examiner* — Joe H Cheng
(74) *Attorney, Agent, or Firm* — Chun-Ming Shih; HDLS IPR SERVICES

(57) ABSTRACT

An electrophoresis display with high aperture ratio includes a control substrate having a first face and a second face, a driving circuit layer, a control electrode layer, an electrophoresis layer, and an opposite substrate. The driving circuit layer includes a plurality of thin film transistors (TFT), a plurality of gate lines, and plurality of data lines. Each of the gate line is connected to the gates of the TFTs and each of the data lines is connected to the sources or the drains of the TFTs. The area of a semiconductor part of the TFT is at least partially overlapped with the area of one of the gate lines or the area of one of the date lines along a projection direction.

26 Claims, 36 Drawing Sheets

(56) References Cited

U.S. PATENT DOCUMENTS

| | | | |
|---|---|---|---|
| 2025/0093694 A1* | 3/2025 | Lee | G02F 1/1677 |
| 2025/0093727 A1* | 3/2025 | Lee | G02F 1/1676 |
| 2025/0093729 A1* | 3/2025 | Lee | G02F 1/167 |
| 2025/0093731 A1* | 3/2025 | Lee | G02F 1/1676 |
| 2025/0093732 A1* | 3/2025 | Lee | G02F 1/1677 |
| 2025/0093734 A1* | 3/2025 | Lee | G02F 1/1677 |
| 2025/0093735 A1* | 3/2025 | Lee | G02F 1/167 |
| 2025/0093736 A1* | 3/2025 | Lee | G02F 1/1677 |
| 2025/0098310 A1* | 3/2025 | Lee | G02F 1/136222 |
| 2025/0098311 A1* | 3/2025 | Lee | H10D 86/411 |
| 2025/0098312 A1* | 3/2025 | Lee | H10D 86/60 |
| 2025/0098313 A1* | 3/2025 | Lee | H10D 86/441 |
| 2025/0098314 A1* | 3/2025 | Lee | H10D 86/411 |

* cited by examiner

ELECTROPHORESIS DISPLAY WITH HIGH APERTURE RATIO

BACKGROUND OF THE DISCLOSURE

Technical Field

The present disclosure relates to a display, particularly relates to an electrophoresis display with high aperture ratio.

Description of Related Art

Electronic paper displays, such as an electrophoretic display (EPD), have the characteristics of compactness, easy to carry, and low energy consumption. Electronic paper displays also have the characteristics of retaining images even after the power is turned off. In addition to being used in readers, mobile phones, and wearable devices, electronic paper displays may also be used in shelf labels in hypermarkets and instant message boards at bus stops, to take into account energy conservation and sustainability goals.

FIG. 1A shows a cross-section diagram of a black-and-white electrophoretic display 100 in accordance with the related-art. This electrophoretic display 100 is a black-and-white electrophoretic display 100. The electrophoretic display 100 includes, for example, from top to bottom, an opposite substrate 12 (e.g. a transparent plastic substrate), a common electrode layer 14 (e.g. a transparent conductive electrode layer), an electrophoresis layer 20, a control electrode layer PEL, a driving circuit layer 30a and a control substrate 10 (e.g. a glass substrate). In the structure shown in FIG. 1A, the viewing surface is close to the direction of the opposite substrate 12. In addition, as shown in FIG. 1A, the electrophoresis layer 20 includes a plurality of hollow cavities 22 (only one is shown in this figure), the colloidal solution 24 filled in each hollow cavity 22 includes a plurality of suspended charged color particles 26 (such as the charged black particles 26B and the charged white particles 26W). The structure of the hollow cavity 22 is used as a container of electronic ink (or electrophoretic materials). The hollow cavity 22 is made of, for example, organic polymer materials, and is used to fill the charged color particles 26. In addition, the charged color particles 26 may be a two-color combination (black/white), a three-color combination (black/red/white, black/yellow/white), or a four-color combination (black/red/yellow/white, cyan/yellow/magenta/white) and other combinations. In the structure shown in FIG. 1A, the charged color particle 26 is, for example, a two-color combination and includes the charged black particle 26B and the charged white particle 26W.

The common electrode layer 14 is generally connected to the ground voltage (0V) to provide the common voltage Vcom, and the control substrate 10 below is generally processed by the thin film transistor (TFT) array process of the panel to make the driving circuit layer 30a. The drive switches of the driving circuit layer 30a generally include the thin film transistor made by the amorphous silicon (a-Si) process (details are described below). Amorphous silicon is a low-cost material in abundant supply; however, amorphous silicon has a very low electron mobility (about 1 $cm^2/V*s$) and does not physically support high refresh speeds. However, amorphous silicon has the characteristics of high voltage resistance and ultra-low leakage current, which are desirable conditions for electronic paper control. The charged color particle 26 carries charges with predetermined polarity, for example, the charged black particle 26B carries positive charges and the charged white particle 26W carries negative charges. By controlling the electrical properties and voltage magnitude of each control electrode PE by the driving circuit layer 30a, the charged black particles 26B may be attracted and the charged white particles 26W may be repelled in each pixel (this makes the pixel appear white on the viewing surface on the opposite side of the control electrode PE); or the charged white particles 26W may be attracted and the charged black particles 26B may be repelled in each pixel (this makes the pixel appear black on the viewing surface on the opposite side of the control electrode PE).

FIG. 1B shows a cross-section diagram of a color electrophoretic display 100 in accordance with another related-art. This electrophoretic display 100 is a color electrophoretic display 100. The structure of the color electrophoretic display 100 is roughly similar to the black-and-white electrophoretic display 100 structure shown in FIG. 1A, but a color filter layer CF is bonded with an optical adhesive 13 on the opposite substrate 12, and the color filter layer CF is disposed on an upper glass substrate 16.

The electrophoretic display with an array of the color filter layers produces visual color by region sharing and color mixing. The available display region is shared between three or four primary colors such as red/green/blue (RGB) or red/green/blue/white (RGBW). The filter layer may be arranged in a one-dimensional (stripe) or two-dimensional (2×2) repeating pattern. Three sub-pixels (in the case of an RGB display) or four sub-pixels (in the case of an RGBW display) that are small enough in area may be interpreted as higher resolution, visually blending into a single pixel with a uniform color. The inherent disadvantage of region sharing is that colorants always exist, and colors may only be modulated by switching the corresponding pixels of the monochrome display underneath to white or black (turning the corresponding primary color on or off). For example, in an ideal RGBW display, each of the red, green, blue, and white primary colors occupies a quarter of the display region (one of the four sub-pixels). The white sub-pixel is as bright as the monochrome display white underneath, so the three color sub-pixels combined contribute not more than one white sub-pixel.

The multi-color display may use a variety of charged color particles with different colors. Different colors may be displayed by controlling the distance of these charged color particles with different colors and the viewing surface through different physical and electrical conditions such as the charge polarity (positive or negative), charge quantity, particle density, particle volume, etc. of charged color particles move in different ways in the colloidal solution. For example, the multi-color display may use three-color displays (black, white, red; black, white, yellow) and four-color displays (black, white, red, yellow). Similar to the operation of black-and-white electrophoretic displays, electrophoretic displays with three or four reflective colors operate like simple black-and-white displays. However, because the color particles required are driven to the viewing surface, the driving solution is much more complex than that of just a black-and-white display.

Refer to FIGS. 2A and 2B. FIG. 2A illustrates an operation diagram of the black-and-white electrophoretic display 100 of the related-art of FIG. 1A. FIG. 2B illustrates an equivalent circuit diagram of the control electrode layer PEL/a driving circuit layer 30a of the related-art of FIG. 1A. As shown in FIG. 2A, black-and-white pixels may be formed on the viewing surface (near the opposite substrate 12) by controlling the electrical properties and voltage magnitude of each control electrode PE in this control electrode layer PEL, through the driving circuit layer 30a. If the driving circuit layer 30a controls the control electrode PE1 and PE3 shown in FIG. 2A to have a positive voltage, the control electrodes PE1 and PE3 attract the negatively charged white particles 26W and push the black particles with positive charge away from the electrode contact surface, and move them to the viewing surface. As a result, there is a relatively large number of the positively charged black particles 26B close to the viewing surface to provide black pixels on the viewing surface. On the contrary, if the driving circuit layer 30a controls the control electrode PE2 shown in FIG. 2A to have a negative voltage, the control electrode PE2 attracts the positively charged black particles 26B and pushes the white particles with negative charges away from the electrode contact surface and move to the viewing surface. As a result, there is a relatively large number of the negatively charged white particles 26W close to the viewing surface to provide white pixels on the viewing surface.

As shown in FIG. 2A, and with reference also to FIG. 2B, the common electrode layer 14 is usually electrically connected to the ground voltage (0V, that is, the common voltage Vcom) and is sandwiched between the control electrode layer PEL and the electrophoresis layer 20. The control electrode PE of the control electrode layer PEL and common voltage Vcom may form a capacitor (an electrophoretic capacitor Cp), since the electrophoresis layer is thick, the above-mentioned capacitance is very small. The charges on the control electrode quickly interact with the charged particles and become an equilibrium state. The distance that charged particles move is very small. In order to increase the energy of each drive, the storage capacitor needed to be added in the driving circuit layer 30a, one end of the storage capacitor is connected to the control electrode, and the other end to the conductor, on the other side of the control electrode facing the electrophoresis layer, forms the parallel plane capacitance Cs. In FIG. 2B, the equivalent circuit of the electrophoresis layer 20 is marked as the electrophoretic capacitor Cp in parallel to the resistance R (equivalent to the energy consumed by the movement of the charged color particle) and further includes the above storage capacitor Cs. As shown in FIG. 2B, the driving circuit layer 30a includes a plurality of thin film transistors 32, and the gate metal Mg of each thin film transistor 32 is electrically connected to a gate line GL, a source metal Ms is electrically connected to a data line DL and a drain metal Md is electrically connected to the corresponding a control electrode (also called pixel electrode) PE. The thin film transistor 32 may be determined to be on or off, based on the voltage applied to the gate metal Mg by the gate line GL, thereby determining whether the source metal Ms transmits the voltage on the data line DL to the drain metal Md, and further transmits to the corresponding the control electrode PE and charging the storage capacitor Cs to the same voltage as the data line. The control electrode PE also applies the voltage corresponding to the data line to the electrophoresis layer 20. In general, the driving circuit layer includes a plurality of thin film transistors, a plurality of gate lines, and a plurality of data lines. Each of the gate lines is electrically connected to the gates of the thin film transistors. Each of the data lines is electrically connected to the drains or sources of the thin film transistors and the control electrodes. Each control electrode is connected to the source or the drain of the thin film transistor.

The electrophoresis layer includes electrophoresis material. The electrophoretic material includes a plurality of charged color particles. The charged color particles are configured in a colloidal solution and may move through the colloidal solution under the influence of an electric field. The charged color particles include positively charged color particles and/or negatively charged color particles. The charged color particle 26 moves very slowly under the force of the electric field in the colloidal solution 24 of the electrophoresis layer 20 with appropriate viscosity. The driving circuit layer 30a first quickly stores energy in the storage capacitor Cs, and then the storage capacitor Cs slowly releases the energy to the electrophoresis layer 20 through the control electrode PE to be used as a source of energy for the charged color particle 26 to move. The larger the capacitance value of the storage capacitor Cs, the more energy may be stored, the fewer times the energy needs to be recharged, and the faster the image of the electrophoretic display 100 may be updated. Therefore, the electrophoretic display 100 may increase the area of the storage capacitor Cs as much as possible in the circuit layout design to increase the capacitance value. However, in a system of charged color particles with a plurality of colors, since the distance and direction of movement of the charged color particle need to be accurately controlled, the capacitance value of the storage capacitor Cs may be appropriately reduced to reduce energy to increase the accuracy of controlling the moving distance of the charged color particle. However, the need to add more energy storage times may be at the expense of reducing the refresh speed of the electrophoretic display 100.

Refer to FIG. 2C, which illustrates a cross-sectional diagram of the formation method of the storage capacitor Cs in the related-art. As shown in these figures, generally the gate metal Mg of the thin film transistor 32 and the first electrode CE1 of the storage capacitor Cs are made together with the gate line GL when making the first metal layer M1. In addition, the source metal Ms/the drain metal Md of the thin film transistor 32 and the second electrode CE2 of the storage capacitor Cs are made together with the data line DL when making the second metal layer M2. In the related-art, when making the first metal layer M1, the first electrode CE1 for the storage capacitor Cs is simultaneously made, when using the steps for making the insulation layer of the gate, the insulation layer CI for the storage capacitor Cs is simultaneously made, when making the second metal layer M2, the second electrode CE2 for the storage capacitor Cs is simultaneously made. Therefore, the capacitor structure of metal (the first electrode CE1)-insulation layer (the insulation layer CI)-metal (the second electrode CE2) shown in FIG. 2C may be formed. However, the gate metal Mg and the source metal Ms/the drain metal Md need to be made of metal to reduce the impedance, so the first metal layer M1 and the second metal layer M2 also need to be made of metal. This results in material selection restrictions in the first electrode CE1/the second electrode CE2 of the storage capacitor Cs of the related-art of electrophoretic display 100, thereby causing the storage capacitor Cs to block light and reducing the aperture ratio (opening ratio) of the control substrate of the related-art of electrophoretic display. The aperture ratio is the overall aperture ratio of the components of the control substrate (including the control substrate 10, the driving circuit layer 30a, and the control electrode layer PEL).

In addition, the related-art has further disadvantages as follows. As the particles are pushed farther away, the pushing force of the charge on the control electrode becomes weaker because the charged particles move toward the viewing surface in a pushed-away manner and the more charged particles with different polarity than the control electrode are attracted to the surface of the control electrode. The electric field of the electrophoresis layer becomes smaller, causing the pushing force on the particles that are far away becoming weaker. Under the influence of these two factors, the speed of charged particles moving toward the viewing surface may become slower and slower. As a result, higher energy and more time are required to move the charged particles to the expected viewing surface position. This is the main reason why the refresh speed of the related-art of displays is so slow.

Furthermore, the charged particles moving toward the viewing surface may be affected by the difference in voltage magnitude and polarity between the different control electrodes, resulting in lateral movement. We may call it the diffusion phenomenon of particle movement, which may cause problems such as reduced contrast in the border area, blurred images, and edge image sticking when displayed in black-and-white. This problem is particularly serious when displaying in color, causing serious image sticking problems, color desaturation, and color distortion. This is the problem of the related-art of the electrophoretic display used in color displays, it may not display real colors like LCD, and there may be image sticking when turning pages (different from black-and-white edge image sticking). Multiple uneven diffusions cause the charged particles to move laterally farther and farther. As a result, the density of charged particles with different colors originally uniformly distributed becomes uneven, resulting in image display degradation. When the image display deteriorates to a certain extent, the life of the display is over.

When the charged particles move toward the viewing surface, they may attract the charges on the common electrode and attract one another, causing charge movement on the common electrode. The charge movements throughout the common electrode may interfere with one another, and these interfering charge movements may push away the particles with the same charge originally on the viewing surface. As a result, the display is wrong. When the charge density at the position corresponding to each control electrode on the common electrode continues to change, it may also cause the problem of unwanted lateral movement of charged particles (particle diffusion problem). This makes the image sticking problem of color displays even more severe and affects the service life. In addition, the driving circuit may switch the voltage of the gate line with the most extreme voltage difference change, and the resulting pulse conflict may also cause sudden charge movement in the common electrode layer connected to the ground GND. As a result, the display is affected.

The common electrode layer is the largest conductor on the display and is easily affected by other static electricity. As a result, the image changes the state. All the above shortcomings have slowed the development of color electrophoretic displays, so it needs to make radical changes from the traditional viewing surface, which is the source of errors.

SUMMARY OF THE DISCLOSURE

An electrophoresis display with a high aperture ratio, including: a control substrate, including a first face and a second face; a driving circuit layer, arranged on the second face of the control substrate and including a plurality of thin film transistors, a plurality of gate lines, and a plurality of data lines, at least one of the gate lines electrically connected to gates of the thin film transistors, at least one of the data lines electrically connected to drains or sources of the thin film transistors; a control electrode layer, arranged on a side of the driving circuit layer away from the control substrate and including a plurality of transparent control electrodes, at least one of the transparent control electrodes electrically connected to the source or the drain of one of the thin film transistors; an electrophoresis layer, including an electrophoretic material, the electrophoretic material including a plurality of charged color particles, the charged color particles arranged in a colloidal solution and moving through the colloidal solution under the influence of an electric field, the charged color particles including positively charged color particles and/or negatively charged color particles; and an opposite substrate, arranged on a side of the electrophoresis layer away from the control substrate; wherein, the first face is a viewing face of the electrophoretic display; wherein, a semiconductor part of the thin film transistor at least partially overlaps with one of the gate lines or one of the data lines in a projection direction.

The present disclosure fundamentally solves at least one of the shortcomings when the viewing surface is on the same side as the common electrode. First of all, the charges on the control electrode are used in the present disclosure. The attractive force of the charges moves the charged particles with different charge polarities to the surface of the control electrode. The closer to the control electrode the greater the surface attractive force. Once in position, the charged particles with different charge polarities are locked by the charges on the control electrode and may not run around. The phenomenon of color particles moving laterally causing the image sticking problem may not occur. The color particles with the same polarity close to the surface of the control electrode may be quickly pushed away and may not remain on the surface of the control electrode. This may further solve the image sticking problem of the related-art. The stronger attractive force may allow more color particles to be stacked in more layers to increase light reflection capabilities, compared to the related-art, the color particles are pushed to farther common electrodes by repulsive force. The closer to the common electrode, the smaller the repulsive force. As a result, particles stacked in more layers may not be formed at the common electrode area, so that, the reflection coefficient is generally insufficient. This difference in force allows the present disclosure to improve color accuracy, contrast, brightness, and saturation more than the related-art. In addition, the greater attractive force reduces the energy required for driving, and lower driving voltages may be used to reduce the difficulty of driving circuit design. When particles are closer to the control electrode, the attractive force becomes greater, causing the speed to increase, which also greatly increases the speed of the screen refresh speed. The functionality of the common electrode is reduced. The common electrode does not need to use transparent conductive materials, and the cost may be further reduced. The most important thing is that the original charge moves on the common electrode plane, causing irregular fluctuations (voltage kickback problem), and various surge noises of the charged color particle close to the common electrode end do not affect the display quality, because these do not happen on the viewing surface. Therefore, the viewing surface is moved to the first face closer to the control electrode, which may have various advantages.

However, the aperture ratio of the viewing face is an important key to the success of this technology. The higher the aperture ratio of the control substrate, the better the image display quality. The purpose of the present disclosure is to optimize the design of the opaque data lines, the gate lines, and the thin film transistors on the control substrate.

The data lines and the gate lines adopt a smaller line width to match the thin film transistors of the present disclosure and overlap on the gate lines. As a result, the aperture ratio of the control substrate may be efficiently increased, and the electrophoretic display may achieve better display quality.

BRIEF DESCRIPTION OF THE DRAWINGS

FIG. 2B illustrates an equivalent circuit diagram of the control electrode layer PEL/a driving circuit layer 30a.

DETAILED DESCRIPTION

Figure 1A:
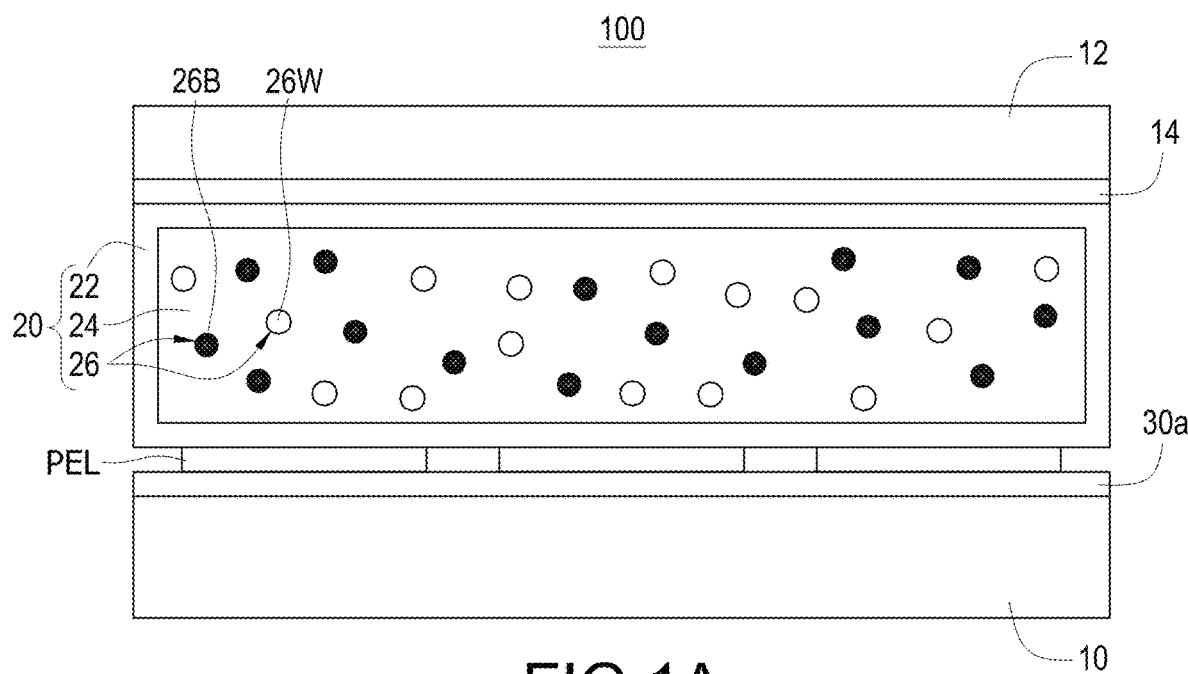
FIG. 1A shows a cross-section diagram of a black-and-white electrophoretic display 100 in accordance with the related-art.

For a detailed description and technical content of the present disclosure, please refer to the following detailed description and the accompanying drawings. However, it should be noted that the following figures are only schematic illustrations of various embodiments of the disclosure. Some elements are illustrated in a manner that is easier for people to understand and are not drawn based on actual element sizes.

As used herein, the terms "above" and "on" may refer to the relative position of one element relative to other elements or the sequence of manufacturing processes. For example, element A is on element B, or element A is above element B. This does not represent that element A and element B are in direct contact. There may be other elements between element A and element B. In addition, for example, element A is on element B, or element A is above element B represents the order of production. The manufacturing process of element B precedes the manufacturing process of element A. There may be other element manufacturing processes between element A and element B. Furthermore, the so-called positions up and down are only for the convenience of description in conjunction with the illustrations and do not represent the clear position of the present disclosure when used.

As used herein, the term "between" may refer to the relative position of one element relative to other elements or the manufacturing process sequence. For example, if element A is between element B and element C, it does not represent that element A is in direct contact with element B and element C. There may be other elements between element A, element B, and element C. In addition, for example, element A is between element B and element C, which represents the order of production. The manufacturing process of element B precedes the manufacturing process of element A, or the manufacturing process of element C precedes element A, and element A and element B. There may be manufacturing processes for other elements in between, and there may be manufacturing processes for other elements between element A and element C. Furthermore, the so-called position between is only for the convenience of description in conjunction with the illustrations and does not represent the clear positions when the present disclosures are used.

1. The Electrophoretic Display with a High Aperture Ratio

To achieve the arrangement of the viewing surface on the surface of the control substrate, the key is to increase the aperture ratio of the control substrate. The aperture ratio refers to the ratio, between the range of the display region, the area that light may pass through excluding all opaque areas (e.g. the metal electrodes of the thin film transistor), and the overall area of the display region. Since the display region usually includes display pixels, so equivalently, the aperture ratio may be represented by the ratio of the area through which light may pass in a single display pixel to the area of the single display pixel. The related-art uses a metal layer in the driving circuit layer 30a for the storage capacitor, so the aperture ratio within the pixel is less than 20%. The related-art may not move the viewing surface to the side with the control substrate. The present disclosure increases the aperture ratio to not less than 70%, preferably the aperture ratio not less than 80%, and most preferably the aperture ratio not less than 90%. The key to improving the aperture ratio is to first replace the opaque electrode part of the storage capacitor with transparent conductive material, second, reduce the area of the thin film transistor TFT, and finally, also limit the line width of the gate line and the data line to achieve the high aperture ratio requirements.

Figure 3A:
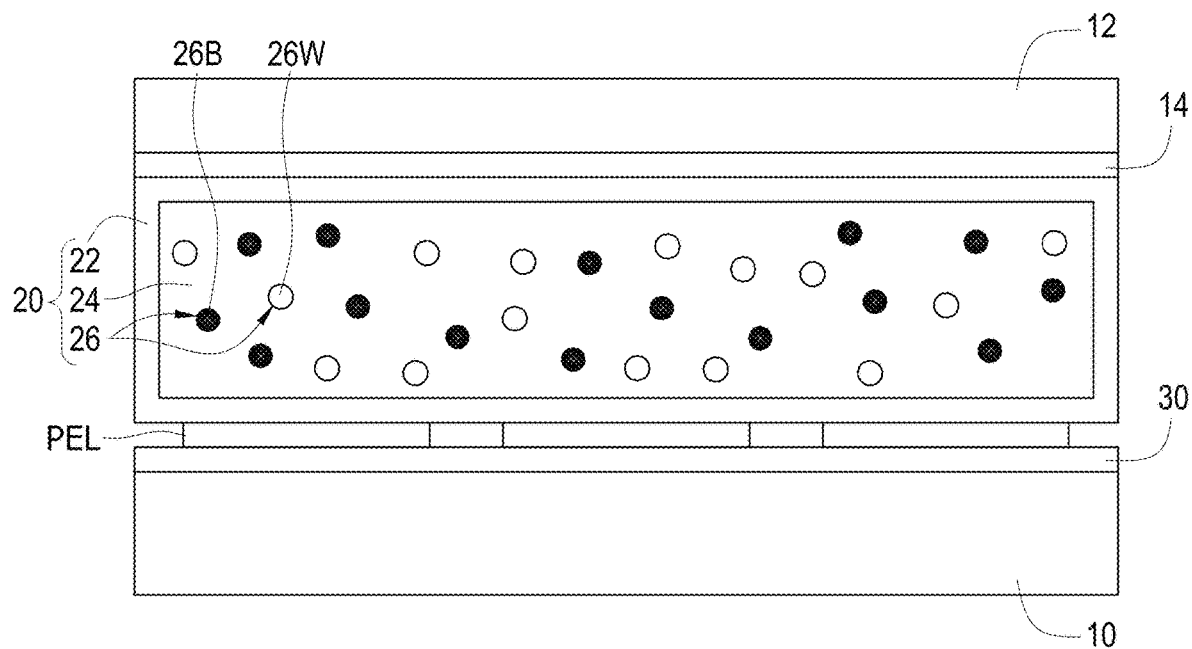
FIG. 3A illustrates a cross-section diagram of the electrophoretic display 100 in accordance with an embodiment of the present disclosure.

Refer to FIG. 3A, which illustrates a cross-section diagram of the electrophoretic display 100 in accordance with an embodiment of the present disclosure. This the electrophoretic display 100 is, for example, black-and-white electrophoretic display 100, and includes, from top to bottom, an opposite substrate 12 (e.g. a plastic substrate, a glass substrate, or a metal substrate) a common electrode layer 14 (e.g. a transparent conductive electrode layer or an opaque conductive metal layer or other conductive materials), an electrophoresis layer 20, a control electrode layer PEL which includes a plurality of transparent the control electrodes PE, a driving circuit layer 30 with a high aperture ratio (which is abbreviated as the driving circuit layer 30 below), and a control substrate 10 (e.g. a glass substrate or a transparent polyimide (PI) substrate, or other substrate materials with a light transmittance of, for example, more than 90%). The common electrode layer may not be used under special conditions with supporting measures. As shown in FIG. 3A, the electrophoresis layer 20 includes a plurality of hollow cavities 22 (only one is shown in this figure). The colloidal solution 24 filled in each hollow cavity 22 includes a plurality of charged color particles (such as the charged black particles 26B and the charged white particles 26W). The hollow cavity 22 is used as a container for electronic ink. According to one embodiment of the present disclosure, the first electrode CE1/the second electrode CE2 of the storage capacitor Cs in the driving circuit layer 30 with a high aperture ratio is made of transparent conductive materials or partially made of transparent materials to enhance the aperture ratio of the electrophoretic display 100. In addition, to more facilitates the user to view the electrophoretic display 100 from the control substrate 10 side. This makes the control electrode layer PEL close to the viewing side to attract the charged black particle 26B or the charged white particle 26W, to achieve the purpose of solving the shortcomings of the above-mentioned related-art. According to other embodiments of the present disclosure (not shown in these figures), the cavity 22 may also be filled with a colloidal solution 24, the colloidal solution including a colored fluid (e.g. black) and a plurality of single color charged particles (such as white particles). When the control electrode layer PEL attracts the charged color particle, the color (e.g. white) of the particle is displayed on the viewing surface. When the control electrode layer PEL repels the charged color particle, the color (e.g. black) of the particle is displayed on the viewing surface. The electrophoresis layer may be defined as including electrophoresis material. The electrophoretic material includes a plurality of charged color particles. The charged color particles are configured in a colloidal solution and may move through the colloidal solution under the influence of an electric field. The charged color particles include positively charged color particles and/or negatively charged color particles.

Figure 3B:
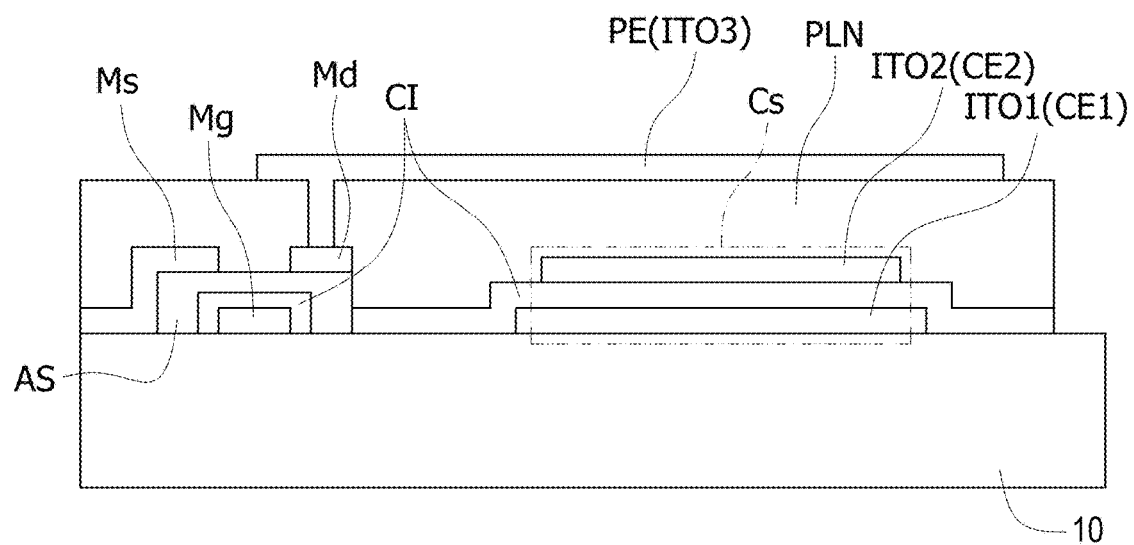
FIG. 3B is a cross-section diagram of part of the elements of the electrophoretic display 100 in accordance with an embodiment of the present disclosure.
Figure 3C:
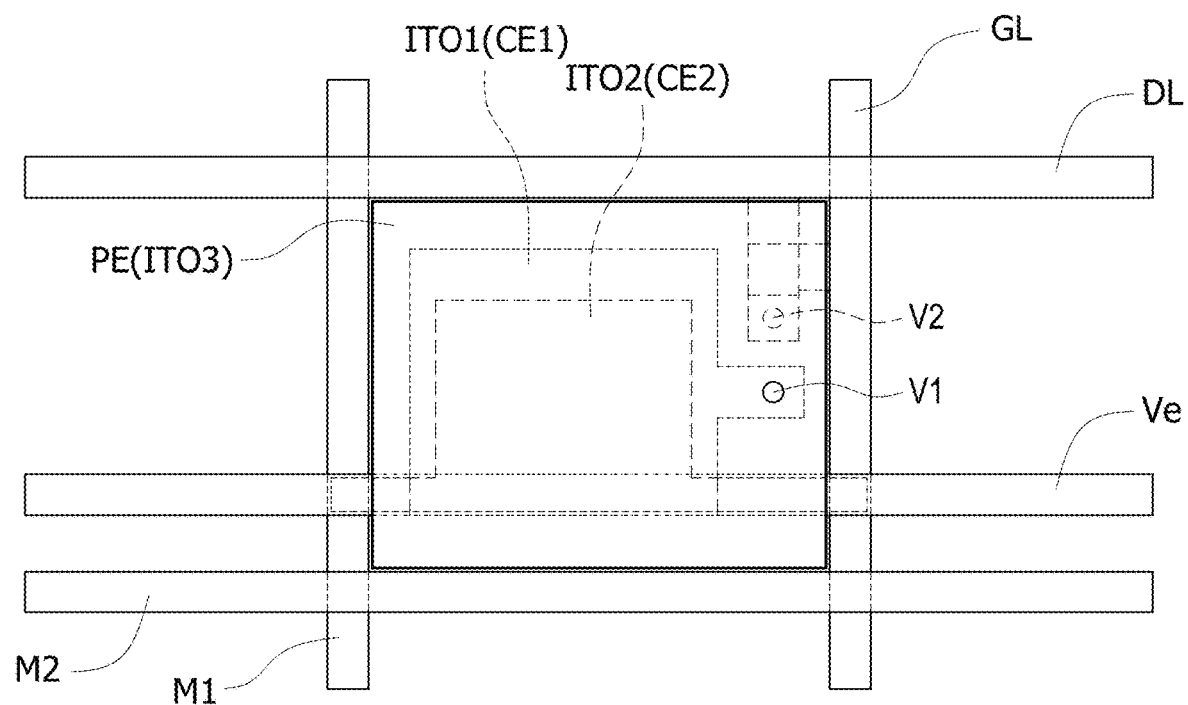
FIG. 3C is a top-view diagram corresponding to FIG. 3B.

Refer to FIG. 3B, which is a cross-section diagram of part of the elements of the electrophoretic display 100 in accordance with an embodiment of the present disclosure and mainly shows the control electrode layer PEL, the driving circuit layer 30, and the control substrate 10 in accordance with the present disclosure. Refer to FIG. 3C, which is a top-view diagram corresponding to FIG. 3B. According to the embodiment of the present disclosure, the viewing surface is viewed from the direction of the control substrate close to the control electrode layer PEL. Therefore, the color displayed is the color of the charged color particle in the colloidal solution 24 that is attracted by the voltage of each the control electrode PE of the control electrode layers PEL. Refer to FIG. 1A and FIG. 3A, by controlling the electrical properties and voltage magnitude of each control electrode PE by the driving circuit layer 30a, the charged black particles 26B may be attracted and the charged white particles 26W may be repelled in each pixel (this makes the pixel appear white on the viewing surface on the opposite side of the control electrode PE); or the charged white particles 26W may be attracted and the charged black particles 26B may be repelled in each pixel (this makes the pixel appear black on the viewing surface on the opposite side of the control electrode PE). The viewing surface is on the opposite substrate 12 farther away from the control electrode layer PEL. Since the further away from the control electrode layer PEL, the weaker the electric field, and the weaker the force that repels the charged color particle 26, the screen of the related-art of the electrophoretic display 100 has various shortcomings. On the contrary, the driving circuit layer 30 of the electrophoretic display 100 of the present disclosure is close to the viewing surface (located on the control substrate 10 side). By controlling the electrical properties and voltage magnitude of each control electrode PE by the driving circuit layer 30, the charged black particles 26B may be attracted and the charged white particles 26W may be repelled in each pixel (this makes the pixel appear black on the viewing surface close to the control electrode PE); or the charged white particles 26W may be attracted and the charged black particles 26B may be repelled in each pixel (this makes the pixel appear white on the viewing surface close to the control electrode PE). In other words, the control electrodes PE on the control electrode layer PEL attract the charged color particles with different polarities (such as the charged black particle 26B or the charged white particle 26W) from the control electrodes PE and accumulate to the side of the electrophoresis layer 20 close to the control electrode layer PEL (including most of the control electrodes PE). The viewing surface is closer to the control substrate 10 side of the control electrode layer PEL. Since the closer to the control electrode layer PEL, the stronger the electric field, and the stronger the force to attract the charged color particle 26, the charged particles 26 close to the electrode layer may be firmly locked. As a result, the excellent screen refresh speed, brightness, contrast, saturation, and other advantages may be achieved in the electrophoretic display 100 of the present disclosure. Moreover, since the charge on the control electrode does not move and is in a locked state when the transistor 32 is non-conductive, the charged color particle 26 may be stably attracted to free from the problems of the related-art which causes the charged color particle 26 to move as the charge on the common electrode moves (the voltage kickback problem is caused by the charge flowing from the storage capacitor to the common layer electrode after the storage capacitor is discharged. For example, when black text is displayed on a white background, the common electrode exhibits most of the negatively charged white particles. That indicates a large proportion of positive charges are condensed on the surface of the common electrode, which is unfavorable for the positively charged black particles to approach, and the black particles may be forced back to the control electrode side. This is commonly known as voltage kickback, causing the original black font to become thinner or disappear. The greater the difference between the black and white ratio on the screen, the more serious the problem may be, or the voltage kickback causes color distortion during color display.) Moreover, the moved particles may not return to their original position, distorting the image on the viewing surface. The solution presented in the present disclosure is free from the problems of the charged color particle 26 lateral shift diffusion and forced retreat (color mixing problem, desaturation problem), or the charged color particle 26 may not move to the new correct position when the image is updated (the image sticking problem).

In addition, the present disclosure also provides an improved design for the driving circuit layer 30 to improve the aperture ratio when viewed from the control substrate 10. As shown in FIG. 3B, according to an embodiment of the present disclosure, the first electrode CE1 of the storage capacitor Cs is made of a transparent conductive material, such as indium tin oxide (ITO) or a similar transparent conductive material. In addition, the second electrode CE2 of the storage capacitor Cs is also made of transparent conductive materials, such as indium tin oxide (ITO) or a similar transparent conductive material. The insulation layer CI of the storage capacitor Cs may be simultaneously made when using the steps for making the gate insulation layer at the same time (details are described below).

Refer to FIG. 3B and FIG. 3C, the control electrode PE of the top layer (also called the pixel electrode) is also made of transparent conductive materials, such as indium tin oxide (ITO) or similar transparent conductive materials. The control electrode PE of the top layer is electrically connected to the first transparent conductive layer ITO1 (the first electrode CE1) of the storage capacitor Cs through the via V1; furthermore, the control electrode PE is also electrically connected to the drain metal Md through the via V2. When making the storage capacitor Cs according to the present disclosure, the corresponding metal layer part (corresponding to the electrode part of the storage capacitor Cs) of the related-art of the first metal layer M1 is replaced by the first transparent conductive layer ITO1 made of transparent conductive material (such as ITO). According to an embodiment of the present disclosure, it is fine to make the first metal layer M1 first and then the first transparent conductive layer ITO1 or to make the first transparent conductive layer ITO1 first and then the first metal layer M1. Basically, the insulation layer may be omitted between the first metal layer M1, and the first transparent conductive layer ITO1. Of course, the function is the same if the insulation layer is between the first metal layer M1, and the first transparent conductive layer ITO1.

Besides, the corresponding metal layer part of the related-art of the second metal layer M2 is replaced by the second transparent conductive layer ITO2 made of transparent conductive material (such as ITO). The second transparent conductive layer ITO2 is between the control electrode PE and the first transparent conductive layer ITO1 when viewed from the projection direction and electrically connected to the common voltage Vcom or a DC voltage source such as 0V voltage. Furthermore, according to an embodiment of the present disclosure, it is fine to make the second metal layer M2 first and then the second transparent conductive layer ITO2 or to make the second transparent conductive layer ITO2 first and then the second metal layer M2. Basically, the insulation layer may be omitted between the second metal layer M2, and the second transparent conductive layer ITO2. Of course, the function is the same if the insulation layer is between the second metal layer M2, and the second transparent conductive layer ITO2.

As disclosed above, in the electrophoretic display 100 disclosed in FIG. 3A to FIG. 3C, the two electrodes of the storage capacitor Cs are made of the first transparent conductive layer ITO1 and the second transparent conductive layer ITO2 respectively. Moreover, the spacing of the first transparent conductive layer ITO1 and the second transparent conductive layer ITO2 is extremely small (the thickness of the insulation layer CI is between about 0.1 micrometers ($\mu$m) and about 0.5 $\mu$m). As a result, the capacitance value of the storage capacitor Cs may be increased. Furthermore, the first transparent conductive layer ITO1, the second transparent conductive layer ITO2, and the control electrode do not block light and can improve the aperture ratio of the control substrate of the electrophoretic display 100 when viewed from the control substrate 10.

Refer to FIG. 3A to FIG. 3C, according to the present disclosure, when making the electrophoretic display 100, for the parts on the control substrate 10, a metal film may be made first on the upper surface of the control substrate 10 is processed by a deposition process or a sputtering process and a photolithography process to make the first metal layer M1. The first metal layer M1 is used to form the gate metal Mg and the gate line GL. Then, the transparent conductive material film is made by the sputtering process, and the first transparent conductive layer ITO1 is made by the photolithography process. The above two steps may also be reversed, that is, the first transparent conductive layer ITO1 is formed first, and then the first metal layer M1 is formed. Then, the insulation layer CI (such as SiNx, $SiO_2$) of the storage capacitor Cs and a-Si layer AS are deposited, and the semiconductor part of the thin film transistor is carved out by the photolithography process. Then, a metal film is made on the obtained structure by a deposition process or a sputtering process and the second metal layer M2 is made by a photolithography process. The second metal layer M2 is used to form the source metal Ms, the drain metal Md, and the data line DL. Then, the transparent conductive material film is made by the sputtering process, and the second transparent conductive layer ITO2 is made by the photolithography process. The above two steps may also be reversed, that is, the second transparent conductive layer ITO2 is formed first, and then the second metal layer M2 is formed. Then, the flat layer PLN is made on the obtained structure by a coating process and a photolithography process. Then, the transparent conductive material film is made by the sputtering process, and the control electrode layer PE (i.e. the third transparent conductive layer ITO3) of the control electrode PEL is made by the photolithography process. Then, the electrophoresis layer 20 may be bonded or made on the control electrode layer PEL. The electrophoresis layer 20 includes the hollow cavity 22. The hollow cavity 22 is made by forming a resin film on a polymolecular substrate, using a roller to make indentations on the resin film to form the hollow cavity 22, and then hardening the resin film. The hollow cavity 22 is used as a container for electronic ink. Then the colloidal solution 24 containing the charged color particle 26 is injected into the hollow cavity 22. Then, the top of the colloidal solution is sealed with glue and hardened into a sealed cavity to form the electrophoresis layer 20. For the detailed manufacturing process, please refer to Taiwan Patent Application No. 93100767, or the micro-partition structure in the present disclosure. Details are described below. Then the parts on the opposite substrate 12 are made, the common electrode layer 14 may be formed on the opposite substrate 12. Alternatively, the common electrode layer 14 may not be disposed on the opposite substrate 12. Finally, the side that has made the electrophoresis layer 20 of the control substrate 10 and the opposite substrate 12 are bonded with the optical adhesives or are bonded by the frame glue with the help of the structure of the micro tenon (details are described below) of the present disclosure. The above deposition process (chemical vapor deposition, CVD, Plasma-Enhanced CVD, PECVD), sputter deposition, coating, and insulation layer production are all mature manufacturing processes commonly used in display panels, which may make the electrophoretic display 100 of the present disclosure with various advantages such as high aperture ratio and high screen refresh speed.

In practice, electronic paper manufacturers may first form the common electrode layer 14 on the above-mentioned the opposite substrate 12 and then bond the film of the micro cup containing electronic ink to the opposite substrate 12 to achieve the electronic paper. The module manufacturer may also complete the electrophoretic display 100 by bonding the above-made the control substrate 10 to the electronic paper. However, because the micro cup is formed by pressing indentations into the resin, the electronic paper is very weak in structure, and the yield rate is very low during the manufacturing process, which invisibly increases the cost. This problem may be greatly improved by using the micro-partition structure in the present disclosure.

Figure 4A:
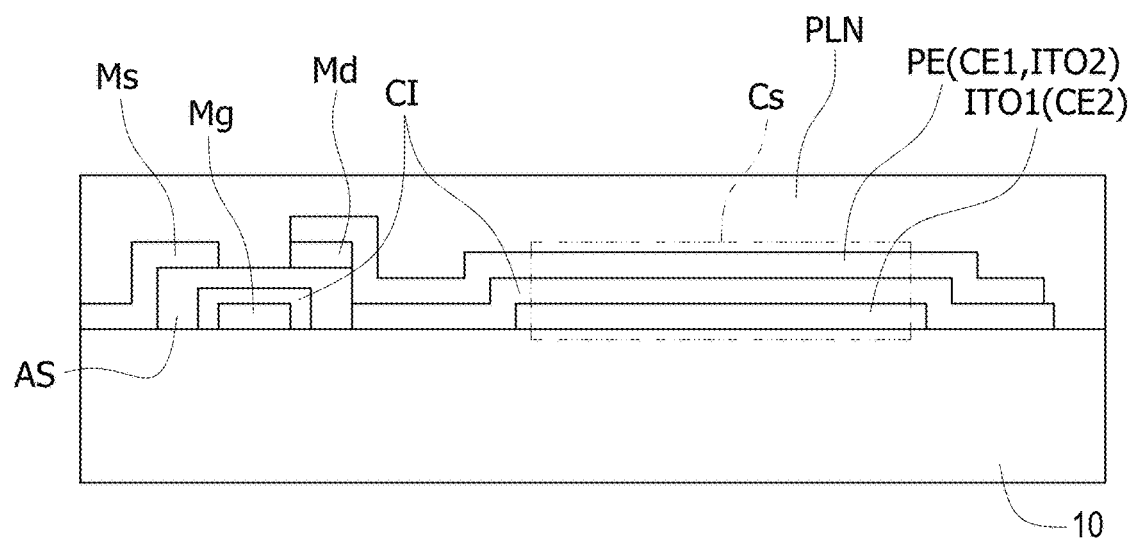
FIG. 4A is a cross-section diagram of part of the elements of the electrophoretic display 100 in accordance with another embodiment of the present disclosure.
Figure 4B:
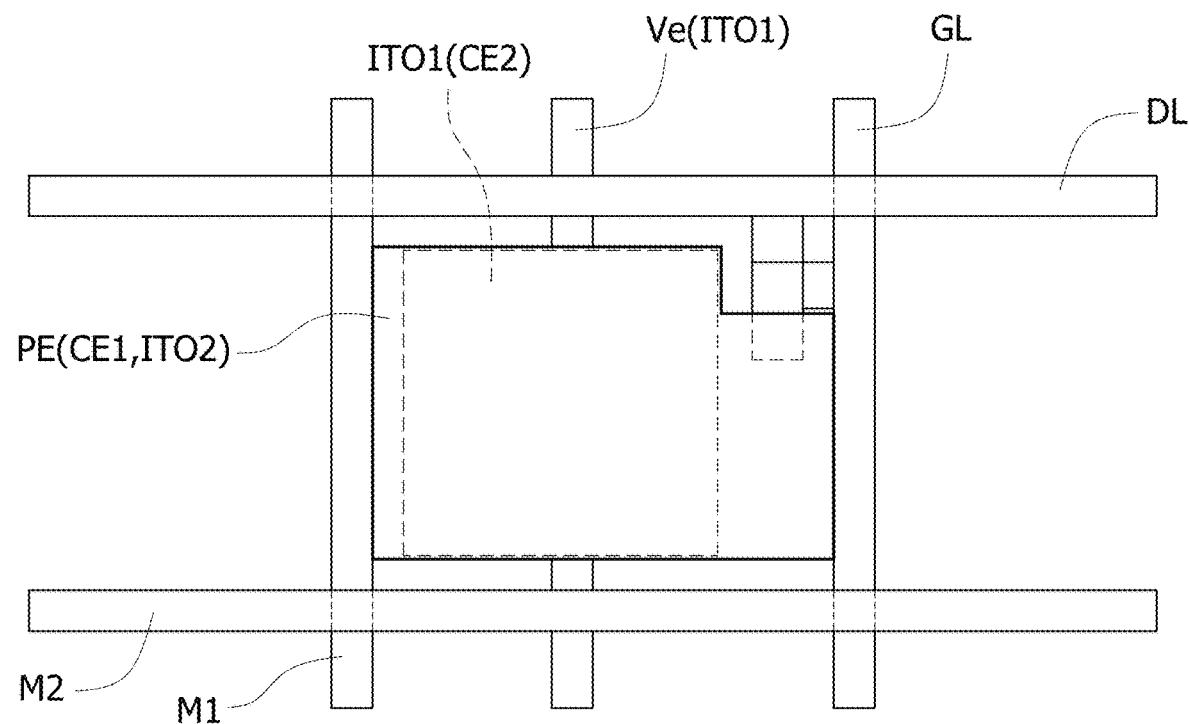
FIG. 4B is a top-view diagram corresponding to FIG. 4A.

Refer to FIG. 4A which is a cross-section diagram of part of the elements of the electrophoretic display 100 in accordance with another embodiment of the present disclosure. FIG. 4A mainly shows the control electrode layer PEL, the driving circuit layer 30, and the control substrate 10 according to the present disclosure. Refer to FIG. 4B which is a top-view diagram corresponding to FIG. 4A. In addition, the control electrode layer PEL, the driving circuit layer 30, and the control substrate 10 shown in FIG. 4A and FIG. 4B may also be used for the structure shown in FIG. 3A, with the viewing surface viewed from the direction of the control substrate 10 which is close to the control electrode layer PEL, so its image display principle is to use the voltage of the control electrode layer PEL to attract rather than repel the charged color particles in the colloidal solution 24 to achieve various advantages such as better display effects and higher screen refresh speeds. In addition, the present disclosure also provides an improved design for the driving circuit layer 30 to improve the aperture ratio and light transmittance when viewed from the control substrate 10. The embodiment disclosed in FIG. 4A is similar to the embodiment disclosed in FIG. 3A. However, the control electrode PE (also called pixel electrode) in FIG. 4A replaces the function of the electrode CE1 of the first transparent conductive layer ITO1 in FIG. 3B, and in FIG. 4A, the electrode CE2 is made by the first transparent conductive layer ITO1 which replaces the function of the electrode CE2 of the second transparent conductive layer ITO2 in FIG. 3B. In other words, in the embodiment shown in FIG. 4A and FIG. 4B, the first electrode CE1 (the control electrode PE) and the second electrode CE2 (electrically connected to the common voltage Vcom or a DC voltage such as 0V) of the storage capacitor Cs are respectively provided by the control electrode PE and the first transparent conductive layer ITO1 formed of transparent conductive materials, and the insulation layer of the storage capacitor Cs may be simultaneously made by the steps of making the gate the insulation layer. The control electrode PE is above the first transparent conductive layer ITO1 when viewed from the projection direction. In addition, the common voltage line Ve of the first transparent conductive layer ITO1 (the second electrode CE2 of the storage capacitor Cs) also extends in the same direction as the gate line GL of the first metal layer M1 (i.e., the common voltage line Ve is electrically connected to the first transparent conductive layer ITO1 and is substantially parallel to a gate line GL of the driving circuit layer 30).

Similarly, in the embodiment shown in FIG. 4A and FIG. 4B, because the first electrode CE1 and the second electrode CE2 of the storage capacitor Cs are respectively formed of transparent conductive materials, the aperture ratio of the electrophoretic display 100 may be increased. Furthermore, in this embodiment, the control electrode PE formed directly from a transparent conductive material is also used for the first electrode CE1 of the storage capacitor Cs. As a result, the structure may be simplified and the manufacturing process may be reduced. In addition, the embodiment shown in FIG. 4A and FIG. 4B may also be applied to the structure of FIG. 3A, that is, the viewing surface is on the side of the control substrate 10. When the control electrode layer PEL, the driving circuit layer 30, and the control substrate 10 disclosed in FIG. 4A and FIG. 4B are applied to the structure of FIG. 3A. They may make the driving circuit layer 30 closer to the viewing surface (located on the side of the control substrate 10). As a result, the electrophoretic display 100 of the present disclosure has excellent display effects, a high screen refresh speed, and many other advantages. And since the stack in FIG. 4A has one less transparent conductive layer than the stack in FIG. 3B, the stack in FIG. 4A has better light transmittance.

Refer to FIG. 4A and FIG. 4B, when making the electrophoretic display 100, for the parts on the control substrate 10, a metal film may be made first on the upper surface of the control substrate 10 is processed by a deposition process or a sputtering process, and a photolithography process to make the first metal layer M1. The first metal layer M1 is used to form the gate metal Mg and the gate line GL. Then, the transparent conductive material film is made by the sputtering process, and the first transparent conductive layer ITO1 and the common voltage line Ve is made by the photolithography process. The above two steps may also be reversed, that is, the first transparent conductive layer ITO1 is formed first, and then the first metal layer M1 is formed. Then, the insulation layer CI (such as SiNx, SiO$_2$) and a-Si layer AS are deposited, and the semiconductor part of the thin film transistor is carved out by the photolithography process. Then, a metal film is made on the obtained structure by a deposition process or a sputtering process and the second metal layer M2 is made by the production steps of a photolithography process. The second metal layer M2 is used to form the source metal Ms, the drain metal Md, and the data line DL. Then, the transparent conductive material film is made by the sputtering process, and the control electrode layer PEL(ITO2) is made by the photolithography process. The above two steps may also be reversed, that is, the control electrode layer PEL(ITO2) is formed first, and then the second metal layer M2 is formed, as long as there is a partial overlap between the control electrode layer PEL (ITO2) and the drain metal Md of the second metal layer M2 for electrical connection. Then, the flat layer PLN is made on the obtained structure by a coating process and a photolithography process. Then, the electrophoresis layer 20 may be bonded or made on the flat layer PLN. The electrophoresis layer 20 includes the hollow cavity 22. The hollow cavity 22 is made by forming a resin film on a plastic substrate, using a roller to make indentations on the resin film to form the hollow cavity 22. The hollow cavity 22 is used as a container for electronic ink. Then the colloidal solution 24 containing the charged color particle 26 is injected into the hollow cavity 22. Then, the top of the colloidal solution 24 is sealed with glue to a sealed cavity to form the electrophoresis layer 20. For the detailed manufacturing process, please refer to Taiwan Patent Application No. 93100767, or the micro-partition structure in the present disclosure. Details are described below. Then the parts on the opposite substrate 12 are made, the common electrode layer 14 may be formed on the opposite substrate 12. Alternatively, the common electrode layer 14 may not be disposed on the opposite substrate 12. Finally, the side that has made the electrophoresis layer 20 of the control substrate 10 and one side of the opposite substrate 12 are bonded with the optical adhesives or are bonded by the frame glue with the help of the structure of the micro tenon (details are described below) of the present disclosure. The above deposition process (chemical vapor deposition, CVD, Plasma-Enhanced CVD, PECVD, sputter deposition, and coating are all mature manufacturing processes commonly used in display panels, which may make the electrophoretic display 100 of the present disclosure with various advantages such as high aperture ratio and high screen refresh speed.

Figure 4C:
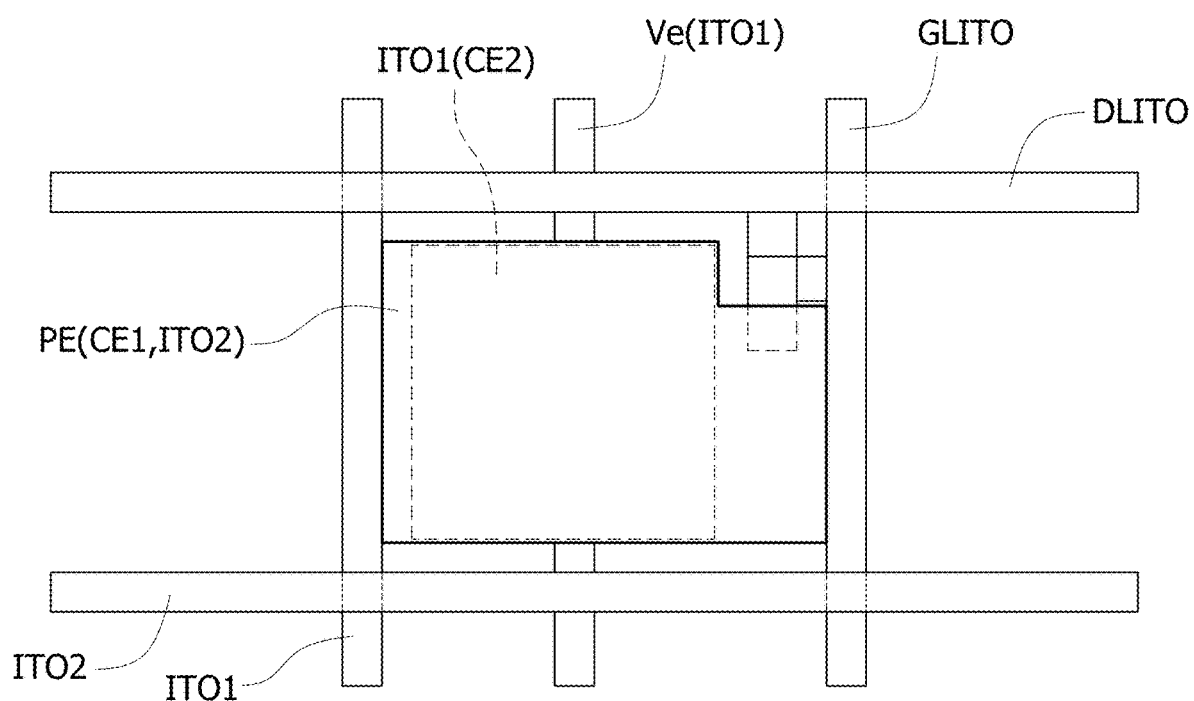
FIG. 4C is a top-view diagram of part of the elements of the electrophoretic display 100 in accordance with another embodiment of the present disclosure.

Refer to FIG. 4C which is a top-view diagram of part of the elements of the electrophoretic display 100 in accordance with another embodiment of the present disclosure, mainly shows the control electrode layer PEL and the driving circuit layer 30 in accordance with the present disclosure. This embodiment is similar to the embodiment shown in FIG. 4A and FIG. 4B, but at least part of the gate line GL originally made by the first metal layer M1 is instead made by the first transparent conductive layer ITO1 to form the transparent conductive gate line GLITO, and at least part of the data line DL of the second metal layer M2 is instead made by a second transparent conductive layer, that is, the control electrode layer PEL(ITO2) to form the transparent conductive data line DLITO. In other words, the manufacturing process of the first metal layer M1 mainly forms the gate metal Mg of the thin film transistor, while the manufacturing process of the second metal layer M2 mainly forms the source metal Ms/the drain metal Md of the thin film transistor. The first electrode CE1 of the storage capacitor Cs is provided by the control electrode PE, while the second electrode CE2 of the storage capacitor Cs is provided by the first transparent conductive layer ITO1. Similarly, the gate line of the first metal layer M1 is instead made by the first transparent conductive layer ITO1. The common voltage line Ve which the first transparent conductive layer ITO1 applies the common voltage Vcom also extends in the same direction as the transparent conductive gate line GLITO (i.e., the common voltage line Ve is substantially parallel to the transparent conductive gate line GLITO). Either one or both above replacements are applicable in the present disclosure, namely, replacing the metal GL with the transparent conductive material GLITO and replacing the metal DL with the transparent conductive material DLITO. Both are within the scope of the present disclosure. Furthermore, at least part of the gate line GL may also be instead made by the first transparent conductive layer ITO1, while other parts are still made of the first metal layer M1; and at least part of the data line DL may also be instead made by the second transparent conductive layer ITO2, while other parts are still made of the second metal layer M2, all within the scope of the present disclosure.

Similarly, in the embodiment shown in FIG. 4C, because the first electrode CE1 and the second electrode CE2 of the storage capacitor Cs are respectively formed of transparent conductive materials. The transparent conductive gate line GLITO and the transparent conductive data line DLITO are respectively formed of transparent conductive materials or either of them is formed at least partially of transparent conductive materials, which is within the scope of the present disclosure. As a result, the aperture ratio of the electrophoretic display 100 may be increased. Furthermore, the first electrode CE1 of the storage capacitor Cs needs to be electrically connected to the control electrode PE in operation, and in this embodiment, the control electrode PE is directly formed of transparent conductive material as the storage capacitor Cs of the first electrode CE1. As a result, the structure may be simplified and the manufacturing process may be further reduced. In addition, the embodiment shown in FIG. 4C may also be applied to the structure of FIG. 3A, that is, the viewing surface is on the side of the control substrate 10. Therefore, when the control electrode layer PEL, the driving circuit layer 30, and the control substrate 10 disclosed in FIG. 4C is applied to the structure of FIG. 3A; they may also make the driving circuit layer 30 closer to the viewing surface (located on the side of the control substrate 10). As a result, the electrophoretic display 100 of the present disclosure has excellent display effects, high screen refresh speed and reflectivity, and many other advantages. In addition, the manufacturing process of the structure shown in FIG. 4C is similar to the manufacturing process of the structure shown in FIG. 4A and FIG. 4B, but the gate line is not made in the first metal layer M1 manufacturing process of FIG. 4A and FIG. 4B but in the manufacturing process of the first transparent conductive layer ITO1, the transparent conductive gate line GLITO and the common voltage line Ve are simultaneously made. Furthermore, the data line is not made in the manufacturing process of the second metal layer M2 in FIG. 4A and FIG. 4B, but the transparent conductive data line DLITO is simultaneously made in the manufacturing process of the second transparent conductive layer ITO2. The gate line and the data line are instead made by transparent conductive materials to further increase the aperture ratio of the control substrate 10 to equal to or more than 90%.

Figure 5A:
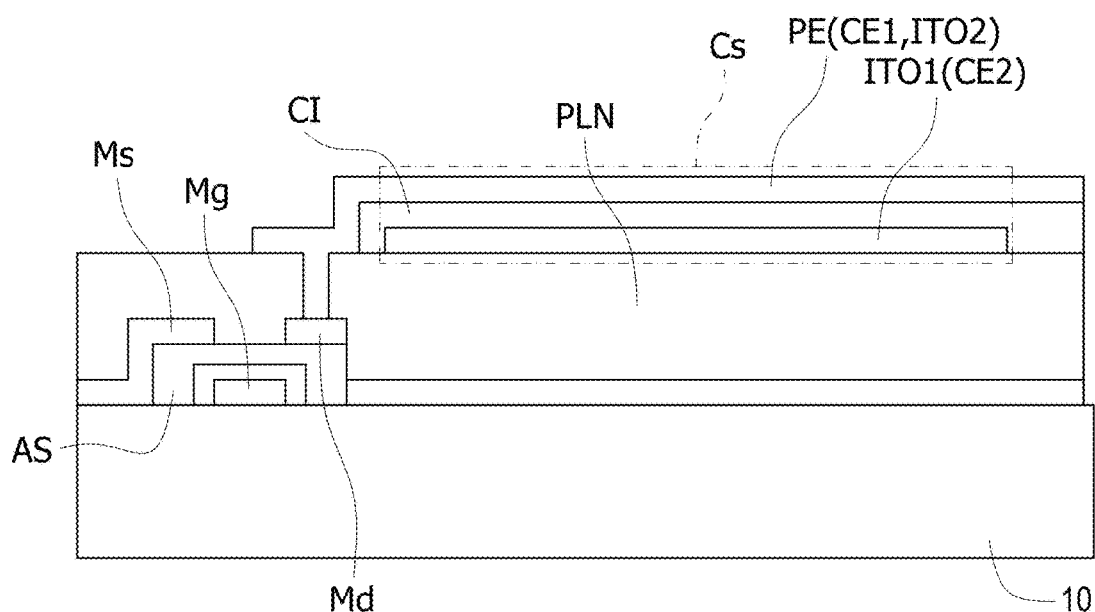
FIG. 5A illustrates a cross-section diagram of part of the elements of the electrophoretic display 100 in accordance with another embodiment of the present disclosure.
Figure 5B:
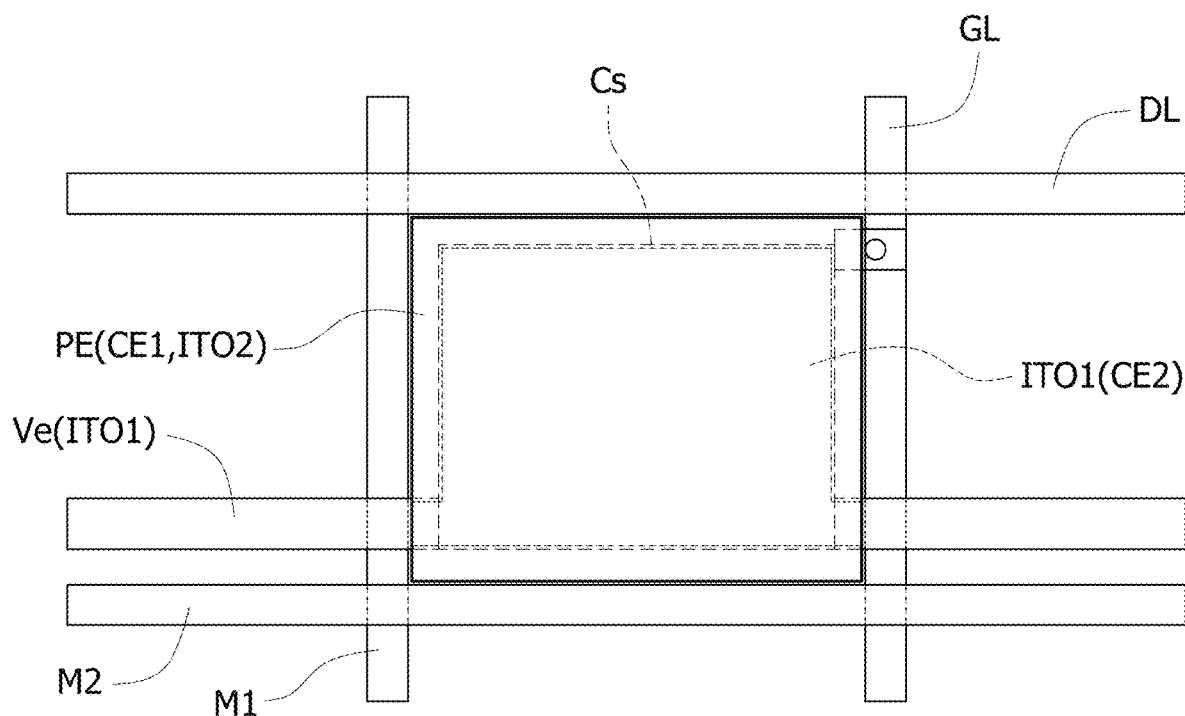
FIG. 5B is a top-view diagram corresponding to FIG. 5A.

Refer to FIG. 5A which illustrates a cross-section diagram of part of the elements of the electrophoretic display 100 in accordance with another embodiment of the present disclosure. FIG. 5A mainly shows the control electrode layer PEL, the driving circuit layer 30, and the control substrate 10 in accordance with another embodiment of the present disclosure. Refer to FIG. 5B, which is a top-view diagram corresponding to FIG. 5A. In addition, the control electrode layer PEL, the driving circuit layer 30, and the control substrate 10 shown in FIG. 5A and FIG. 5B may also be used for the structure shown in FIG. 3A, with the viewing surface viewed from the direction of the control substrate 10 which is close to the control electrode layer PEL, so its image display principle is to use the voltage of the control electrode layer PEL to attract rather than repel the charged color particles in the colloidal solution 24 to achieve various advantages such as better display effects and higher screen refresh speed. In addition, the present disclosure also provides an improved design for the driving circuit layer 30 to improve the aperture ratio when viewed from the control substrate 10.

As shown in FIG. 5A, this embodiment is similar to the embodiment of FIG. 4A, but the control electrode PE and the first transparent conductive layer ITO1 are both made on the second metal layer M2. Similarly, the first electrode CE1 of the storage capacitor Cs is provided by the control electrode PE, while the second electrode CE2 of the storage capacitor Cs is provided by the first transparent conductive layer ITO1. In addition, since the control electrode PE and the first transparent conductive layer ITO1 are both made on the flat layer PLN, the control electrode PE and the first transparent conductive layer ITO1 are not restrained by the manufacturing processes of the first metal layer M1 and the second metal layer M2. Compared with the embodiment of FIG. 4A, this embodiment increases the flexibility of the manufacturing process, furthermore, the flat layer PLN may also be canceled, and the first transparent conductive layer ITO1 is made on the second metal layer M2, or the second metal layer M2 is made on the first transparent conductive layer ITO1 (details are described below with FIG. 5C). Furthermore, as shown in FIG. 5B, a part of the first transparent conductive layer ITO1 extends in the same direction as the data line DL to form the common voltage line Ve that receives the common voltage Vcom (i.e. the common voltage line Ve is substantially parallel to the data line DL).

Similarly, in the embodiment shown in FIG. 5A and FIG. 5B, because the first electrode CE1 and the second electrode CE2 of the storage capacitor Cs are respectively formed of transparent conductive materials, the aperture ratio of the control substrate 10 of the electrophoretic display 100 may be increased. Furthermore, the first electrode CE1 of the storage capacitor Cs needs to be electrically connected to the control electrode PE in operation, and in this embodiment, the control electrode PE is directly formed of transparent conductive material as the storage capacitor Cs of the first electrode CE1. As a result, the structure may be simplified and the manufacturing process may be further reduced. In addition, the embodiment shown in FIG. 5A and FIG. 5B may also be applied to the structure of FIG. 3A, that is, the viewing surface is on the side of the control substrate 10. Therefore, when the control electrode layer PEL, the driving circuit layer 30, and the control substrate 10 disclosed in FIG. 5A and FIG. 5B are applied to the structure of FIG. 3A. They may also make the driving circuit layer 30 closer to the viewing surface (located on the side of the control substrate 10). As a result, the electrophoretic display 100 of the present disclosure has excellent display effects, a high screen refresh speed, and many other advantages.

In addition, the manufacturing method of the embodiment shown in FIG. 5A and FIG. 5B, for the parts on the control substrate 10, a metal film may be made first on the upper surface of the control substrate 10 is processed by a deposition process or a sputtering process, and a photolithography process to make the first metal layer M1. The first metal layer M1 is used to form the gate metal Mg and the gate line GL. Then, the insulation layer (such as SiNx) and a-Si layer AS are deposited, and the semiconductor layer of the thin film transistor is carved out by the photolithography process. Then, a metal film is made on the obtained structure by a deposition process or a sputtering process and the second metal layer M2 is made by a photolithography process. The second metal layer M2 is used to form the source metal Ms, the drain metal Md, and the data line DL. Then, the flat layer PLN and the via are made on the obtained structure by spin coating and photolithography processes. Then, a transparent conductive material film is made by a sputtering process, and the first transparent conductive layer ITO1 is made, from the transparent conductive material film, by a photolithography process to be used as the second electrode CE2 of the storage capacitor Cs. The capacitor insulating layer CI of the storage capacitor Cs is made by depositing insulating materials and photolithography processes. The transparent conductive material film (the second transparent conductive layer ITO2) is made by the sputtering process. The control electrode layer PE of the control electrode layer PEL is made by the photolithography process to be used as the first electrode CE1 of the storage capacitor Cs, and then the insulating protective layer is made. Then, the electrophoresis layer 20 may be bonded or made. The electrophoresis layer 20 includes the hollow cavity 22. The hollow cavity 22 is made by forming a resin film on a plastic substrate, using a roller to make indentations on the resin film to form the hollow cavity 22. The hollow cavity 22 is used as a container for electronic ink. Then the colloidal solution 24 containing the charged color particle 26 is injected into the hollow cavity 22. Then, the top of the colloidal solution 24 is sealed with glue to a sealed cavity to form the electrophoresis layer 20. For the detailed manufacturing process, please refer to Taiwan Patent Application No. 93100767. Then, the parts on the opposite substrate 12 are made, and the common electrode layer 14 and the insulation layer may be formed on the opposite substrate 12. Finally, the side that has made the electrophoresis layer 20 of the control substrate 10 and the side of the opposite substrate 12 where the common electrode and the insulation layer have been made are bonded with the optical adhesives. The above deposition process (chemical vapor deposition, CVD, Plasma-Enhanced CVD, PECVD), sputter deposition, and coating are all mature manufacturing processes commonly used in display panels, which may make the electrophoretic display 100 of the present disclosure with various advantages such as high aperture ratio and high screen refresh speed.

Figure 5C:
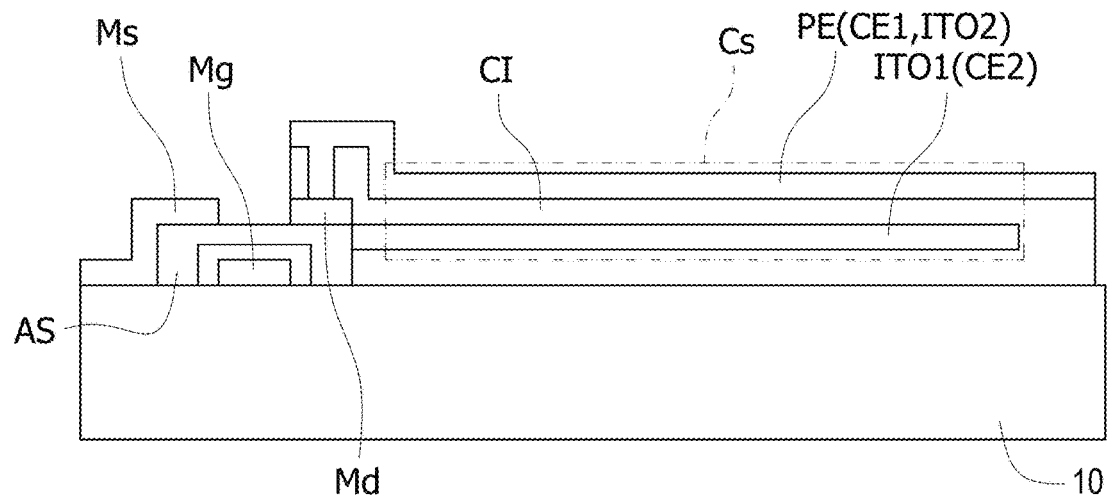
FIG. 5C illustrates a cross-section diagram of part of the elements of the electrophoretic display 100 in accordance with another embodiment of the present disclosure.

Refer to FIG. 5C, which illustrates a cross-section diagram of part of the elements of the electrophoretic display 100 in accordance with another embodiment of the present disclosure. FIG. 5C mainly shows the control electrode layer PEL, the driving circuit layer 30, and the control substrate 10 in accordance with another embodiment of the present disclosure. The control electrode layer PEL, the driving circuit layer 30, and the control substrate 10 shown in FIG. 5C may also be used for the structure shown in FIG. 3A, with the viewing surface viewed from the direction of the control substrate 10 which is close to the control electrode layer PEL, so its image display principle is to use the voltage of the control electrode layer PEL to attract rather than repel the charged color particles in the colloidal solution 24 to achieve various advantages such as better display effects and higher screen refresh speeds. In addition, the present disclosure also provides an improved design for the driving circuit layer 30 to improve the aperture ratio when viewed from the control substrate 10.

As shown in FIG. 5C, this embodiment is similar to the embodiment of FIG. 5A, the first electrode CE1 of the storage capacitor Cs is provided by the control electrode PE, while the second electrode CE2 of the storage capacitor Cs is provided by the first transparent conductive layer ITO1, but the control electrode PE and the first transparent conductive layer ITO1 are not made on the flat layer PLN. Because the first electrode CE1 and the second electrode CE2 of the storage capacitor Cs are respectively formed of transparent conductive materials, the aperture ratio of the control substrate 10 of the electrophoretic display 100 may be increased. Furthermore, the first electrode CE1 of the storage capacitor Cs needs to be electrically connected to the control electrode PE in operation, and in this embodiment, the control electrode PE is directly formed of transparent conductive material as the storage capacitor Cs of the first electrode CE1. As a result, the structure may be simplified and the manufacturing process may be further reduced. In addition, the embodiment shown in FIG. 5C may also be applied to the structure of FIG. 3A, that is, the viewing surface is on the side of the control substrate 10. Therefore, when the control electrode layer PEL, the driving circuit layer 30, and the control substrate 10 disclosed in FIG. 5C is applied to the structure of FIG. 3A, they may also make the driving circuit layer 30 closer to the viewing surface (located on the side of the control substrate 10). As a result, the electrophoretic display 100 of the present disclosure has excellent display effects, a high screen refresh speed, and many other advantages.

In addition, the manufacturing method of the embodiment shown in FIG. 5C, for the parts on the control substrate 10, a metal film may be made first on the upper surface of the control substrate 10 is processed by a deposition process or a sputtering process, and a photolithography process to make the first metal layer M1. The first metal layer M1 is used to form the gate metal Mg and the gate line GL. Then, the insulation layer (such as SiNx) and a-Si layer AS are deposited, and the semiconductor layer of the thin film transistor is carved out by the photolithography process. Then, a metal film is made on the obtained structure by a deposition process or a sputtering process and the second metal layer M2 is made by a photolithography process. The second metal layer M2 is used to form the source metal Ms, the drain metal Md, and the data line DL. Then, the transparent conductive material film is made by the sputtering process, and the first transparent conductive layer ITO1 and the common voltage line Ve is made by the photolithography process. The above two steps may also be reversed, that is, the first transparent conductive layer ITO1 is formed first, and then the second metal layer M2 is formed. Basically, the first transparent conductive layer ITO1, and the second metal layer M2 are on the same layer or at positions with similar height. Then, the insulation layer is deposited, and the insulation layer CI that is used for the storage capacitor Cs is carved out by the photolithography process, then, the transparent conductive material film is made by the sputtering process, and the control electrode layer PEL(ITO2) is made by the photolithography process. Then, optionally, the flat layer PLN or the insulation layer are made on the obtained structure by a coating process and a photolithography process. Then, the electrophoresis layer 20 may be bonded or made on the flat layer PLN. The electrophoresis layer 20 includes the hollow cavity 22. The hollow cavity 22 is made by forming a resin film on a plastic substrate, using a roller to make indentations on the resin film to form the hollow cavity 22. The hollow cavity 22 is used as a container for electronic ink. Then the colloidal solution 24 containing the charged color particle 26 is injected into the hollow cavity 22. Then, the top of the colloidal solution 24 is sealed with glue to a sealed cavity to form the electrophoresis layer 20. For the detailed manufacturing process, please refer to Taiwan Patent Application No. 93100767, or the micro-partition structure in the present disclosure. Details are described below. Then the parts on the opposite substrate 12 are made, the common electrode layer 14 may be formed on the opposite substrate 12, alternatively, the common electrode layer 14 may not be disposed on the opposite substrate 12. Finally, the side that has made the electrophoresis layer 20 of the control substrate 10 and one side of the opposite substrate 12 are bonded with the optical adhesives or are bonded by the frame glue with the help of the structure of the micro tenon (details are described below) of the present disclosure. The above deposition process (chemical vapor deposition, CVD, Plasma-Enhanced CVD, PECVD), sputter deposition, and coating are all mature manufacturing processes commonly used in display panels, which may make the electrophoretic display 100 of the present disclosure with various advantages such as high aperture ratio and high screen refresh speed. In the examples shown in FIGS. 3B-3C, FIGS. 4A-4C, and FIGS. 5A-5C, according to a feasible method, at least one of the storage capacitor Cs includes a transparent the first electrode CE1, a transparent the second electrode CE2 and an insulation layer CI between the first electrode CE1 and the second electrode CE2; according to another feasible method, all the storage capacitor Cs respectively include a transparent first electrode CE1, a transparent second electrode CE2 and an insulation layer CI between the first electrode CE1 and the second electrode CE2; and according to yet another feasible method, at least the storage capacitor Cs in the viewing area of the electrophoretic display respectively include a transparent first electrode CE1, a transparent second electrode CE2 and an insulation layer CI between the first electrode CE1 and the second electrode CE2.

In the examples shown in FIGS. 3A-3C, FIGS. 4A-4C, and FIGS. 5A-5C, because the common electrode layer 14 is located away from the viewing surface, the common electrode layer 14 does not need to be made of conductive transparent material. For example, the common electrode layer 14 may be made of an opaque conductive material, such as an aluminum film. Since the viewing surface is not on the opposite substrate side, the common electrode layer 14 is not disposed on the opposite substrate, which is also an embodiment of the present disclosure. In addition, according to the embodiments shown in FIGS. 3A-3C, FIGS. 4A-4C, and FIGS. 5A-5C, the aperture ratio may be increased to not less than 70%, preferably the aperture ratio may be increased to not less than 80%, and most preferably the aperture ratio may be increased to not less than 90%. According to an embodiment of the present disclosure, the sum of the line width of the gate line and the data line is designed to be not more than 20 µm (for large-size displays or low-resolution displays), or not more than 10 µm (for medium and small size displays or high-resolution displays), which may further improve the aperture ratio.

Figure 18A:
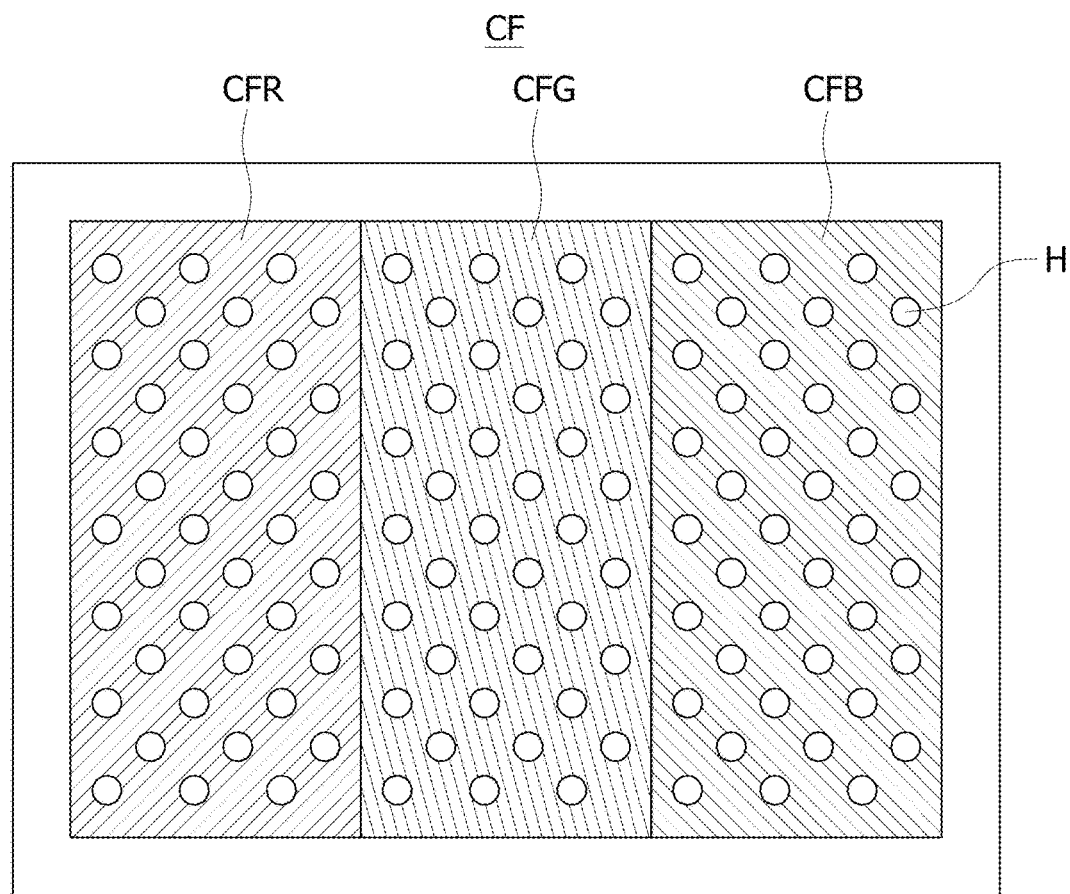
FIG. 18A is a schematic diagram of the color filter layer CF in accordance with an embodiment of the present disclosure.
Figure 19:
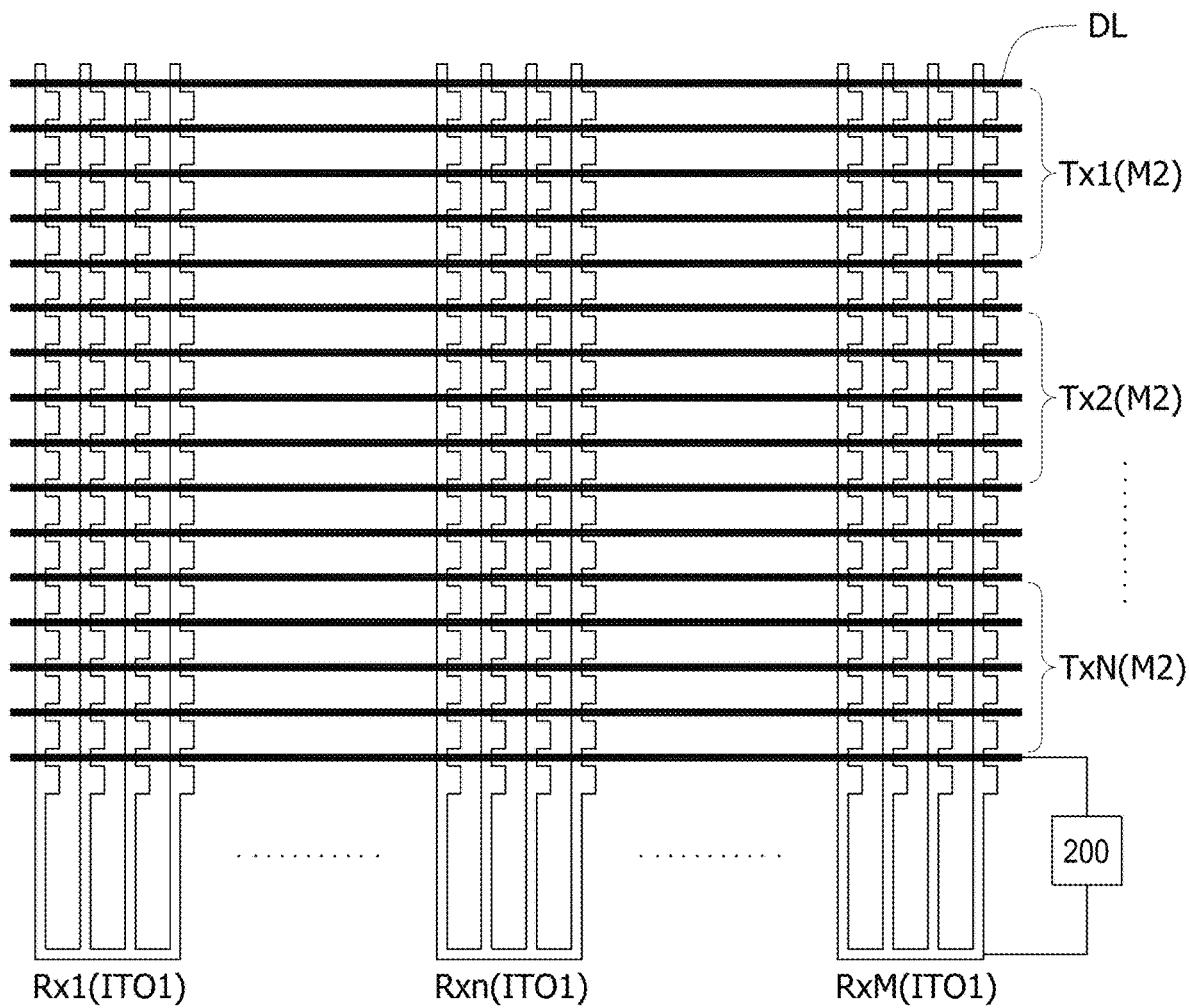
FIG. 19 is a schematic diagram of the embedded touch of the electrophoretic display in accordance with the present disclosure.

In addition, in the embodiments shown in FIGS. 3A-3C, FIGS. 4A-4C and FIG. 5A and FIG. 5C, the area of the semiconductor part AS of the thin film transistor 32 may not be more than 1000 µm$^2$, the overlapping area of the thin film transistor 32 and the gate line GL may not be less than 20 µm$^2$, and the overlapping area of the thin film transistor 32 and the data line DL may not be less than 5 µm$^2$; in addition, the line width of the gate line GL may be not more than 5 µm or 10 µm, and the line width of the data line DL may be not more than 5 µm or 10 µm, and the sum of the line width of the gate line GL and the data line DL may not be more than 20 µm. Furthermore, the first electrode CE1 and the second electrode CE2 of the storage capacitor Cs overlap each other in the projection direction, and their overlapping area is not less than 30% of the pixel area. In the electrophoretic display 100 applicable to the embodiments shown in FIGS. 3A-3C, FIGS. 4A-4C and FIGS. 5A and 5C, the electrophoresis layer 20 may have the micro-partition structure shown in FIGS. 11A-11C, FIGS. 12A-12C, FIGS. 13A-13C and FIGS. 14A-14E of the present disclosure or may be implemented in a similar manner. Moreover, the electrophoretic display 100 may also have the micro tenon 60 corresponding to FIGS. 14C-14E, FIGS. 16A-16D or may be implemented in a similar manner. Those skilled in the art should be able to appropriately modify the micro-partition and the micro tenon disclosed in the above embodiments and apply them to the embodiments shown in FIGS. 3A-3C, FIGS. 4A-4C and FIG. 5A and FIG. 5C of the present disclosure. In addition, if the electrophoretic displays 100 of the embodiments shown in FIGS. 3A-3C, FIGS. 4A-4C and FIG. 5A and FIG. 5C includes the color filter layer, the color filter layer may have a structure as shown in the present disclosure in FIG. 18A, that is, the color filter layer CF includes a plurality of color filter blocks (CFR, CFG, CFB) with different colors. The color filter block includes a plurality of holes H and at least one hole H includes an area of not more than 100 µm$^2$. In addition, the electrophoretic displays 100 of the embodiments shown in FIGS. 3A-3C, FIGS. 4A-4C and FIG. 5A and FIG. 5C may also be applied to, for example, the structure as shown in FIG. 19. The common voltage lines Ve are electrically connected to a display driver 200 or a display touch integrated driver 200. During the touch operation of the electrophoretic display 100, the display touch integrated driver 200 electrically connects a plurality of data lines DL together as a single touch-transmitting electrode. The display touch integrated driver 200 electrically connects a plurality of common voltage lines Ve together as a single touch-receiving electrode. Alternatively, the touch-transmitting electrode above-mentioned and the touch-receiving electrode may be interchanged with each other.

2. The Thin Film Transistor Made on the Gate Line

Figure 6A:
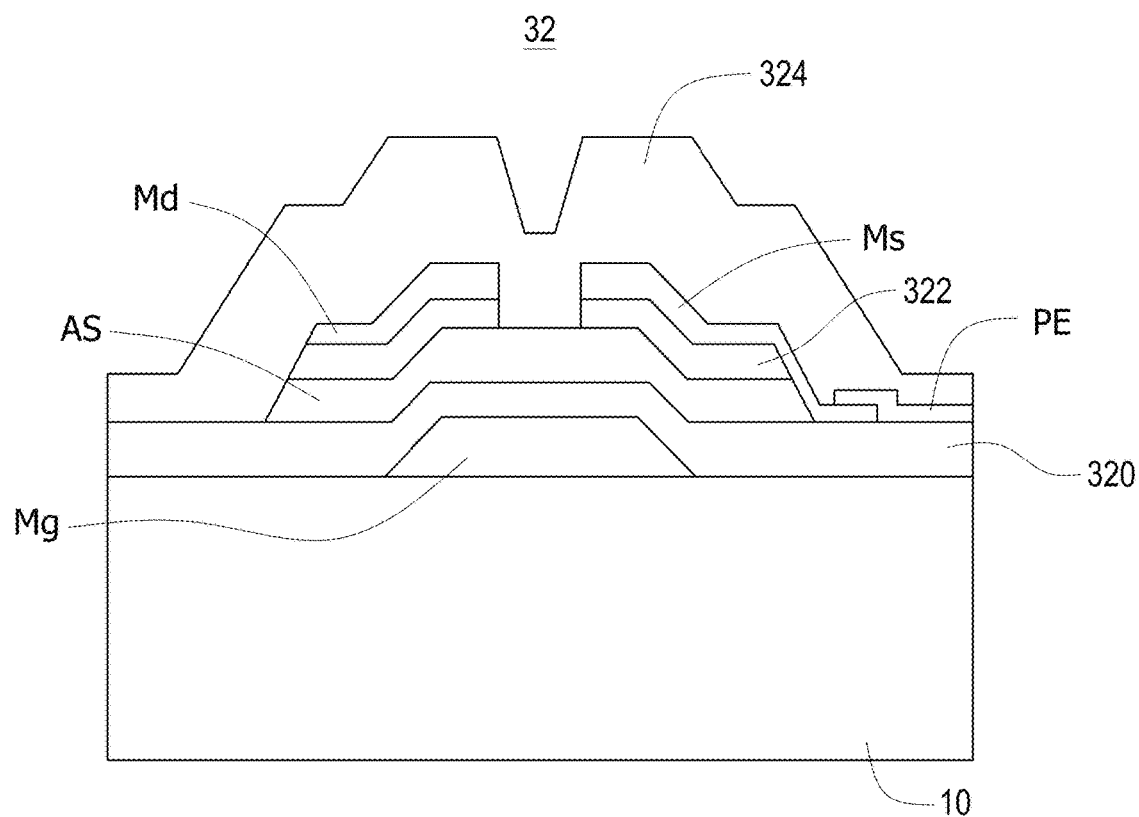
FIG. 6A illustrates a structural diagram of a thin film transistor in accordance with the related-art.

Refer to FIG. 6A which illustrates a structural diagram of a thin film transistor in accordance with the related-art. The manufacturing process of the thin film transistor generally includes five photomask steps. In the first photomask process, it forms the first metal layer M1 on the glass substrate (e.g. the control substrate 10). That is, the gate metal Mg and the gate line GL are carved out by the photolithography process cooperating with the first photomask. In the related-art of the electrophoretic display, the first metal layer M1 is also used as the first electrode CE1 of the storage capacitor Cs. Then, the insulation layer 320 (such as SiNx, SiO$_2$) and a-Si layer are deposited and the semiconductor part (i.e., the a-Si layer AS) is carved out by the photolithography process cooperated with the second photomask. Then, the doped layer 322 is formed by ion implantation. Then, the second metal layer M2 is formed, the source metal Ms/the drain metal Md are carved out, and the data line by the photolithography process cooperated with the third photomask. In the related-art of the electrophoretic display, the second metal layer M2 is also used as the second electrode CE2 of the storage capacitor Cs. Then, a transparent conductive layer (ITO) is made by the sputtering process, and the contact point is made between the control electrode PE and the source metal Ms by the photolithography process cooperated with the fourth photomask. The insulating protective layer (passivation layer) 324 is deposited, and the remaining metal surfaces are carved out that need to be exposed by the photolithography process cooperated with the fifth photomask.

Figure 6B:
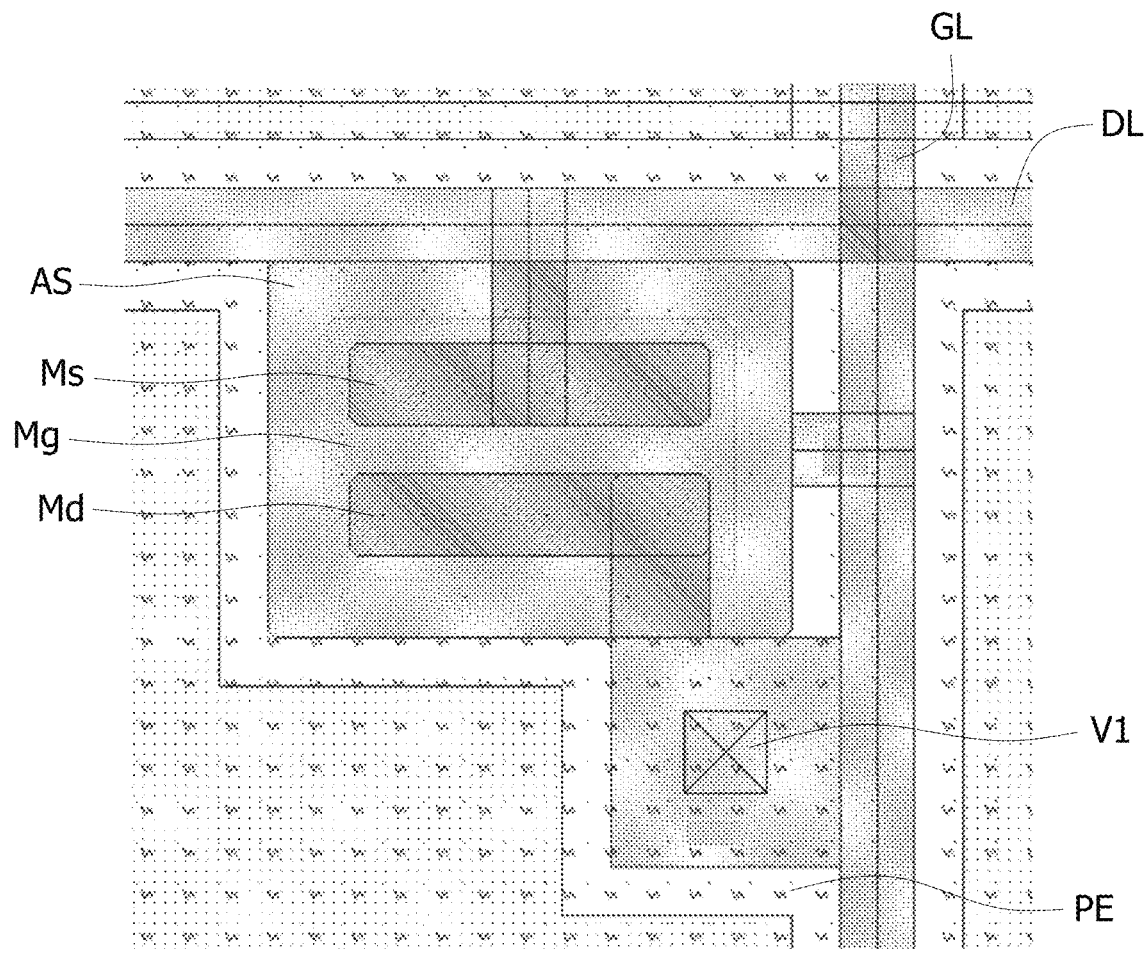
FIG. 6B is a top-view diagram of the thin film transistor 32 and other related elements in accordance with the related-art.

Refer to FIG. 6B which is a top-view diagram of the thin film transistor 32 and other related elements in accordance with the related-art. As shown in FIG. 6B, the source metal Ms of the thin film transistor is electrically connected to the data line DL, the drain metal Md is connected to the control electrode PE through the via V1, and the gate metal Mg is electrically connected to the gate line GL. In addition, the semiconductor layer of the thin film transistor 32, that is, the semiconductor part AS, is not overlapped with the gate line GL or the data line DL in the projection view, so the design of amorphous silicon TFT may occupy a larger area and affect the aperture ratio of the control substrate.

Figure 6C:
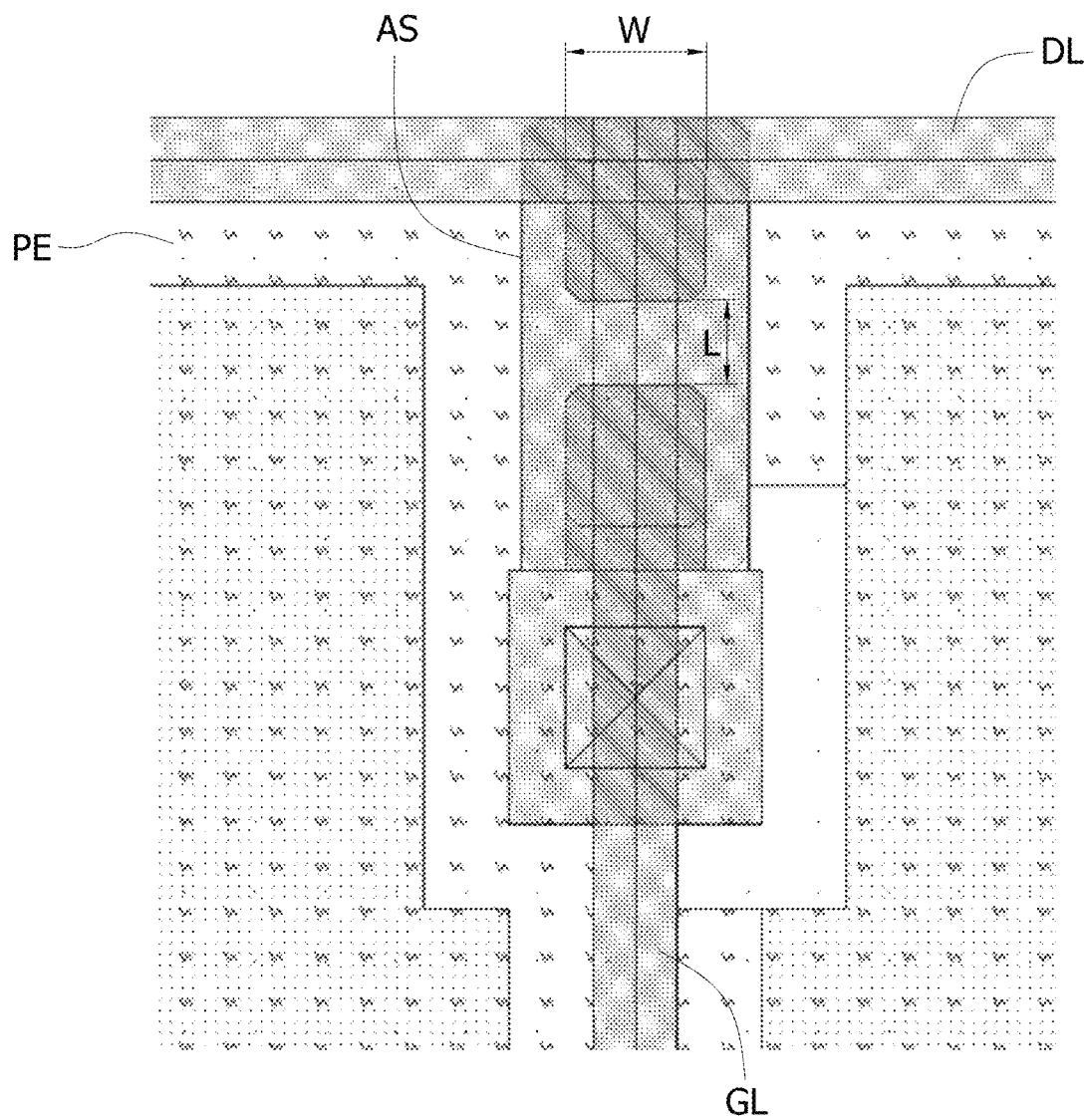
FIG. 6C is a thin film transistor in accordance with an embodiment of the present disclosure.
Figure 6D:
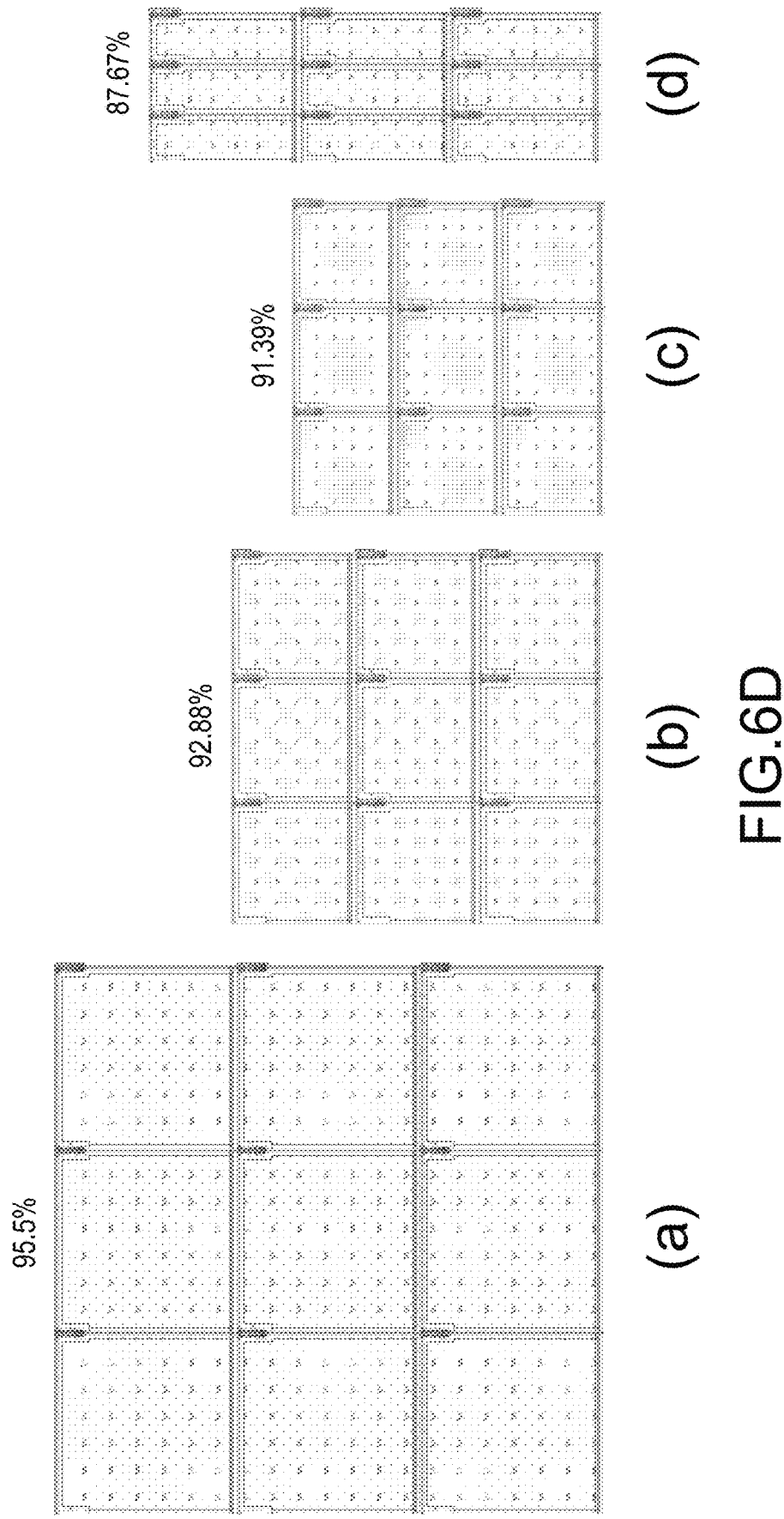
FIG. 6D is an aperture ratio designed at different resolutions in accordance with an embodiment of the present disclosure.

Referring to FIG. 6C, in order to further improve the aperture ratio of the control substrate, according to the embodiment of a thin film transistor of the present disclosure, the a-Si layer AS (i.e., the semiconductor part) of the thin film transistor 32 at least is partially overlapped with one of the gate line GL or the data line DL or at least is partially overlapped with both of the gate line GL and the data line DL. In addition, the via V1 of the thin film transistor 32 also overlaps with the gate line GL. In other words, in the present disclosure, the thin film transistor 32 originally placed in the control electrode PE area of the electrophoretic display 100 is moved relative to the junction point which is relative to the data line and the gate line to increase the aperture ratio of the electrophoretic display 100. After the actual design and under optimal conditions, the electrophoretic display 100 of the present disclosure may have the following aperture ratio:

Refer to FIG. 6D for a design example using the present disclosure. (a) At a black-and-white resolution of 166 PPI (pixel size is 150 µm×150 µm), the aperture ratio of the control substrate may be achieved at 95.5%. (b) At a black-and-white resolution of 250 PPI (pixel size is 100

μm×100 μm), the aperture ratio of the control substrate may be achieved at 92.88%. (c) At a black-and-white resolution of 300 PPI (pixel size is 85 μm×85 μm), the aperture ratio of the control substrate may be achieved at 91.39%. (d) At a color resolution of 200 PPI (pixel size is 120 μm×120 μm, each RGB sub-pixel size is 40 μm×120 μm) the aperture ratio of the control substrate may be achieved at 87.67%. According to the present disclosure, a conservative design scheme is used under the resolution of most applied scenes, the width of the gate line is adjusted to 5 μm, the width of the data line is adjusted to 5 μm (i.e., the width of the gate line plus the width of the data line is not more than 10 μm). Under the above resolution conditions, the aperture ratio may be achieved equal to or more than 80%. In addition, according to an embodiment of the present disclosure, the width of the gate line is adjusted to 10 μm, the width of the data line is adjusted to 10 μm (i.e., the width of the gate line plus the width of the data line is not more than 20 μm). Under the above resolution conditions, the aperture ratio may be achieved equal to or more than 70%. According to an embodiment of the present disclosure, the areas of the gate line and the data line that do not overlap with the AS area (semiconductor area) of the TFT are instead made by transparent conductive materials, that is, part of the area of the gate line is replaced with transparent conductive materials or part of the area of the data line is replaced with transparent conductive materials. Under the above resolution conditions, the aperture ratio may be achieved equal to or greater than 90%.

Nowadays, standard display drive circuit designs adopt the original LCD circuit design as a template. When the thin film transistor with amorphous silicon (a-Si) is used in the design, the drift speed of a-Si is very slow, causing the resistance of conduction to be very large. Therefore, the TFT design may adopt a higher W/L (the gate channel width W/the gate channel length L), so the thin film transistor may occupy a high proportion of the area. Especially at higher resolutions, the area ratio of the thin film transistor may be higher. Since the thin film transistor is opaque, the higher the area ratio of the thin film transistor represents the lower the aperture ratio. Since the speed of liquid crystal transition of LCD is much higher than the speed of movement of charged particles in electrophoretic displays, LCD may provide a higher screen refresh speed. However, for displays adopting electrophoresis, the charged particles move very slowly in the colloidal solution and the screen refresh speed may also be very slow. Therefore, the design considerations of the thin film transistor may be different from the design of the thin film transistor of the drive circuit of the LCD. The design of the thin film transistor of LCD needs to be considered to adopt a lower conduction resistance, however, the design of the electrophoretic display allows for adopting a higher conductivity resistance. Refer to FIG. 6C, the thin film transistor 32 in the driving circuit layer 30 of the electrophoretic display may reduce the area of the transistor to increase the aperture ratio. According to one embodiment of the present disclosure, as shown in FIG. 6C, the parameters of the gate channel length L and the gate channel width W of the thin film transistor are adjusted for the electrophoretic display, to increase the aperture ratio. Generally, the W/L ratio of the thin film transistor in the drive circuit of LCD is more than 10:1, that is, the gate channel length L is much less than the gate channel width W. According to one embodiment of the present disclosure, the ratio of the parameters of the gate channel width W and the gate channel length L of the thin film transistor is 1:1, that is, the gate channel length L is equal to the gate channel width W, to increase the aperture ratio of the electrophoretic display 100.

Refer to FIG. 6C, according to an embodiment of the present disclosure, the area of the a-Si layer AS (the semiconductor part) of the thin film transistor 32 is less than 1000 μm². The overlapping area of the semiconductor part AS of the thin film transistor 32 and the data line DL is more than 5 μm². The overlapping area of the semiconductor part AS of the thin film transistor 32 and the gate line GL is more than 20 μm². In other words, according to an embodiment of the present disclosure, the main part of the semiconductor part AS is constructed on the gate line GL. Since the gate line GL is generally made of non-transparent conductive materials, the main part of the semiconductor part AS constructed on the gate line GL may greatly improve the aperture ratio of the control substrate of the electrophoretic display 100. In addition, in order to further optimize the design parameters of the thin film transistor 32 that is used for the electrophoretic display 100, according to an embodiment of the present disclosure, the gate channel length L of the design of the thin film transistor 32 is less than 10 μm, the gate channel width W is less than 25 μm. According to an embodiment of the present disclosure, the gate channel length L is 5 μm, and the gate channel width W is 5 μm. The design requires that the width of the gate channel is not more than 5 times the gate channel length, that is, the W/L ratio is less than 5. There may be different design specifications under the requirements of different size displays. The resolution of larger displays may be relatively lower. In order to improve the production yield, the data line and the gate with a larger line width may be adopted. For example, the width of the data line and the gate line are both 10 μm, that is, the sum of the line width of the gate line and the line width of the data line is not more than 20 μm. On small-size displays, thinner line widths are needed. For example, the width of the data line and the gate line are both 5 μm, that is, the sum of the line width of the gate line and the line width of the data line is not more than 10 μm so the aperture ratio of the control substrate may be more than 80%. The same is true in the design of transistor channels. The gate channel length L of a large-size display is not more than 10 μm, and the width W of the gate channel is not more than 50 μm under the condition that W/L is 5. In the design of small-sized displays, the gate channel length L is not more than 5 μm, and the width W of the gate channel is not more than 25 μm under the condition that W/L is 5.

Figure 1B:
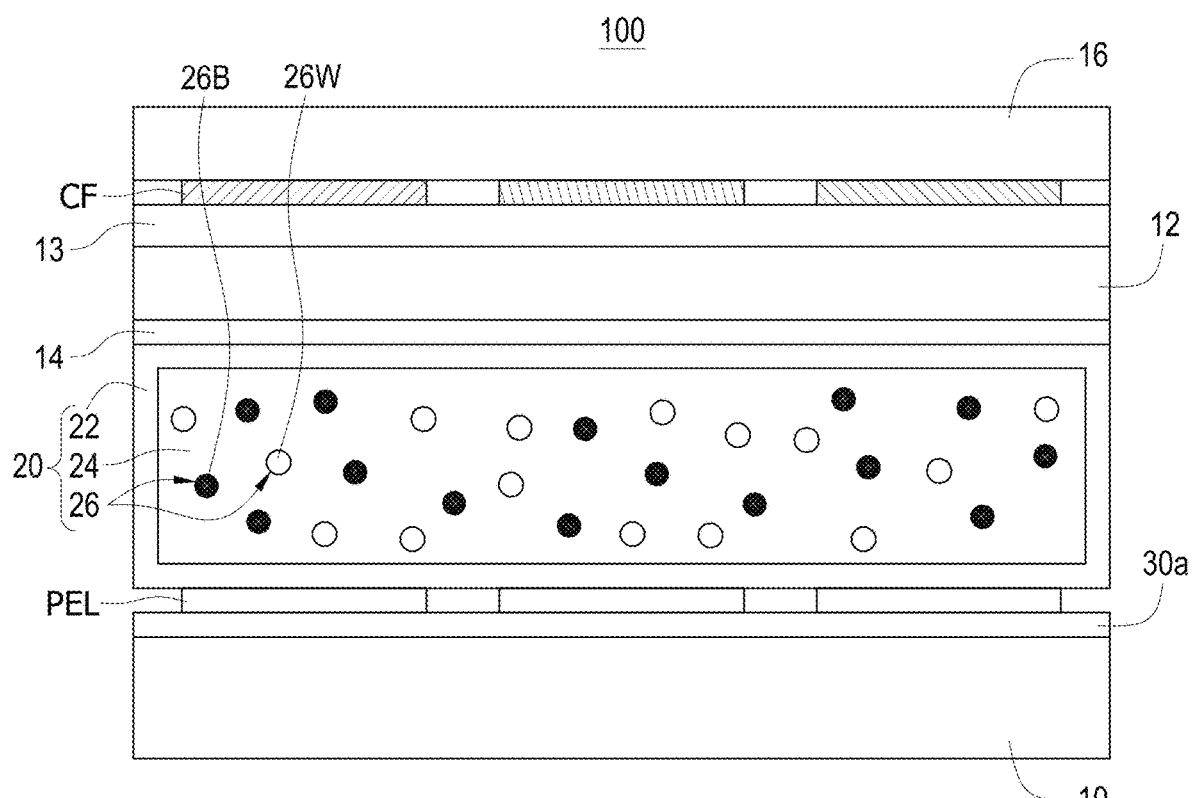
FIG. 1B shows a cross-section diagram of a color electrophoretic display 100 in accordance with the related-art.

The structure of the thin film transistor 32 of FIG. 6C, which is at least partially constructed on the gate line GL, may be applied to the driving circuit layer 30 with a high aperture ratio of the present disclosure to further improve the overall aperture ratio of the electrophoretic display 100. For example, the structure of the thin film transistor 32 of FIG. 6C may be applied to the driving circuit layer 30 with a high aperture ratio shown in the present disclosure of FIGS. 3A-3C, FIGS. 4A-4C and FIGS. 5A-5C. As a result, in addition to the first electrode CE1/the second electrode CE2 of the storage capacitor Cs constructed of transparent conductive materials, the overall aperture ratio of the electrophoretic display 100 is further improved. However, the structure of the thin film transistor 32 in FIG. 6C may also be applied to the related-art of the driving circuit layer 30a, such as the related-art of the electrophoretic display 100 shown in FIGS. 1A-1B. In this way, the aperture ratio of the control substrate of the electrophoretic display 100 may be improved without changing the design of the storage capacitor Cs.

Furthermore, in the electrophoretic display 100 with the thin film transistor 32 structure partially built on the gate line GL, and designed by the gate channel width/gate channel length as shown in FIG. 6C, the electrophoresis layer 20 may have the micro-partition structure shown in FIGS. 11A-11C, FIGS. 12A-12C, FIGS. 13A-13C and FIGS. 14A-14E of the present disclosure or may be implemented in a similar manner. Moreover, the electrophoretic display 100 may also have the micro tenon 60 corresponding to FIGS. 14C-14E, FIGS. 16A-16D or may be implemented in similar manner. Those skilled in the art should be able to appropriately modify the micro-partition and the micro tenon disclosed in the above embodiments to apply in the electrophoretic display 100 with the thin film transistor 32 structure partially built on the gate line GL and designed by the gate channel width/gate channel length as shown in FIG. 6C. In addition, if the electrophoretic display 100 with the thin film transistor 32 structure partially built on the gate line GL and designed by the gate channel width/gate channel length as shown in FIG. 6C includes the color filter layer, the color filter layer may have a structure as shown in the present disclosure in FIG. 18A, that is, the color filter layer CF includes a plurality of color filter blocks (CFR, CFG, CFB) with different colors. The color filter block includes a plurality of holes H and at least one hole H includes an area of not more than 100 μm². In addition, the electrophoretic display 100 with the thin film transistor 32 structure partially built on the gate line GL, and designed by the gate channel width/gate channel length as shown in FIG. 6C may also be applied to, for example, the structure shown in FIG. 19. The common voltage lines Ve are electrically connected to a display driver 200 or a display touch integrated driver 200. During the touch operation of the electrophoretic display 100, the display touch integrated driver 200 electrically connects a plurality of data lines DL together as a single touch-transmitting electrode. The display touch integrated driver 200 electrically connects a plurality of common voltage lines Ve together as a single touch-receiving electrode. Alternatively, the touch-transmitting electrode above-mentioned and the touch-receiving electrode may be interchanged with each other.

3. The Color Filter Layer Moved to the Control Substrate

Figure 7A:
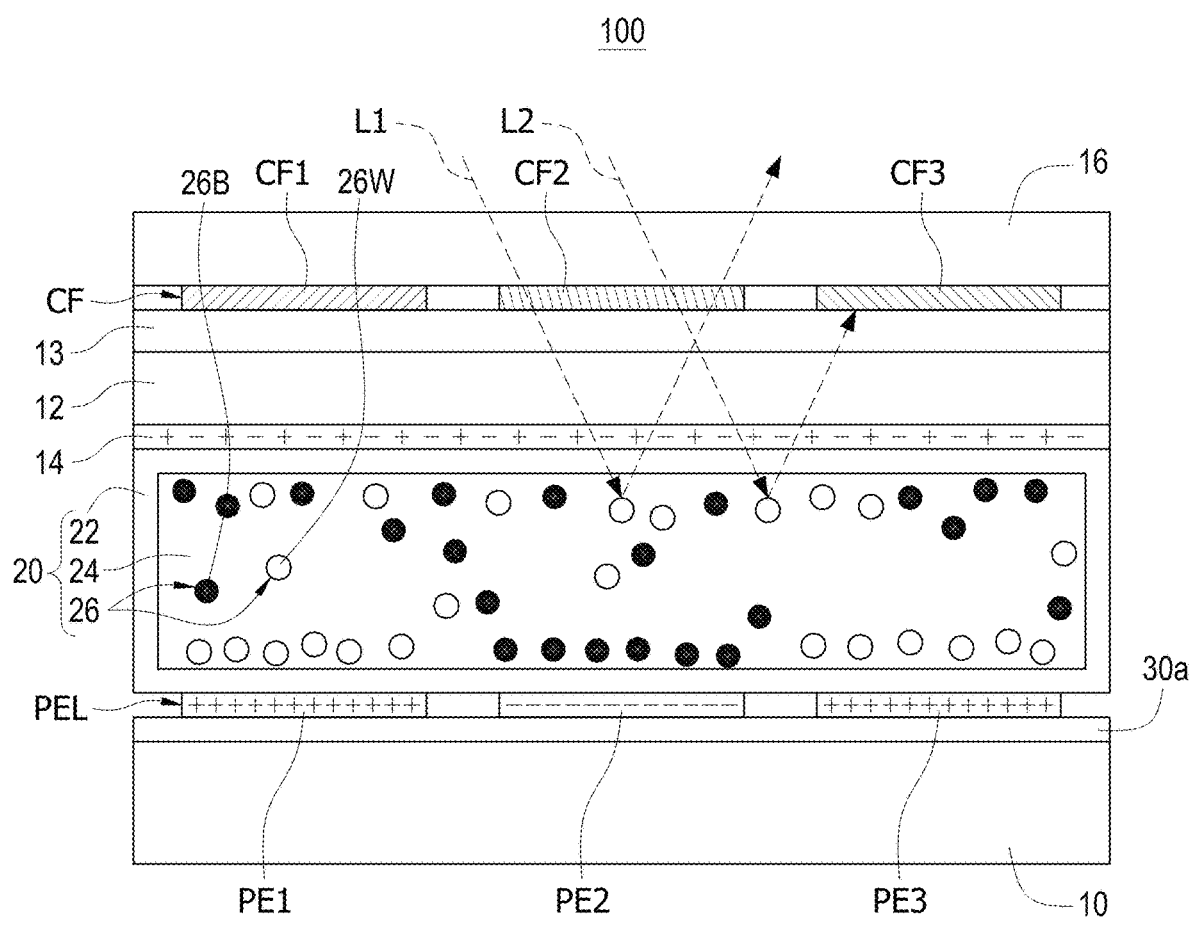
FIG. 7A is a cross-section diagram of the color electrophoretic display 100 in accordance with the related-art.

Refer to FIG. 7A which is a cross-section diagram of the color electrophoretic display 100 in accordance with the related-art. This color the electrophoretic display 100 includes, for example, from top to bottom the upper glass substrate 16, the color filter layer CF, the optical adhesives 13, an opposite substrate 12 (e.g. a transparent plastic substrate), a common electrode layer 14 (e.g. a transparent conductive electrode layer), an electrophoresis layer 20, a control electrode layer PEL, a driving circuit layer 30 and a control substrate 10 (e.g. a glass substrate). In addition, as shown in FIG. 7A, the electrophoresis layer 20 includes a plurality of hollow cavities 22 (only one is shown in figures) The colloidal solution 24 filled in each hollow cavity 22 includes a plurality of charged color particles 26 (such as the charged black particles 26B and the charged white particles 26W). The hollow cavity 22 is used as a container for electronic ink. However, in the color electrophoretic display 100 shown in FIG. 7A, the color filter layer CF and the charged color particle are separated by a thickness of the opposite substrate 12 plus a thickness of the hollow cavity 22 cavity film plus the optical adhesives 13. The thickness range is about 100~200 μm. This thickness may cause the incoming color of the incident light to be absorbed and then no reflected light penetrates to the outside when it is reflected through filter pigments of other colors causing the visible brightness to decrease. As shown in FIG. 7A, the incident light L1 is first incident through the second color filter block CF2, and after contact with the charged color particle (e.g. the charged white particle 26W) and reflected, the incident light L1 leaves the color electrophoretic display 100 through the second color filter block CF2. However, the incident light L1 needs to go through the opposite substrate 12 and second color filter block CF2 to reach the charged white particle 26W, which may attenuate to a certain extent. Furthermore, this incident light L1 may leave the color electrophoretic display 100 through the second color filter block CF2 again, causing secondary filter light attenuation.

As shown in FIG. 7A, a worse situation is that another incident light L2 is first incident through the second color filter block CF2, and after contact with the charged color particle (e.g. the charged white particle 26W) and reflected, the incident light L2 leaves the color electrophoretic display 100 through the third color filter blocks CF3 in different colors. Since the third color filter block CF3 (e.g. blue) is different in color from the second color filter block CF2 (e.g. green), the incident light L2 is completely absorbed and may not leave the color electrophoretic display 100. As a result, the color made by the charged white particle 26W combined with the second color filter block CF2 may not be shown. The above situation becomes more serious when the distance traveled by the incident light from the incident surface of the filter pigment, to contact the charged color particle, and then to the leaving surface of the filter pigment is greater. In short, the thicker the thickness of the opposite substrate 12 and the thicker the thickness of the hollow cavity 22 cavity film, and the thicker the optical thickness or the higher the resolution, the more serious problems such as color distortion, reduced visual brightness, and insufficient saturation may become. This problem has been plaguing the development of color electronic paper displays by adopting the color filter layer for many years. The screen resolution of the color electrophoretic display 100 is also severely limited and may not develop to high resolution.

Figure 7B:
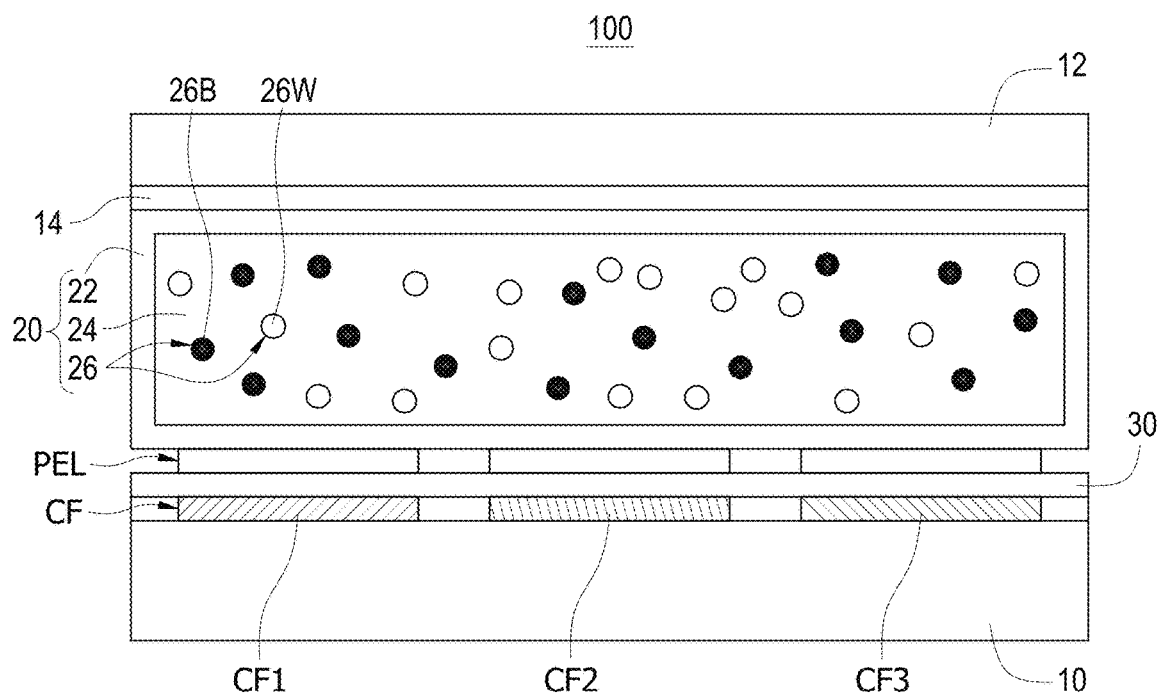
FIG. 7B is a cross-section diagram of the color electrophoretic display in accordance with an embodiment of the present disclosure.

Refer to FIG. 7B, in the present disclosure, the color filter layer CF is made on the control substrate 10, or close to the control substrate 10, which may reduce the distance between the color filter layer CF and the reflective particles. When the viewing surface is on the same side of the control substrate 10, the distance between the color filter layer CF and the charged color particle 26 may be reduced to within 30 μm, and the above problems may be solved. If the hollow cavity 22 of the electrophoresis layer 20 is constructed by the micro-partition (details are described below) in the present disclosure, the distance between the color filter layer CF and the charged color particle 26 may be further reduced to equal to or less than 3 μm or direct contact with zero distance. As a result, the best display quality of the electrophoretic display 100 may be achieved.

As shown in FIG. 7B, for convenience of explanation, that is, to have a clearer comparison with the related-art of the electrophoretic display, even though the electrophoretic display 100 of the present disclosure is viewed from the side of the control substrate 10, in the structure shown in FIG. 7B, the control substrate 10 is still below the structure. According to this embodiment, the electrophoretic display 100 of the present disclosure includes, from bottom to top, the control substrate 10, the color filter layer CF, the driving circuit layer 30 with a high aperture ratio driving circuit layer 30 (which is abbreviated as the driving circuit layer 30 below), the control electrode layer PEL, the electrophoresis layer 20, the common electrode layer 14 (i.e. a transparent conductive electrode layer or an opaque metal conductive layer, etc.) and an opposite substrate 12. Similarly, the electrophoresis layer 20 includes a plurality of hollow cavities 22 (only one is shown in figures) and the colloidal solution 24 filled in each hollow cavity 22 includes a plurality of charged color particles 26 (such as the charged black particles 26B and the charged white particles 26W). The hollow cavity 22 is, for example, the hollow cavity composed of organic polymer materials, and is used for filling the colloidal solution 24 which includes charged color particles 26. According to other embodiments of the present disclosure (not shown in figures), the hollow cavity 22 may also be filled with a colloidal solution 24, the colloidal solution including a colored fluid (e.g. black) and a plurality of charged single color particles with (such as white particles). The hollow cavity 22 is used as a container for electronic ink.

An electronic ink in the present disclosure is defined to include a plurality of charged color particles, the charged color particles are configured in a colloidal solution and may move through the colloidal solution under the influence of an electric field. The charged color particles include positively charged color particles and/or negatively charged color particles.

Figure 7C:
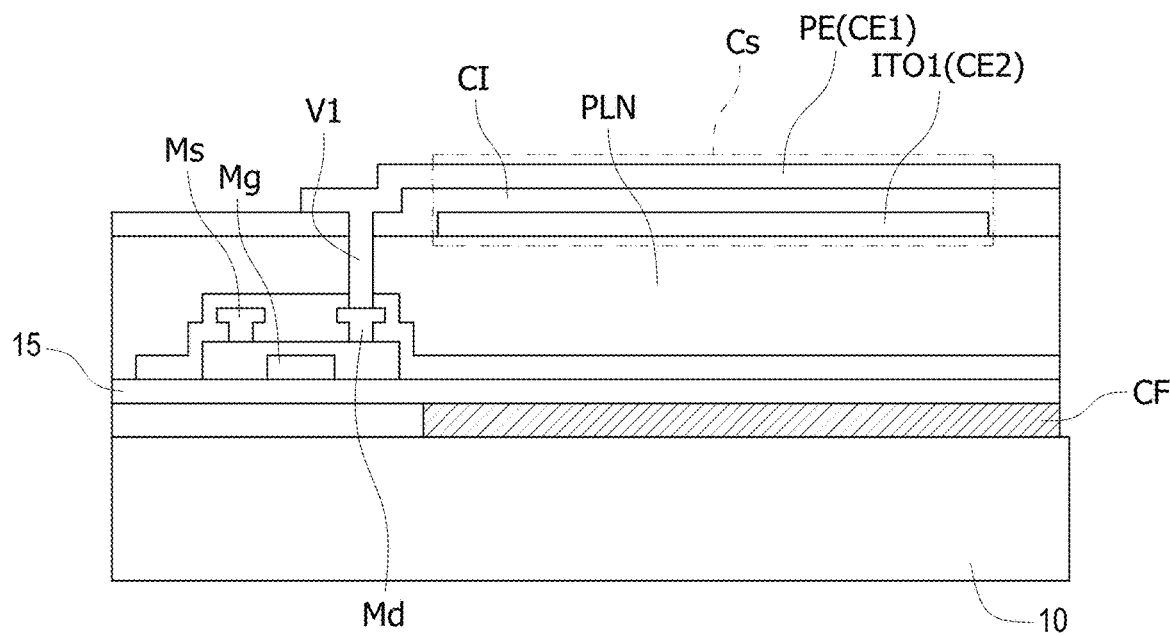
FIG. 7C is a partial cross-sectional diagram of FIG. 7B.

FIG. 7C is a partial cross-sectional diagram corresponding to the embodiment of FIG. 7B, mainly showing the control substrate 10, the color filter layer CF, the driving circuit layer 30 with a high aperture ratio, and part of the control electrode layer PEL. The driving circuit layer 30 with a high aperture ratio in FIG. 7C may adopt a structure similar to FIG. 5A, that is, the control electrode PE and the first transparent conductive layer ITO1 are both made above the flat layer PLN. The two electrode layers (the first electrode CE1 and the second electrode CE2) of the storage capacitor Cs are respectively provided by the control electrode PE and the first transparent conductive layer ITO1. Furthermore, the source metal Ms/the drain metal Md of the thin film transistor 32 is formed by the second metal layer M2, and the drain metal Md is connected to the control electrode PE through the via V1. As shown in FIG. 7C, since both electrode layers (the first electrode CE1 and the second electrode CE2) of the storage capacitor Cs are made of transparent conductive materials (e.g. ITO), light is not blocked, the aperture ratio of the driving circuit layer 30 with a high aperture ratio of the electrophoretic display may be increased. In addition, the insulation layer CI of the storage capacitor Cs may be reduced in thickness according to the design, so that the capacitance value of the storage capacitor Cs may be maximized without affecting the aperture ratio of the control substrate of the electrophoretic display 100. Furthermore, there may be a transparent protective layer 15 which is silicon nitride material, a silicon oxide material, or a composite lamination with both between the driving circuit layer 30 and the color filter layer CF.

In addition, when manufacturing the electrophoretic display 100 shown in FIG. 7B and FIG. 7C, the steps similar to the embodiment shown in FIG. 5A may be followed. But before the thin film transistor is formed on the upper surface of the control substrate 10, the color filter layer CF is formed first. The formation method of the color filter layer CF may vary depending on the colorant material, such as pigment or dye, and has different manufacturing processes. For pigments; printing, electrodeposition, or exposure and development or etching after coating, etc. may be used, for dyes, dyeing or exposure and development or etching may be used. As a result, the color filter layer CF including a plurality of colors is formed on the upper surface of the control substrate 10. Because the thicker the color filter layer is, the more the light loss is, and the less light may penetrate, in practice, the thickness of the color filter layer may be limited to equal to or less than 5 μm, that is, the thickness of the color filter block of the color filter layer may not be more than 5 μm. After making the color filter layer CF, the transparent protective layer 15 may be formed on the surface of the color filter layer CF, which is a silicon nitride material, silicon oxide material, or a composite lamination with both. Then, the upper surface of the control substrate 10 is processed by a deposition process or a sputtering process and a photolithography process to make the first metal layer M1. The first metal layer M1 is used to form the gate metal Mg and the gate line GL. Then, the insulation layer (such as $SiN_x$, $SiO_2$) and a-Si layer are deposited, and the semiconductor part AS of the thin film transistor is carved out by the photolithography process. Then, a metal film is made on the obtained structure by a deposition process or a sputtering process and the second metal layer M2 is made by a photolithography process. The second metal layer M2 is used to form the source metal Ms, the drain metal Md, and the data line DL. Then, the flat layer PLN and the via are made on the obtained structure. Then, a transparent conductive material film is made by a sputtering process, and the first transparent conductive layer ITO1 is made, from the transparent conductive material film, by a photolithography process to be used as the second electrode CE2 of the storage capacitor Cs. The capacitor insulating layer CI of the storage capacitor Cs is made by depositing insulating materials. The transparent conductive material film (ITO2) is made by the sputtering process. The control electrode layer PE of the control electrode layer PEL is made by the photolithography process to be used as the first electrode CE1 of the storage capacitor Cs. Then, the electrophoresis layer 20 may be bonded or made. The electrophoresis layer 20 includes the hollow cavity 22. The hollow cavity 22 is made by forming a resin film on a plastic substrate, using a roller to make indentations on the resin film to form the hollow cavity 22. The hollow cavity 22 is used as a container for electronic ink. Then the colloidal solution 24 containing the charged color particle 26 is injected into the hollow cavity 22. Then, the top of the colloidal solution 24 is sealed with glue to a sealed cavity to form the electrophoresis layer 20. For the detailed manufacturing process, please refer to Taiwan Patent Application No. 93100767, or the micro-partition structure of the present disclosure). Then, the parts on the opposite substrate 12 are made, and the common electrode layer 14 and the insulation layer may be formed on the opposite substrate 12. Finally, the side that has made the electrophoresis layer 20 of the control substrate 10 and the side of the opposite substrate 12 where the common electrode and the insulation layer have been made are bonded with the optical adhesives or are bonded by the frame glue with the help of the structure of the micro tenon (details are described below) of the present disclosure. Furthermore, when the viewing surface is not on the opposite substrate 12 side, the common electrode layer 14 disposed on the opposite substrate 12 is not necessary. The above deposition process (chemical vapor deposition, CVD, Plasma-Enhanced CVD, PECVD), sputter deposition, and coating are all mature manufacturing processes commonly used in display panels, which may make the electrophoretic display 100 of the present disclosure with high aperture ratio and high screen refresh speed.

However, in the above manufacturing process, if the material of the color filter layer CF may be affected by the temperature during the subsequent of the thin film transistor manufacturing process, the manufacturing process of the thin film transistor needs to be selected. For example, the thin film transistor may adopt a-Si TFT with a low-temperature manufacturing process (temperature below 200 degrees Celsius), or an organic thin film transistor (organic TFT) with a low-temperature manufacturing process (temperature below 100 degrees Celsius).

As shown in FIG. 7B and FIG. 7C, according to the electrophoretic display 100 of the present disclosure, the viewing surface is on the control substrate 10 side, and the color filter layer CF is moved above the control substrate 10. Furthermore, the combined thickness of the driving circuit layer 30 and the control electrode layer PEL is much less than the thickness of the opposite substrate 12 in FIG. 7A, so the distance between the light incident from the side of the control substrate 10 and the electrophoresis layer 20 may be reduced. Furthermore, as mentioned above, the charged color particles 26 (e.g. the charged black particle 26B and the charged white particle 26W) attracted by the driving circuit layer 30 with a high aperture ratio may reach the side of the electrophoresis layer 20 close to the control electrode layer PEL faster, thus further reducing the distance between the light incident from the side of the control substrate 10 and the charged color particles 26. As a result, color accuracy is increased, color saturation and contrast are increased, and brightness is increased of the electrophoretic display 100 with various advantages.

Figure 8A:
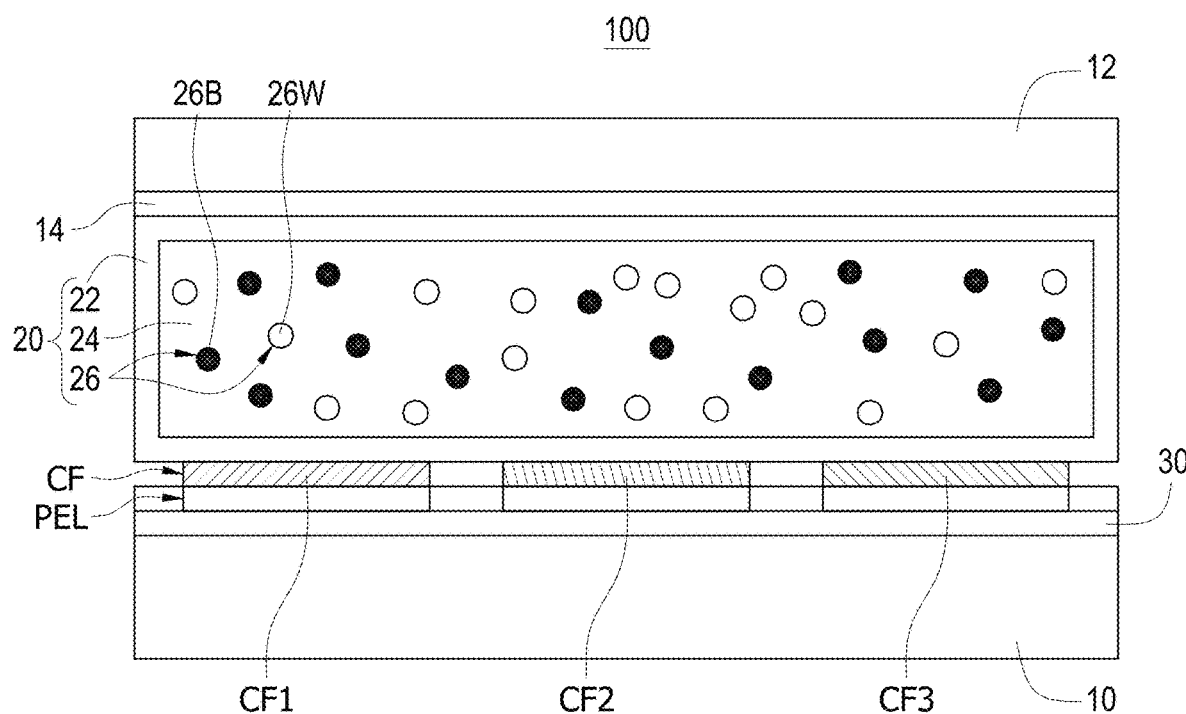
FIG. 8A is a cross-section diagram of the color electrophoretic display in accordance with an embodiment of the present disclosure.

FIG. 8A shows a cross-section diagram of the electrophoretic display 100 in accordance with another embodiment of the present disclosure. The structure shown in this figure is similar to the structure shown in FIG. 7B, that is, the color filter layer CF is also disposed on a position close to the control substrate 10. However, in the structure shown in FIG. 8A, the position of the color filter layer CF is moved above the control electrode layer PEL. In practice, the color filter layer CF may also be disposed between the driving circuit layer and the control electrode layer, the control electrode may be electrically connected to the source or the drain of the transistor through the via on the color filter layer. Therefore, the electrophoretic display 100 of this embodiment includes, from bottom to top, the control substrate 10, the driving circuit layer 30 with a high aperture ratio, the control electrode layer PEL, the color filter layer CF, the electrophoresis layer 20, the common electrode layer 14 (e.g. a transparent conductive electrode layer or an opaque metal conductive layer) and an opposite substrate 12. The control electrode layer PEL and the color filter layer CF may be swapped.

Figure 8B:
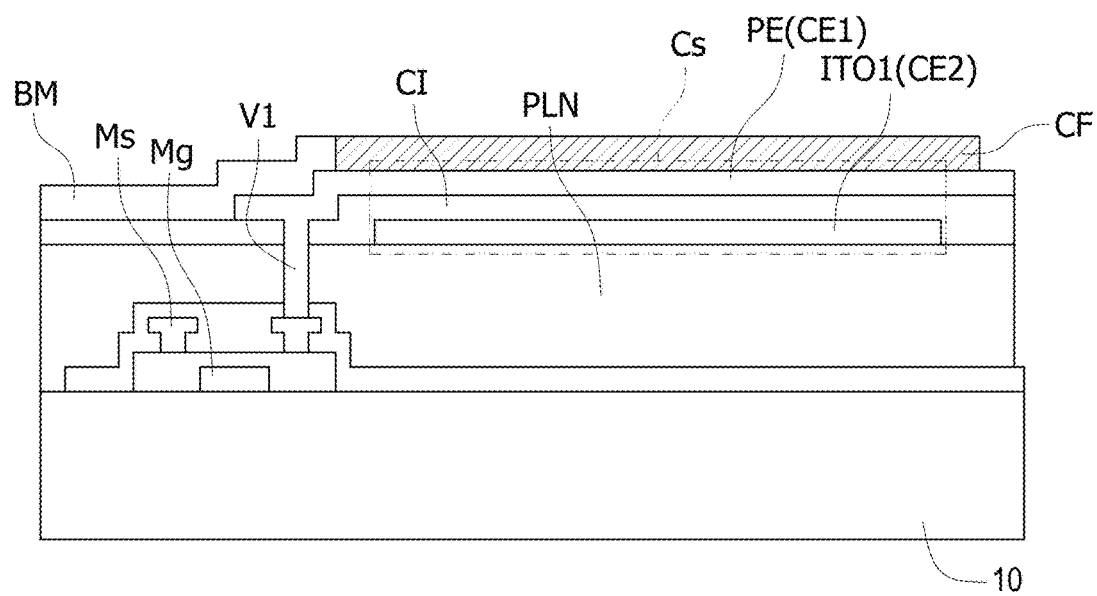
FIG. 8B is a partial cross-sectional diagram of FIG. 8A.

FIG. 8B is a partial cross-sectional diagram corresponding to the embodiment of FIG. 8A, and mainly shows the control substrate 10, the color filter layer CF, the driving circuit layer 30 with a high aperture ratio, and the control electrode layer PEL part. The driving circuit layer 30 with a high aperture ratio in FIG. 8B may adopt a structure similar to FIG. 5A, that is, the control electrode PE and the first transparent conductive layer ITO1 are both made above the flat layer PLN. The two electrode layers (the first electrode CE1 and the second electrode CE2) of the storage capacitor Cs are respectively provided by the control electrode PE and the first transparent conductive layer ITO1. Furthermore, the source metal Ms/the drain metal Md of the thin film transistor 32 is formed by the second metal layer M2, and is connected to the control electrode layer PEL through the via V1. As shown in FIG. 8B, since both electrode layers (the first capacitor conductive layer and the second capacitor conductive layer) of the storage capacitor Cs are made of transparent conductive materials (e.g. ITO), it may not block light. In addition, the insulation layer CI of the storage capacitor Cs may be reduced in thickness according to the design, so that the capacitance value of the storage capacitor Cs may be maximized without affecting the aperture ratio of the electrophoretic display 100.

In addition, when manufacturing the electrophoretic display 100 shown in FIG. 8A and FIG. 8B, steps similar to the embodiment shown in F FIG. 5A may be followed. However, after the thin film transistor 32 and the control electrode PE are formed on the upper surface of the control substrate 10, the color filter layer CF is formed on the thin film transistor 32 and the control electrode PE. The formation method of the color filter layer CF may vary depending on the colorant material, such as pigment or dye, and has different manufacturing processes. For pigments; printing, color photoresist exposure, and development or etching, etc. may be used, for dyes, dyeing or color photoresist exposure and development or etching, etc. may be used. As a result, the color filter layer CF including a plurality of colors is formed on the thin film transistor 32 and the control electrode PE. After making the color filter layer CF, the transparent protective layer made of acryl resin or epoxy resin or the transparent protective layer made of inorganic materials SiNx, SiO$_2$, etc. may be optionally formed on the surface of the color filter layer CF, or none of above is done.

Refer to FIG. 8A, then, the electrophoresis layer 20 is bonded or made on the color filter layer CF (or on the transparent protective layer). The electrophoresis layer 20 includes the hollow cavity 22. The hollow cavity 22 is made by forming a resin film on a plastic substrate, using a roller to make indentations on the resin film to form the hollow cavity 22. The hollow cavity 22 is used as a container for electronic ink. Then the colloidal solution 24 containing the charged color particle 26 is injected into the hollow cavity 22. Then, the top of the colloidal solution 24 is sealed with glue to a sealed cavity to form the electrophoresis layer 20. For the detailed manufacturing process, please refer to Taiwan Patent Application No. 93100767, or the micropartition structure of the present disclosure). Then, the parts on the opposite substrate 12 are made, and the common electrode layer 14 may be formed on the opposite substrate 12. Finally, the side that has made the electrophoresis layer 20 of the control substrate 10 and the side of the opposite substrate 12 where the common electrode is formed are bonded with the optical adhesives or are bonded by the frame glue with the help of the structure of the micro tenon (details are described below) of the present disclosure. When the viewing surface is not on the opposite substrate 12 side, the common electrode layer 14 may not be disposed on the opposite substrate 12. The above deposition process (chemical vapor deposition, CVD, Plasma-Enhanced CVD, PECVD), sputter deposition process, and coating process are all mature manufacturing processes commonly used in display panels, which may make the electrophoretic display 100 of the present disclosure with high aperture ratio and high screen refresh speed.

As shown in FIG. 8A and FIG. 8B, according to the electrophoretic display 100 of the present disclosure, the viewing surface is on the control substrate 10 side, and the color filter layer CF is disposed on the control substrate 10. Furthermore, the color filter layer CF is almost in contact with the electrophoresis layer 20, so the distance between the light incident from the side of the control substrate 10 and the electrophoresis layer 20 may be reduced after light passes through the color filter layer CF. As a result, the color accuracy, color saturation, contrast, and visual brightness of the electrophoretic display 100 are increased.

Since electronic ink has black charged particles and sufficient black saturation, it is unnecessary need to use a black matrix layer (BM) to increase the black saturation. As a result, the black matrix layer (BM) which is originally used for shielding the metal wire of the thin film transistor of the black border may be replaced with a white or transparent medium. After the color filter layer is exposed through the photomask of photoresist materials corresponding to various colors, the development process may clean out the unexposed areas, to leave the color photoresist in the exposed areas (negative photoresist). For example, the different photomasks may be used to retain the photoresist materials in different positions to form red, green, and blue photoresist materials. In addition, when making the color filter layer, the exposed color photoresist may also be washed away to retain the color photoresist in the unexposed area (positive photoresist). In other words, after a plurality of color photoresist exposure processes, the required color photoresist is laid at the designated position of the design. The color photoresist may be made into different required thicknesses by spin coating.

Figure 9A:
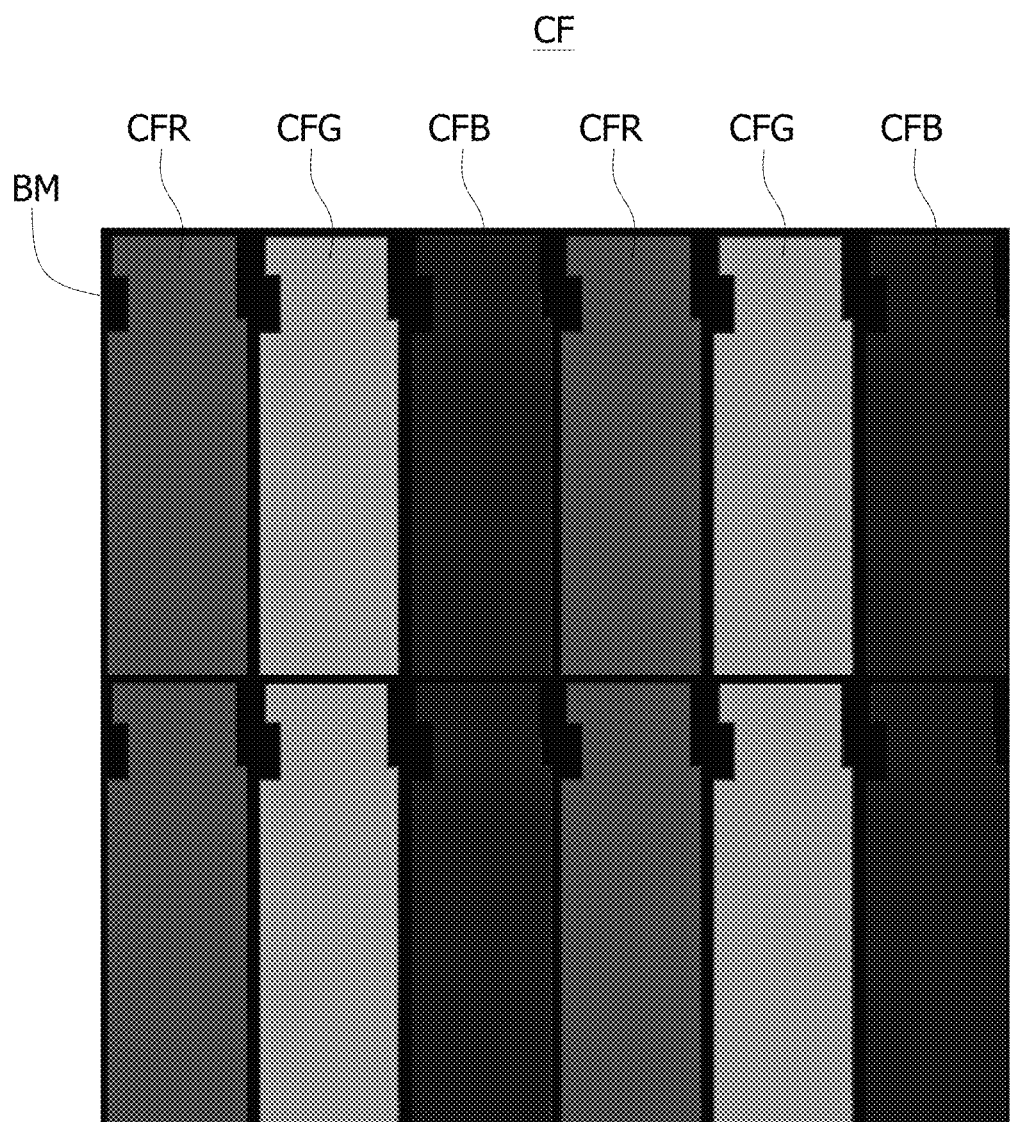
FIG. 9A is a schematic diagram of the color filter layer.
Figure 9B:
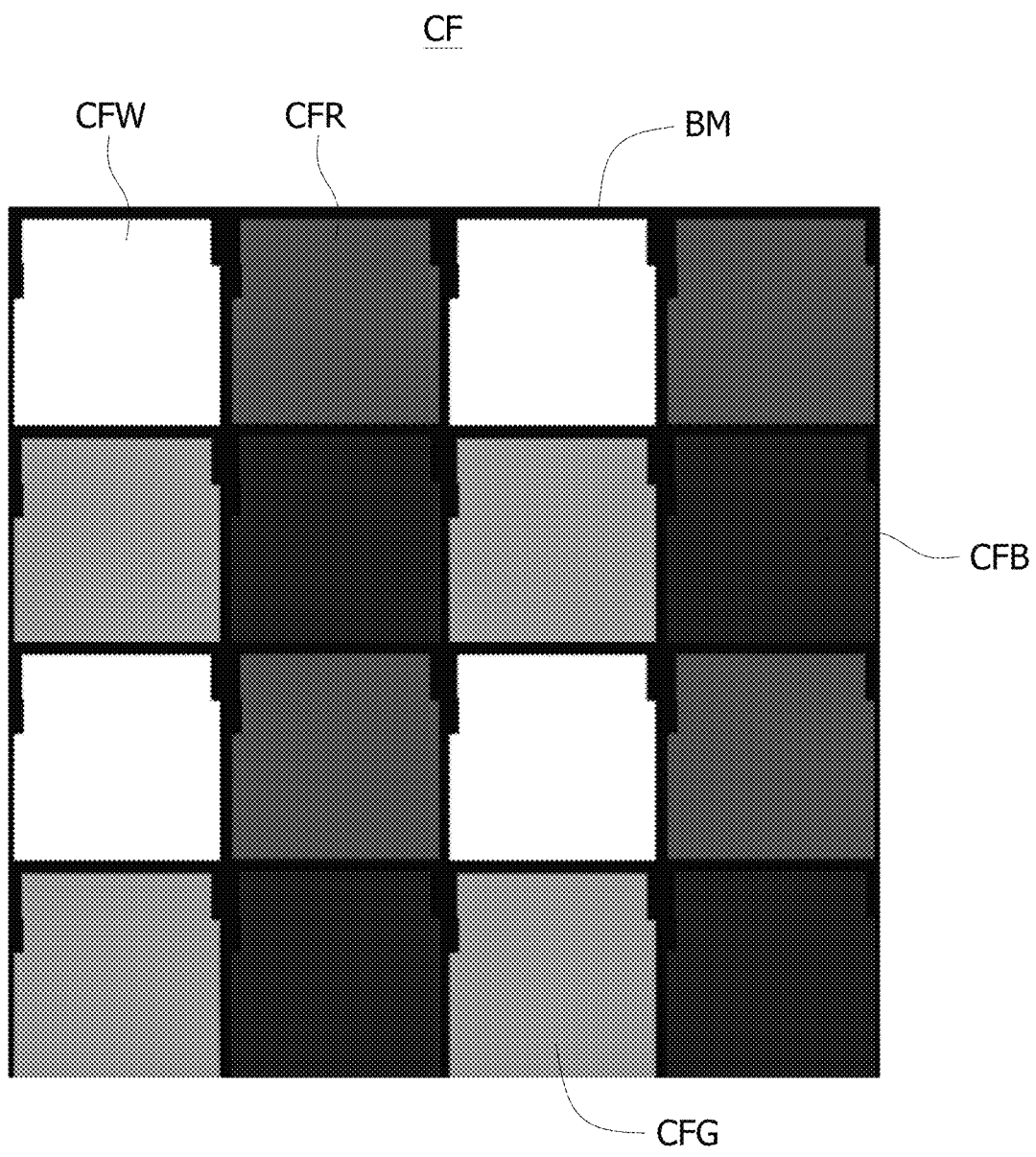
FIG. 9B is another schematic diagram of the color filter layer.

As shown in FIG. 9A, the color filter layer is usually divided into three areas in design (red, green, and blue, that is, the red color filter block CFR, the green color filter block CFG, and the blue color filter block CFB). As shown in FIG. 9B, the color filter layer may also be divided into four areas (red, green, blue, and white, that is, the red color filter block CFR, the green color filter block CFG, the blue color filter block CFB, and the white color filter block CFW) in design. The white part of the area does not need to be filled with photoresist to maintain transparency.

In the application of electronic paper display devices, the black matrix (BM) area, which is originally used for increasing black saturation, does not need to be black, because the black saturation of electronic paper is already sufficient. So, this area may be replaced with a black, white, or uncolored transparent medium. The color filter layer is divided into three blocks to fill in red, blue, and green, plus the black of the border (BM), a total of 4 colors. The color filter layer is divided into three blocks to fill in red, blue, and green, plus the white of the border (BM), a total of 4 colors. The color filter layer is divided into three blocks to fill in red, blue, and green, plus the transparency of the border (BM), a total of 3 colors.

the color filter layer may also be compensated by grayscale to improve the grayscale range of the color filter layer. The color may be made into 4 blocks, and each block may be filled with red, blue, green, transparency, and border color. The color filter layer is divided into four blocks to fill in red, blue, green, transparency plus the black of the border (BM), a total of 4 colors. The color filter layer is divided into four blocks to fill in red, blue, green, transparency plus the white of the border (BM), a total of 4 colors. The color filter layer is divided into four blocks to fill in red, blue, green, and transparency plus the transparency of the border (BM), a total of 3 colors. Transparency is achieved by leaving the area blank without adding any color photoresist.

Furthermore, as shown in FIGS. 7B-7C and FIGS. 8A-8B, in the electrophoretic display 100 with the color filter layer disposed in close to the control substrate 10, the electrophoresis layer 20 may have the micro-partition structure shown in FIGS. 11A-11C, FIGS. 12A-12C, FIGS. 13A-13C and FIGS. 14A-14E of the present disclosure or may be implemented in a similar manner. Moreover, the electrophoretic display 100 may also have the micro tenon 60 corresponding to FIGS. 14C-14E, FIGS. 16A-16D or may be implemented in a similar manner. Those skilled in the art should be able to appropriately modify the micro-partition and the micro tenon disclosed in the above embodiments and apply them to the electrophoretic display 100 with the color filter layer disposed in close to the control substrate 10 in FIGS. 7B-7C and FIGS. 8A-8B. In addition, as shown in FIGS. 7B-7C and FIGS. 8A-8B, in the electrophoretic display 100 with the color filter layer disposed in close to the control substrate 10, the color filter layer may have a structure as shown in the present disclosure in FIG. 18A, that is, the color filter layer may have a structure as shown in the present disclosure in FIG. 18A, that is, the color filter layer CF includes a plurality of color filter blocks (CFR, CFG, CFB) with different colors. The color filter block includes a plurality of holes H and at least one hole H includes an area of not more than 100 μm². In addition, as shown in FIGS. 7B-7C and FIGS. 8A-8B, the electrophoretic display 100 with the color filter layer disposed in close to the control substrate 10 may also be applied to, for example, the structure as shown in FIG. 19. The common voltage lines Ve are electrically connected to a display driver 200 or a display touch integrated driver 200. During the touch operation of the electrophoretic display 100, the display touch integrated driver 200 electrically connects a plurality of data lines DL together as a single touch-transmitting electrode. The display touch integrated driver 200 electrically connects a plurality of common voltage lines Ve together as a single touch-receiving electrode. Alternatively, the touch-transmitting electrode above-mentioned and the touch-receiving electrode may be interchanged with each other.

4. Design of the Micro-Partition

In the related-art, the electronic paper used in making electronic paper displays is made by adopting the technology of microcapsule and the micro cup. The production cost of electronic paper remains high due to the yield rate. When making electrophoretic displays later, the protective film must be removed from the electronic paper and then the electronic paper be bonded to the control substrate. Foreign matter and bubbles on the contact surface during bonding may cause significant losses in yield. Since the structure of electronic paper is very fragile, it is easily broken and damaged during the manufacturing process of peeling off the protective film, which also causes heavy losses during the manufacturing process. One of the purposes of the present disclosure is to save the production cost of electronic paper, there is no bonding process and there is no bonding yield loss, and the electronic paper may be made directly into the display. Currently, the most commonly used electronic paper adopts the micro cup structure, and most of the production methods adopt the roll-to-roll method. During production, a roller in a convex shape is used to make indentations on the resin film to create the micro cup structure. The micro cup structure is used as a container for electronic ink, and the resin film is soft and may easily break under pressure. Therefore, electronic paper products need to be well protected, causing major difficulties in the manufacturing process. Secondly, the thickness of the micro cup (the extension distance perpendicular to the viewing surface) is about 25~50 μm, so the precision of production is very high. In terms of roller die production, the thinner the thickness of the micro cup, the easier the base resin to crack and be peeled off and bonded to the roller, causing damage to the roller and poorer production yield. The thicker the micro cup is, the more electronic ink is consumed. Due to the viscosity and surface tension of the resin solution, a gap is formed at the bottom of the micro cup when filling the resin solution, which may not be completely filled. The displays thus made may also be scrapped due to poor display, which keeps the cost of electronic paper high. Furthermore, the thicker the thickness of the micro cup may also increase the distance between the control electrode and the common electrode, which may slow down the movement speed of the charged color particle and increase the distance it moves. As a result, the charged color particles require higher driving voltage and longer time to be positioned, which may affect the refresh speed and display quality of the screen. The user experience may be poor when used in an electronic paper reader. Disadvantages based on the above may be solved by the present disclosure.

Figure 10A:
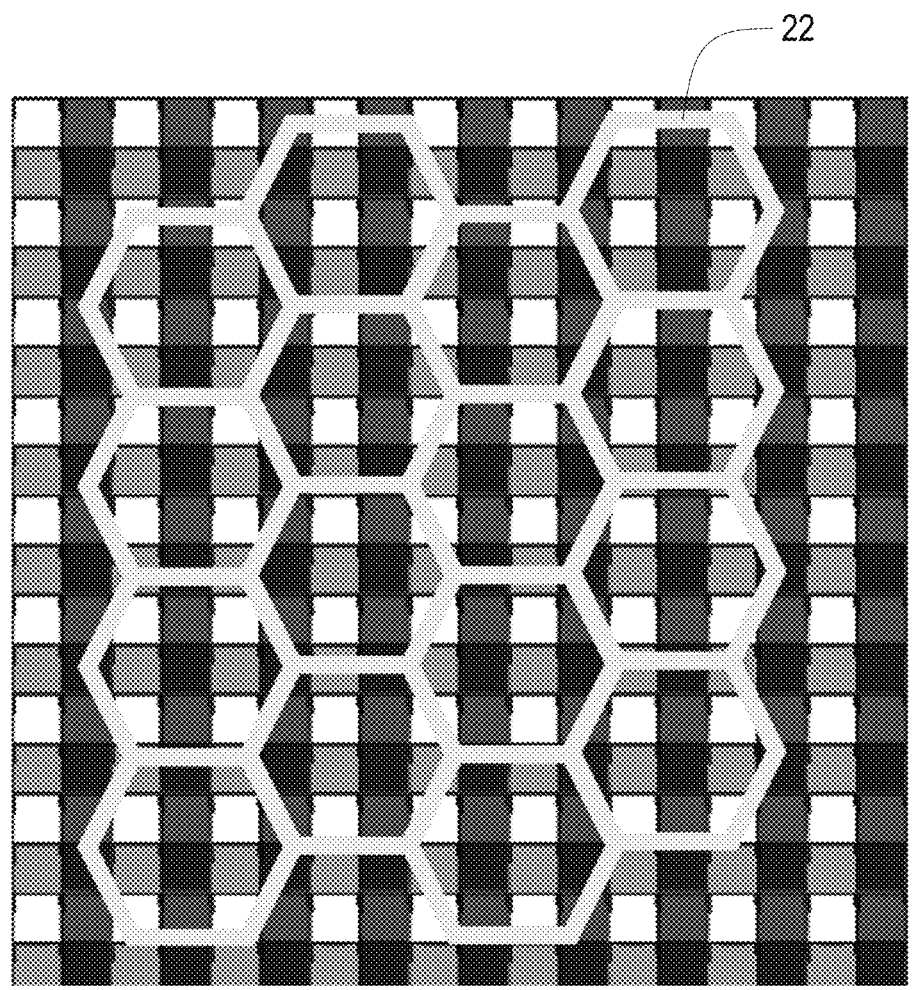
FIG. 10A is a top-view diagram of the micro-partition of the micro cup of the electrophoretic display and the related color filter layer in accordance with the related-art.

Refer to FIG. 10A which is a top-view diagram of the micro-partition of the micro cup of the electrophoretic display and the related color filter layer in accordance with the related-art. The partition wall thickness (refer to FIG. 11A, the partition wall thickness of the present disclosure is marked as T, and the partition wall thickness of the micro cup 22 in FIG. 10A is also the thickness extending along the parallel direction of the drawing) of the micro cup needs to be more than 10 μm to have sufficient support. Moreover, the micro cup 22 of the related-art electrophoretic display is viewed from an upper projection angle and mostly adopts a hexagonal compartment structure to increase the structural strength, the charged color particle may not arrive within the scope of the micro cup wall. The above may be regarded as the key factors affecting the aperture ratio of the display, there is no charged color particle 26 within the micro cup wall of the related-art electrophoretic display. When the micro-partition of the micro cup shown in FIG. 10A is bonded to the control substrate (e.g. the control substrate 10 as shown in FIG. 1A), the electrodes on the control substrate are covered, causing the display color to be partially obscured, forming background textures that affect imaging quality, and causing color distortion due to the uneven shielding position of the micro cup wall on the color filter layer.

Figure 10B:
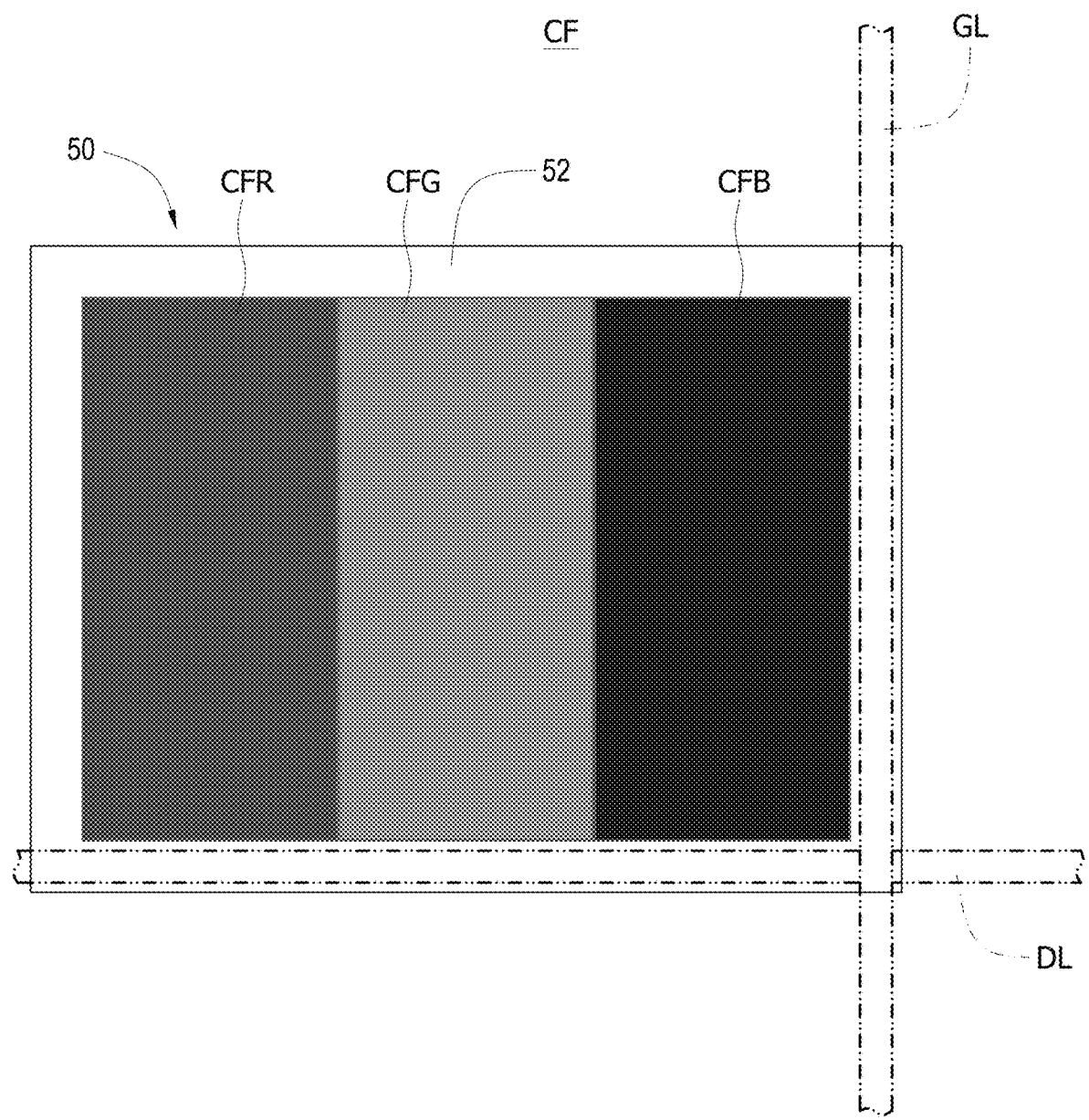
FIG. 10B is a top-view diagram of the micro-partition in accordance with an embodiment of the present disclosure.

Refer to FIG. 10B, according to one embodiment of the present disclosure, the micro-partition is made on the substrate, which may accurately align the pixel electrode (the control electrode PE) so that the partition wall 52 of the micro-partition structure 50 is formed on the non-display region between pixels. For the plurality of partition walls, as viewed along the projection direction on the viewing surface, the overlapping area of the partition wall and the control electrode may be as small as possible, at least less than 50% of the area of the control electrode. In other words, according to the design of the present disclosure, the micro-partition structure 50 and the partition wall 52 may be made into a rectangular structure close to the pixels and may fit the boundaries of the pixels without affecting the display. According to the present disclosure, for example, the photomask may be used for developing the pattern of the photoresist film to make the micro partition wall surfaces. The photoresist film may use materials with higher hardness (i.e. transparent photoresist made of acrylic). Furthermore, according to other embodiments of the present disclosure, the partition wall 52 of the micro-partition structure 50 may also be made of polymer materials (e.g. the flat layer material, resin, or acrylic material). Furthermore, as shown in FIG. 10B, the partition wall 52 of the micro-partition structure 50 may be partially aligned with the gate line GL or the data line DL. In more detail, a plurality of partition walls 52 overlap with part of the data line DL and/or part of the gate line GL when viewed from the vertical projection direction (e.g. perpendicular to the viewing surface direction).

Figure 10C:
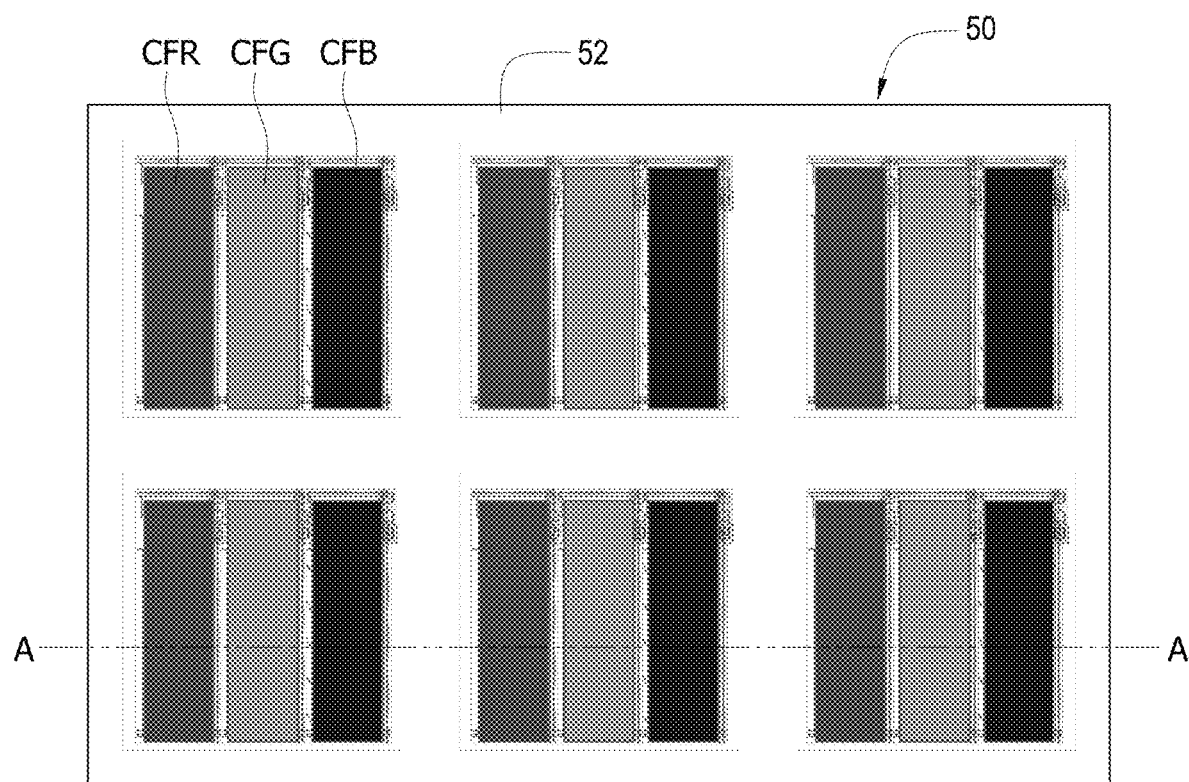
FIG. 10C is another top-view diagram of the micro-partition in accordance with an embodiment of the present disclosure.

Since the present disclosure uses hard polymer materials (e.g. transparent photoresist material) as the partition wall 52 of the micro-partition structure 50, the polymer materials hardness may reach pencil hardness equal to or more than 3 H, much higher than the resin material used in the container of the micro cup of the related-art (hardness less than 1 H). Therefore, the present disclosure may use the micro-partition with thinner wall thickness to support the weight and pressure of the upper and lower substrates, and the wall thickness T (refer to FIG. 11A) of the micro-partition may be less than 10 μm. Refer to FIG. 10C, since the partition wall 52 of the micro-partition structure 50 of the present disclosure may be accurately positioned on the non-display region of the pixel (between pixels), it will not affect the display quality. Its high-precision characteristics may bring a good yield and reduce production costs. The greater advantage is that the expense and cost of using the related-art micro cup to make electronic paper is eliminated, the cost of the optical adhesives and the loss of yield caused during bonding is saved by skipping the bonding of the substrate, and a thinner electrophoretic display may be made. In addition, the micro-partition structure 50 may also be made by using the flat layer (PLN) material and using etching to peel off the area other than the wall surface to complete the micro-partition. A thinner electrophoretic display may be made, and the electrophoresis layer 20 with less than 25 μm thickness may be easily made by the micro-partition structure 50 made through the present disclosure. Namely, the micro-partition wall height H1 (refer to FIG. 11A) may be less than 25 μm. When the thickness of the electrophoresis layer of the electrophoretic display made by the micro-partition structure 50 of the present disclosure is thinner, the distance between the control electrode and the common electrode may be closer, the electric field magnitude may be greater, so that the electrophoresis layer may work at a lower driving voltage, the charged color particle may also move faster and the distance it needs to move is shorter to greatly improve the refresh speed of the screen. As a result, the refresh speed problem that plagues the electrophoretic display may be solved. This problem is especially important in colored electrophoretic displays.

Figure 10D:
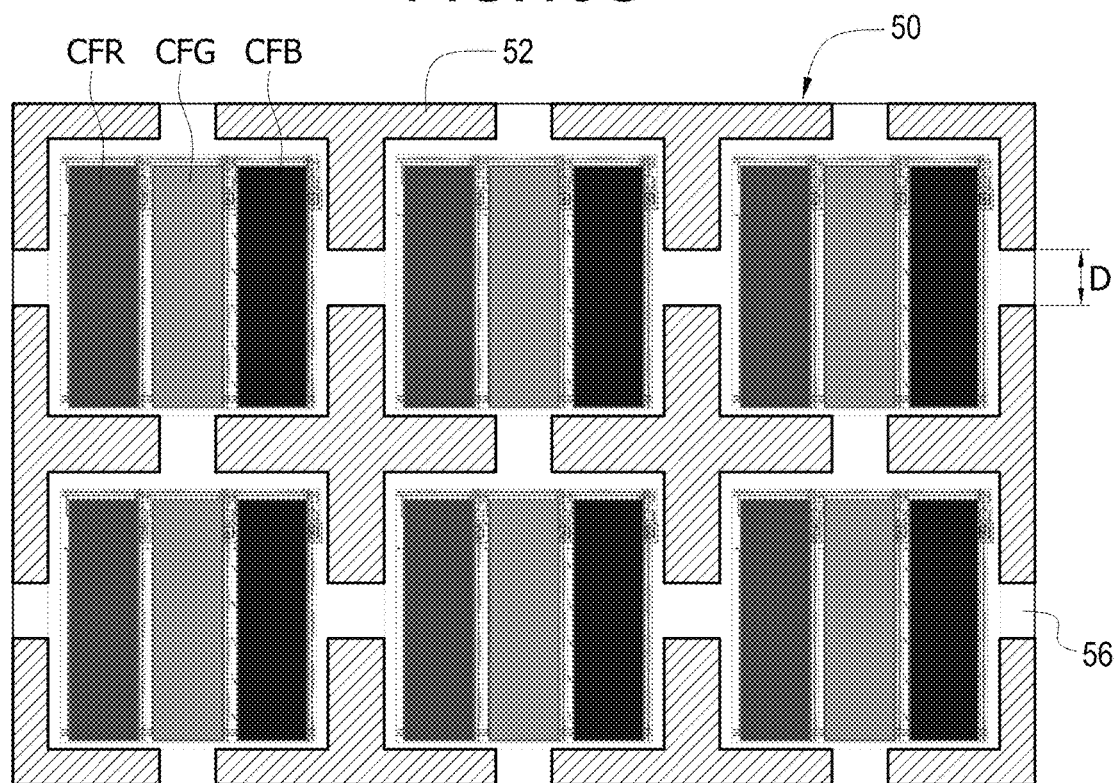
FIG. 10D is a top-view diagram of the micro-partition in accordance with another embodiment of the present disclosure.

Refer to FIG. 10D which is a top-view diagram of the micro-partition in accordance with another embodiment of the present disclosure. According to this embodiment, the partition wall 52 (represented with a slashed figure to highlight its shape) of the micro-partition structure 50 adopts materials with higher hardness. If the partition wall 52 is applied to a bendable flexible electrophoretic display, the substrate used to make the micro-partition is a flexible substrate, the substrate may easily break and be damaged due to bending. In order to solve this problem, the micro-partition structure 50 and the partition wall 52 may be made into discontinuous shapes. Refer to the cross-shaped partition wall 52 in FIG. 10D. The crevice 56 on the partition wall 52 may be used as a stretch and compress space when the substrate is bent causing the partition wall 52 to be squeezed. According to an embodiment of the present disclosure, the area of the crevice 56 is not more than 50% of the area of the partition wall 52, or the length D of the crevice 56 is not more than 50% of the length of the partition wall 52. According to an embodiment of the present disclosure, the length D of the crevice 56 may be more than 0.5 μm to provide a stretch and compress space for the partition wall 52 when it is squeezed. According to an embodiment of the present disclosure, the chamber formed by the cross-shaped partition wall 52 may accommodate one pixel, for example, one pixel including color filter blocks (CFR, CFG, CFB) with different colors. In addition, although the partition wall 52 shown in FIG. 10D is cross-shaped from a top view to provide the chamber when the adjacent partition wall 52 has the crevice, the partition wall 52 of the present disclosure may also be in other shapes from a top view, such as a T-shape or a U-shape, as long as there is a crevice 56 between at least part of the adjacent partition wall 52. In addition, although in the embodiment shown in FIG. 10D, the crevice 56 on the partition wall 52 is evenly distributed, it should be noted that in actual production, the crevice 56 may have different lengths due to manufacturing process errors. In addition, the crevice 56 needs not connect to the partition wall 52 in the thickness direction, as long as it may provide a stretch and compress space for the partition wall 52 when it is squeezed.

Figure 11A:
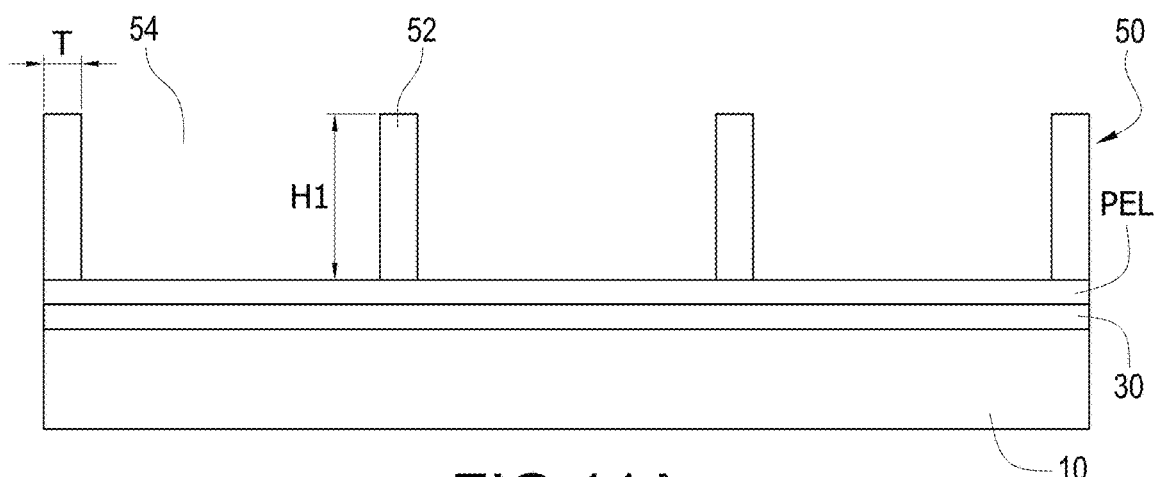
FIG. 11A to FIG. 11C are flowcharts of the production of the micro-partition structure in accordance with an embodiment of the present disclosure.
Figure 11B:
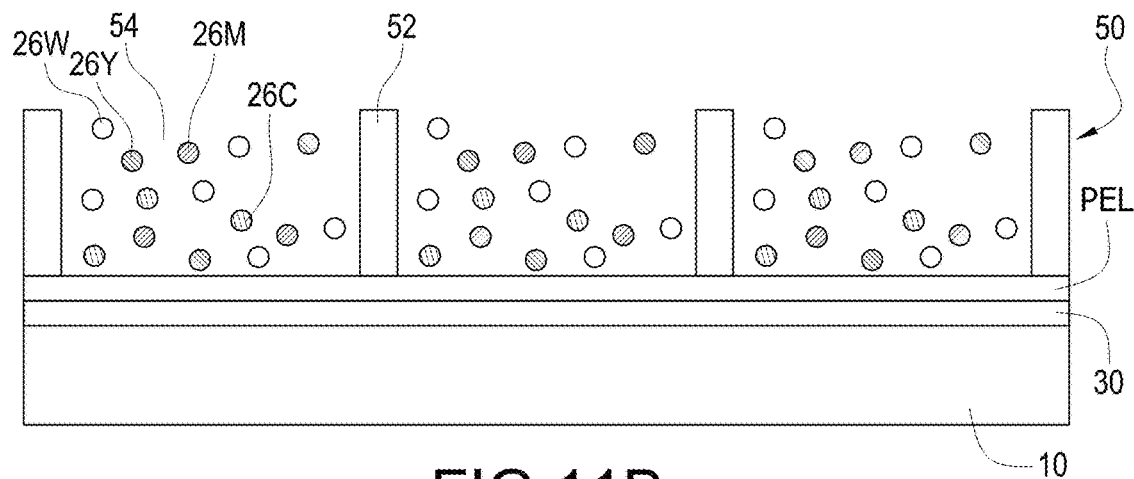
Figure 11C:
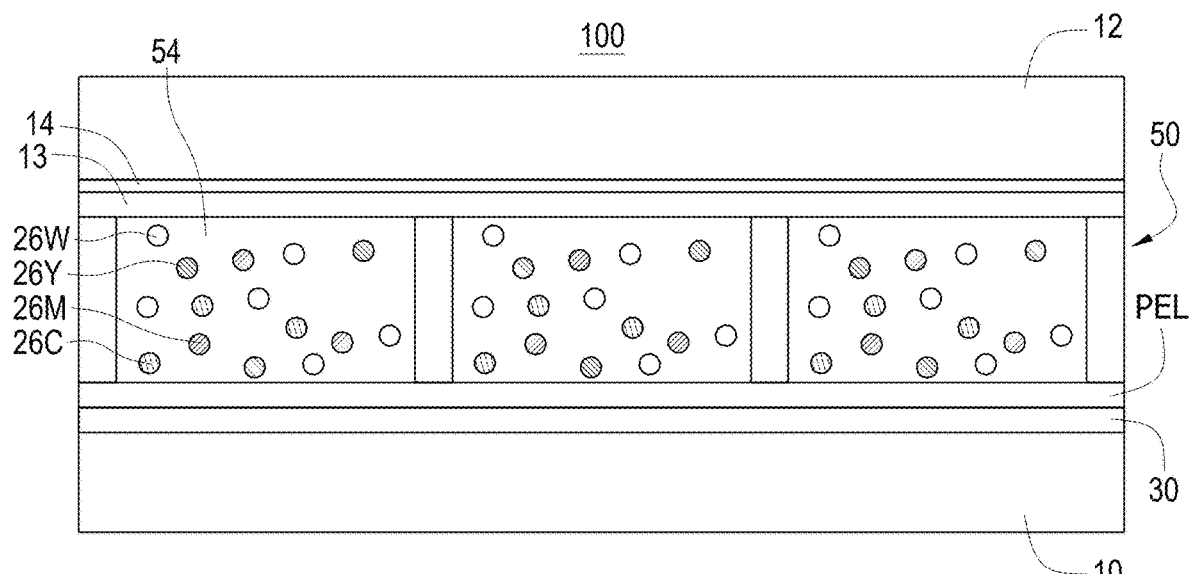
Figure 17A:
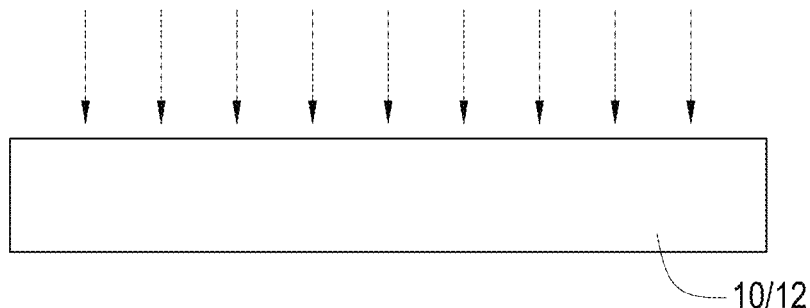
FIG. 17A to FIG. 17F illustrate flowcharts of the production of the partition wall of the micro-partition.
Figure 17B:
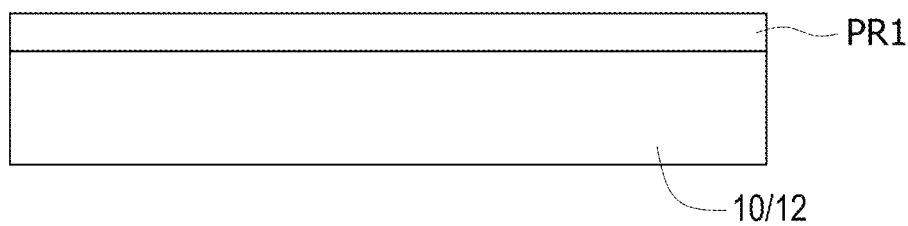
Figure 17C:
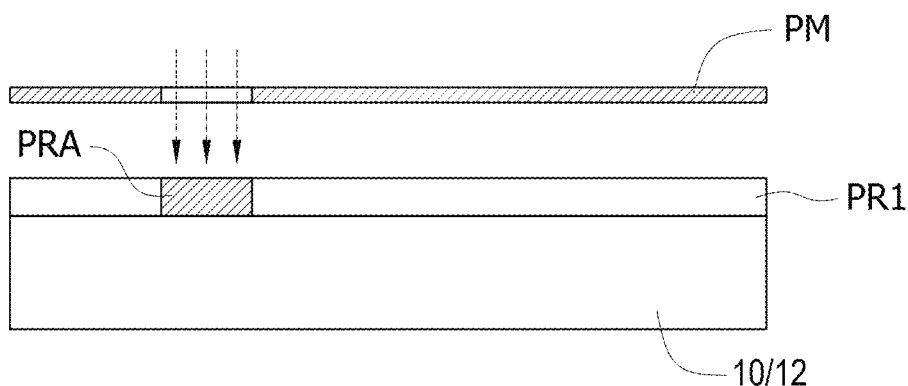
Figure 17D:
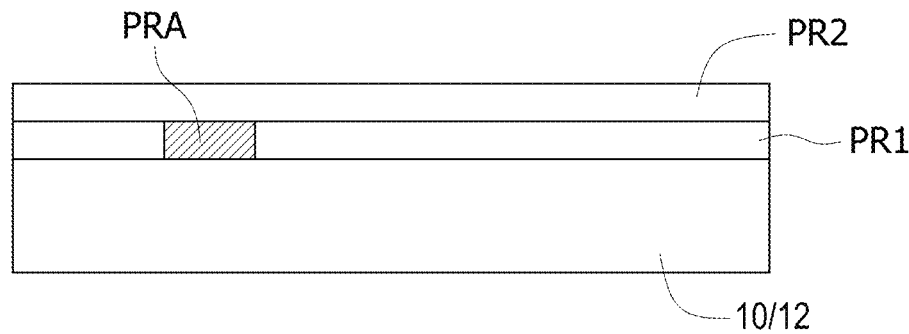
Figure 17E:
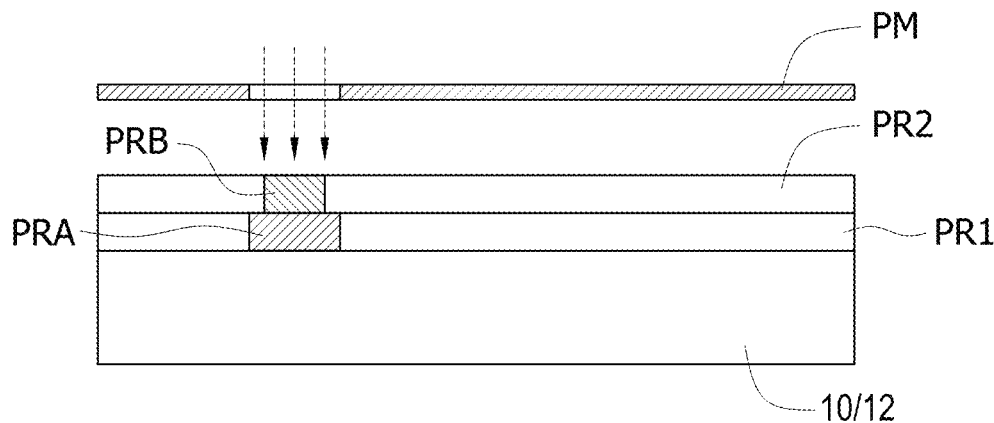
Figure 17F:
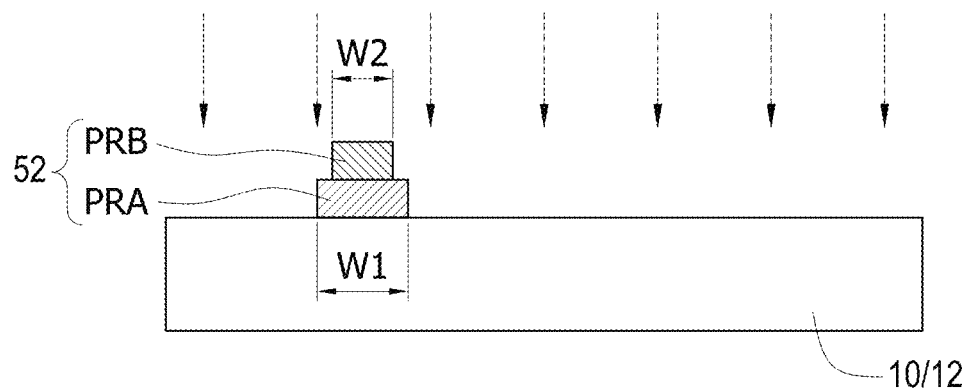

Refer to FIG. 11A to FIG. 11C which are flowcharts of the production of the micro-partition structure in accordance with an embodiment of the present disclosure. These schematic diagrams respectively show a cross-sectional diagram along line A-A of the structure of FIG. 10C in different manufacturing processes. In this embodiment, the micro-partition structure 50 is made on the driving circuit layer 30 (i.e. on the control substrate 10 side). Refer to FIG. 11A, first, the driving circuit layer 30, the transparent control electrode layer PEL, and the insulating protective layer are made on the control substrate 10. Then, transparent photoresist and exposure and development processes are used to make the micro-partition structure 50 and the partition wall 52. Since, during the development process, the developable depth is affected by the intensity of light and the number of irradiations, which has a causal relationship; in practice, the thickness of the developable photoresist is usually less than 5 μm due to production cost and yield considerations. When the thickness of the electrophoresis layer is too thin, the number of the accommodated color particles is limited, which may affect the number of layers of color particles stacked. When the number of layers of color particles stacked is insufficient, the reflectivity may be affected, causing insufficient reflected light and a decrease in visible brightness. Therefore, the thickness of the electrophoresis layer usually should be not less than 5 μm (the height H1 (refer to FIG. 11A) of the micro-partition wall may be not less than 5 μm). Refer to FIG. 17A to FIG. 17F, which illustrates the step of the manufacturing process of making the partition wall 52 on the substrate side (e.g. the control substrate 10 side or the opposite substrate 12 side) in accordance with the embodiment of the present disclosure. According to the present disclosure, the partition wall 52 may be made directly on one surface of the substrate by using a transparent photoresist and exposure and development process. In addition, other structures may also exist on the surface of the substrate, such as the transparent control electrode layer PEL, the insulation layer, the protective layer, the driving circuit layer 30, the color filter layer CF, or the common electrode layer 14. Furthermore, the partition wall 52 is made directly on these structures by using transparent photoresist and exposure and development process. Furthermore, the flat layer PLN may also be added to other structures (e.g. the transparent control electrode layer PEL, the driving circuit layer 30, and the color filter layer CF) on the substrate, and then the partition wall 52 may be made by using transparent photoresist and exposure and development process. Therefore, although FIG. 17A to FIG. 17F schematically shows that the initial structure is the substrate 10/12, here is not limited to whether there are other structures thereon. As shown in FIG. 17A, first, the process cleans a substrate 10/12. The substrate may be the control substrate 10 or the opposite substrate 12, and there may be other structures on the surface to be cleaned. Then, refer to FIG. 17B, the process coats a first layer photoresist PR1, such as a transparent photoresist material, on the substrate 10/12. Then, refer to FIG. 17C, the process exposes the location where the partition wall 52 is to be formed by a photomask PM to carve out the first residual photoresist PRA (i.e. the first polymer material stack). According to an embodiment of the present disclosure, the first layer photoresist PR1 is a negative photoresist material, that is, the illuminated part may remain after development. According to another embodiment of the present disclosure, the first layer photoresist PR1 is a positive photoresist material, and the photomask PM needs to be designed accordingly. Then, refer to FIG. 17D, the process coats a second layer photoresist PR2, such as a transparent photoresist material, on the substrate 10/12. Then, refer to FIG. 17E, the process performs exposing, that is repeating exposing, the location where the partition wall 52 is to be formed by a photomask PM again to carve out the second residual photoresist PRB (i.e. the first polymer material stack). The residual range of the second layer photoresist may be less than the residual range of the photoresist of the previous layer, to form an upward-decreasing shape. Finally, refer to FIG. 17F, the process develops the obtained structure to leave the first residual photoresist PRA and the second residual photoresist PRB. The obtained structure (the first polymer material stack stacked on the second polymer material stack) by stacking is the partition wall 52 of the present disclosure. Through the above manufacturing process, by a repeated coating of photoresist, exposing, and final developing, the developer removes the unnecessary parts (hollowed areas), leaving a sufficiently high micro-partition wall. The process may either repeat more than one photoresist coating, exposing and developing, or repeat more than two photoresist coating, exposing, and two developing. The area of each exposure may be reduced to allow the partition wall to be thinner, and the diameter of the partition wall may be reduced to less than 5 μm (W1-W2) for each layer. Refer to FIG. 11B, after making the partition wall 52, under vacuum environmental conditions, the process fills in the colloidal solution in the chamber 54 defined by the partition wall 52 and this may avoid filling failure caused by air remaining in the micro-partition structure. The filling-in method may be first using a masking plate (not shown in figures) to cover the non-display region, and then spraying the heated colloidal solution into the display region by spray equipment. Since there may be alignment errors in each layer of exposure, in order to improve the yield of subsequent filling of the colloidal solution, according to an embodiment of the present disclosure, the design may adopt the wall thickness decreases as the stack grows. As a result, the problem that the wall surface becomes uneven and the contact area becomes smaller when filling the colloidal solution may be avoided. Furthermore, the problem that unfilled gaps are created when filling in the colloidal solution, causing more defective products, may be avoided. In practice, the exposed line width of the coated photoresist (i.e. the first polymer material stack) of the first layer may be the largest and then decrease with each layer. For example, the width (the width of the section) decreasing gradient of each layer of polymer material stack made as the partition wall is less than 5 μm. The shape of the wall of the micro-partition which is made is thicker at the bottom and thinner at the top (namely tapered shape with a width-decreasing top). As shown in FIG. 17F, the width difference (amount of reduction) between the width W2 of the second polymer material stack and the width W1 of the first polymer material stack is less than 5 μm.

In the embodiment, the manufacturing process of the partition wall 52 of FIG. 17A to FIG. 17F may be performed after the transparent control electrode layer PEL is made, or the manufacturing process of the partition wall 52 of FIG. 17A to FIG. 17F may be performed after the flat layer PLN is made on the transparent control electrode layer PEL. The material of the above flat layer PLN may be organic insulating material, inorganic insulating material, or a combination thereof. According to one embodiment, the organic insulating material may be polyimide (PI), polyamic acid (PAA), polyamide (PA), polyvinyl alcohol (PVA), polyvinyl cinnamate (PVCi), poly methyl methacrylate, or other suitable photoresist materials or combinations thereof. In addition, the inorganic insulating material may be silicon oxide, silicon nitride, silicon oxynitride, siloxane, or a combination thereof.

Refer to FIG. 11A, in the present disclosure, for convenience of explanation, the thickness of the micro-partition structure 50 is defined as the height H1 of the partition wall 52, and the thickness of the partition wall 52 is T. According to the present disclosure, the thickness (i.e. the partition wall height H1) of the micro-partition structure 50 is more than 5 μm and less than 25 μm, and the partition wall thickness T is equal to or less than 10 μm. In addition, refer to FIG. 11A and FIG. 17F, the average width of the cross-section of the partition wall 52 of the micro-partition structure 50 is not more than 10 μm. Refer to FIG. 11B, after making the partition wall 52, the process fills in the colloidal solution within the chamber 54 defined by the partition wall 52. The colloidal solution includes the charged black particles and/or the charged white particles; or the colloidal solution includes charged color particles, for example, as shown in FIG. 11B, the charged cyan particles 26C, the charged magenta particles 26M, the charged yellow particles 26Y, and the charged white particles 26W. Then refer to FIG. 11C, the process performs the manufacturing process of bonding the opposite substrate, that is, the process provides the opposite substrate 12 with a conductive film (e.g. the common electrode layer 14) or the opposite substrate 12 (when the viewing surface is not on the opposite substrate 12 side) without the common electrode layer 14, and uses the optical adhesives 13 between the opposite substrate 12 and the partition wall 52 or applies frame glue on the four borders of the display area and then bonds them. Then, the process puts the two substrates into the gas pressure chamber to be heated and pressurized. Then, the process squeezes the colloidal solution into and fills the gaps within the micro-partition structure 50. Finally, the process solidifies the optical adhesives or frame glue to complete the finished product of the electrophoretic display 100. As shown in FIG. 11C, the overlapping area of the partition wall 52 with any control electrode PE is less than 50% of the area of the control electrode (the electrodes in the control electrode layer PEL).

Figure 12A:
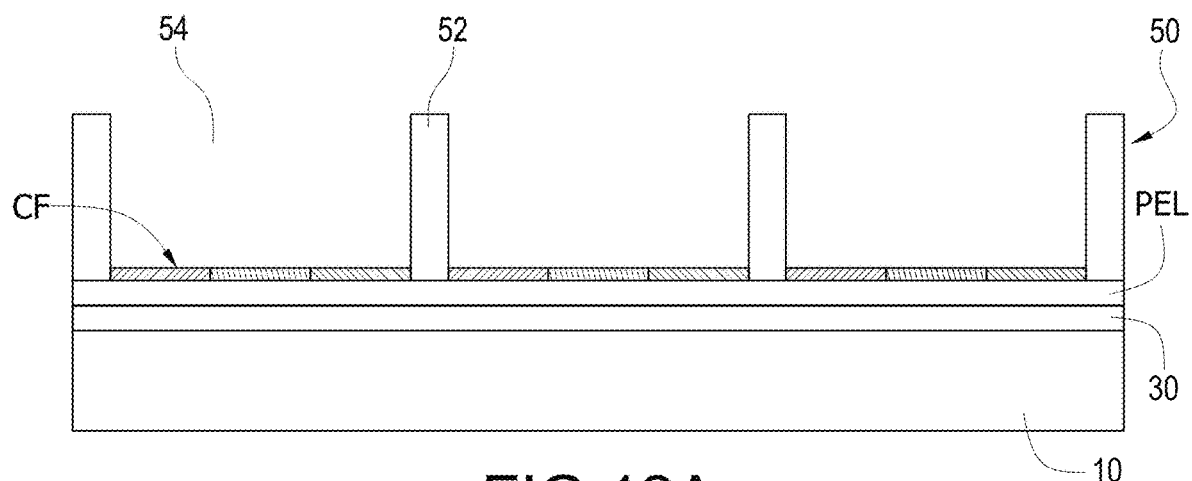
FIG. 12A to FIG. 12C are flowcharts of the production of the micro-partition structure in accordance with another embodiment of the present disclosure.
Figure 12B:
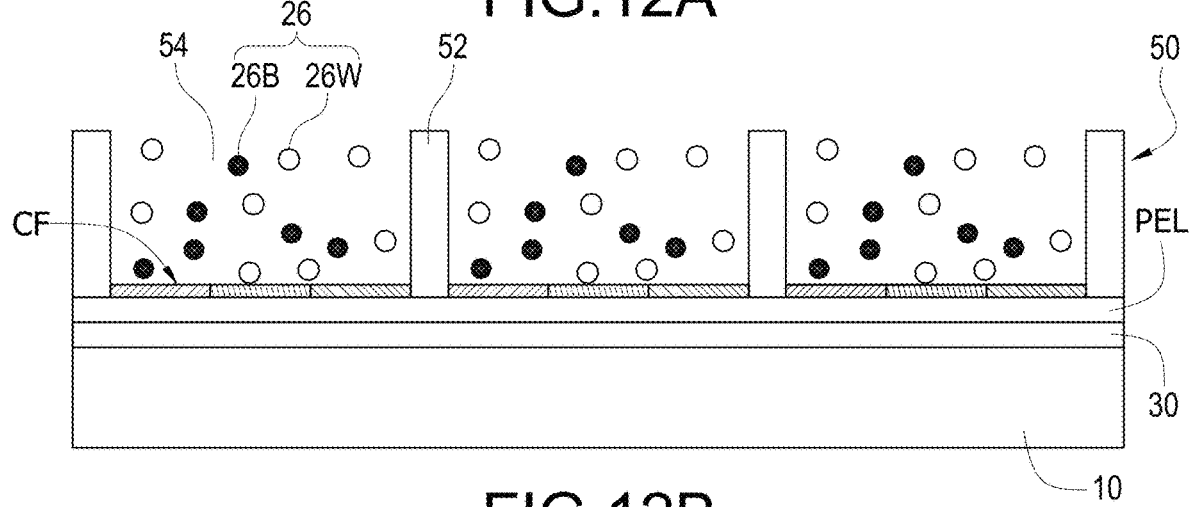
Figure 12C:
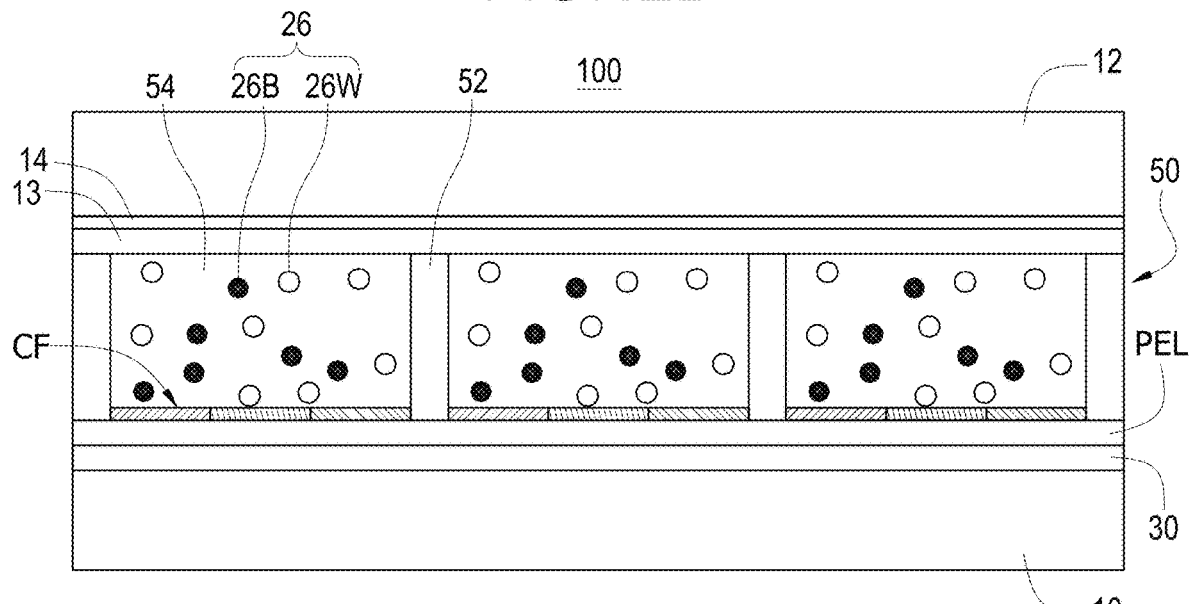

Refer to FIG. 12A to FIG. 12C which are flowcharts of the production of the micro-partition structure in accordance with another embodiment of the present disclosure. In this embodiment, the micro-partition structure 50 is made after the driving circuit layer 30, and the electrophoretic display 100 is a color electrophoretic display 100. As shown in FIG. 12A, first, the process makes the driving circuit layer 30, the transparent control electrode layer PEL, and the insulating protective layer (not shown in figures) on the control substrate 10. Then the process makes the color filter layer CF. In the embodiment, the manufacturing process of the partition wall 52 of FIG. 17A to FIG. 17F may be performed after the color filter layer CF is made, or the manufacturing process of the partition wall 52 of FIG. 17A to FIG. 17F may be performed after the flat layer PLN is made on the color filter layer CF. The material of the above flat layer PLN may be organic insulating material, inorganic insulating material, or a combination thereof. After completing the partition wall 52, refer to FIG. 12B, the process fills in the colloidal solution within the chamber 54 defined by the partition wall 52 under vacuum conditions. The colloidal solution includes the charged black particle 26B and the charged white particle 26W. Then refer to FIG. 12C, the process performs the manufacturing process of bonding the opposite substrate, that is, the process provides the opposite substrate 12 with a conductive film (e.g. the common electrode layer 14) or the opposite substrate 12 (when the viewing surface is not on the opposite substrate 12 side) without the common electrode layer 14, and uses the optical adhesives 13 between the opposite substrate 12 and the partition wall 52 or applies frame glue on the four borders of the display area and then bonds them. Then, the process puts the two substrates into the gas pressure chamber to be heated and pressurized. Then, the process squeezes the colloidal solution into and fills the gaps within the micro-partition structure. Finally, the process solidifies the optical adhesives or frame glue to make the finished products of the electrophoretic display 100.

Figure 13A:
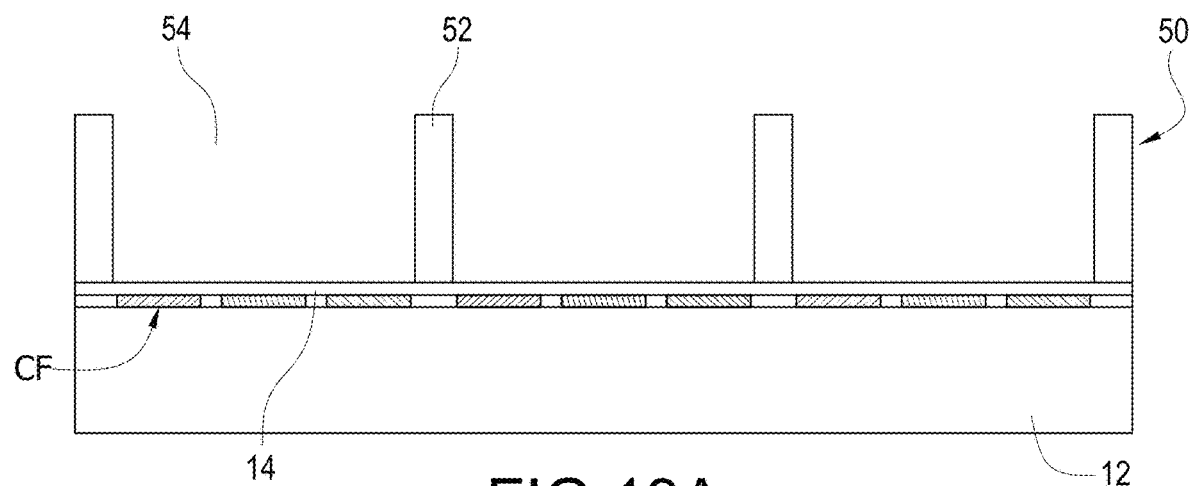
FIG. 13A to FIG. 13C are flowcharts of the production of micro-partition structure in accordance with another embodiment of the present disclosure.
Figure 13B:
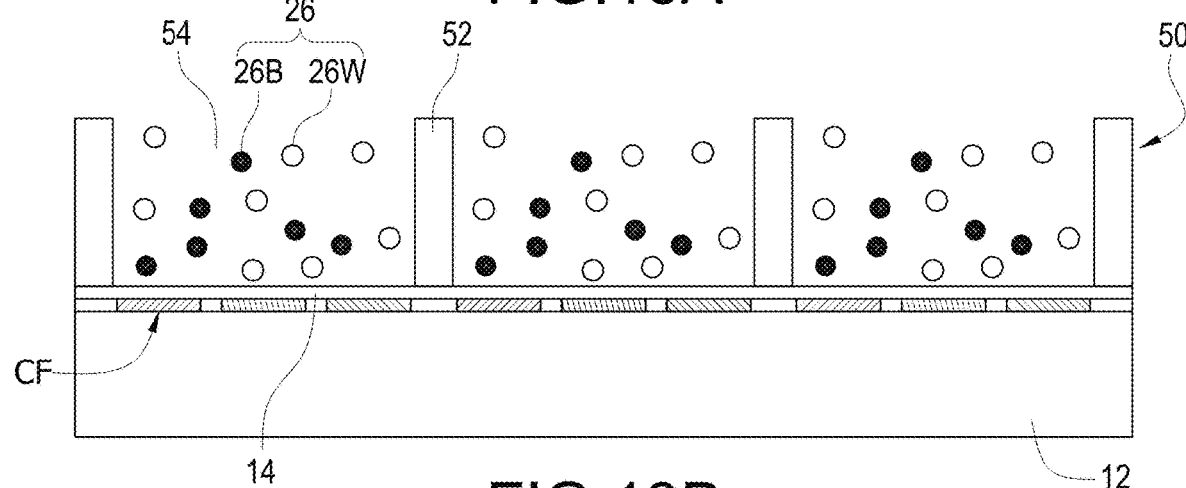
Figure 13C:
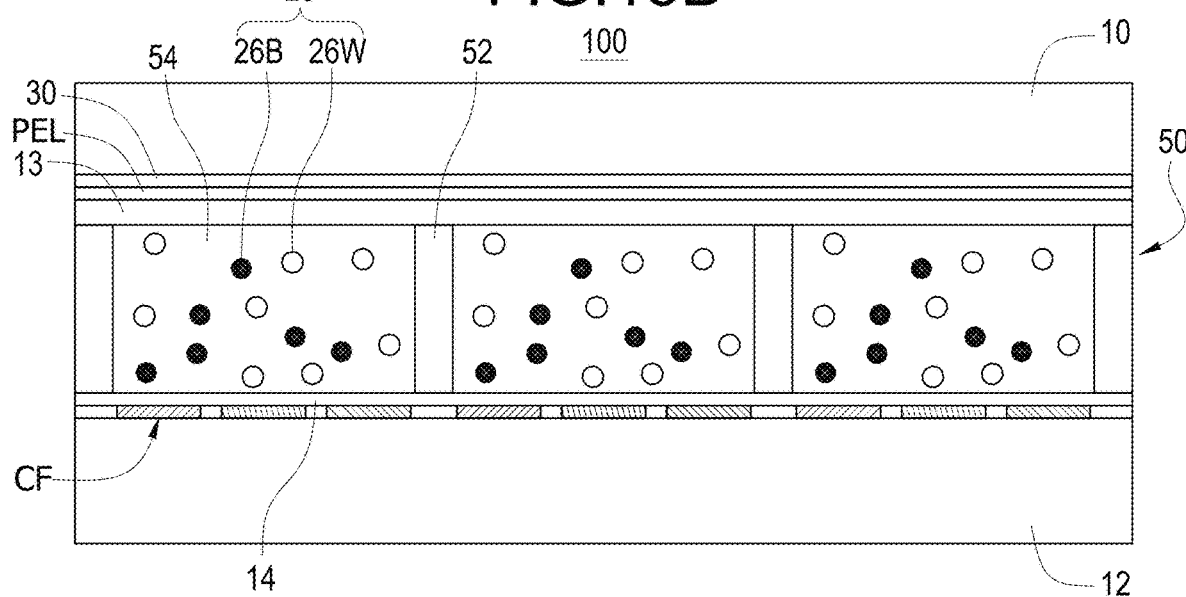

FIG. 13A to FIG. 13C are flowcharts of the production of micro-partition structure in accordance with another embodiment of the present disclosure. In this embodiment, the micro-partition structure 50 is made on the color filter layer CF. As shown in FIG. 13A, first, the process makes the color filter layer CF on the opposite substrate 12 and then makes the common electrode layer 14 on the color filter layer CF. The production steps of these two layers may be reversed, and the common electrode layer 14 may be done first and then the color filter layer. Then, the process uses the transparent photoresist and exposure and development process on the common electrode layer 14 or the color filter layer to make the partition wall 52 of the micro-partition structure 50.

In the embodiment, the manufacturing process of the partition wall 52 of FIG. 17A to FIG. 17F may be performed on the color filter layer CF or the common electrode layer 14, or the manufacturing process of the partition wall 52 of FIG. 17A to FIG. 17F may be performed after the flat layer PLN is made on the color filter layer CF or the common electrode layer 14. The material of the above flat layer PLN may be organic insulating material, inorganic insulating material, or a combination thereof.

Refer to FIG. 13B, after making the partition wall 52, the process fills in the colloidal solution within the chamber 54 defined by the partition wall 52 under vacuum conditions. The colloidal solution includes the charged black particle 26B and the charged white particle 26W. Then, refer to FIG. 13C, the process performs the manufacturing process of bonding the substrate, that is, the process provides a control substrate 10 with the control electrode layer PEL and the driving circuit layer 30, and uses the optical adhesives 13 or applies frame glue on the four borders of the display area and then bonds the control substrate 10 with the opposite substrate 12 which has made the micro-partition. Then, the process puts the two substrates into the gas pressure chamber to be heated and pressurized. Then, the process squeezes the colloidal solution into and fills the gaps within the micro-partition structure. Finally, the process solidifies the optical adhesives or frame glue to make the finished products of the electrophoretic display 100. In this embodiment, since the driving circuit layer 30 is not located close to the viewing surface, wider design possibilities are possible, and not required to adopt the driving circuit layer 30 with a high aperture ratio of the present disclosure. Furthermore, because this embodiment adopts a transparent photoresist (i.e. photoresist made of acrylic) to make the partition wall 52 of the micro-partition structure 50, the height H1 of the partition wall 52 may be less than 25 μm. In other words, the distance between the driving circuit layer 30 and the common electrode layer 14 may be less than 25 μm, which may greatly increase the electric field applied to the electronic ink, increase the screen refresh speed, and achieve many other advantages. In addition, under vacuum conditions, the filling rate of the colloidal solution within the chamber 54 defined by the partition wall 52 may be equal to or more than 70%. In conjunction with the micro tenon of the present disclosure, the colloidal solution with a comparable volume of the micro tenon may be further squeezed into the chamber. The filling rate of the colloidal solution within the chamber 54 may reach equal to or more than 90%.

Figure 14A:
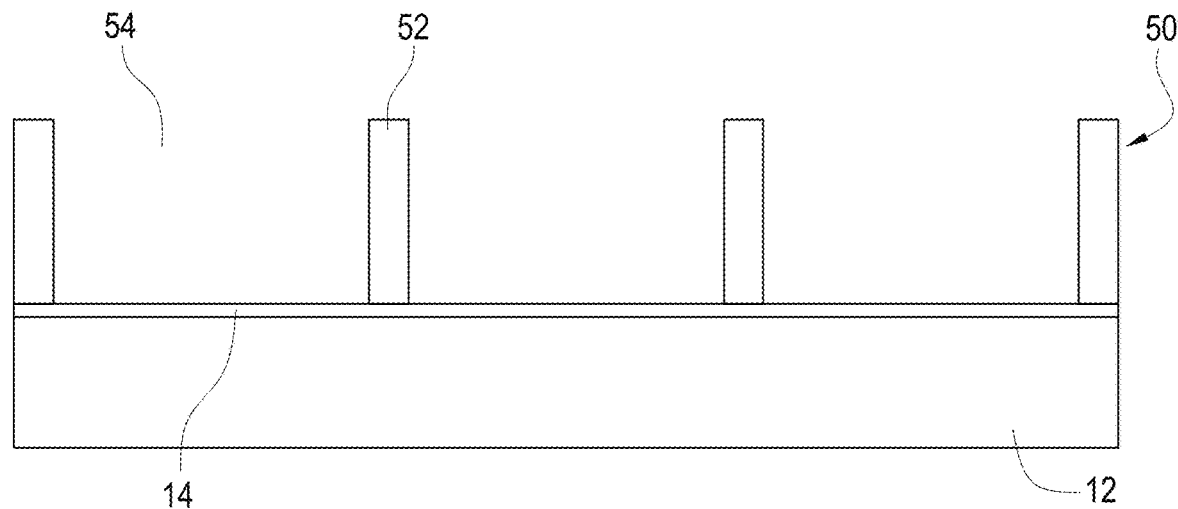
FIG. 14A to FIG. 14C are flowcharts of the production of the micro-partition structure in accordance with another embodiment of the present disclosure.
Figure 14B:
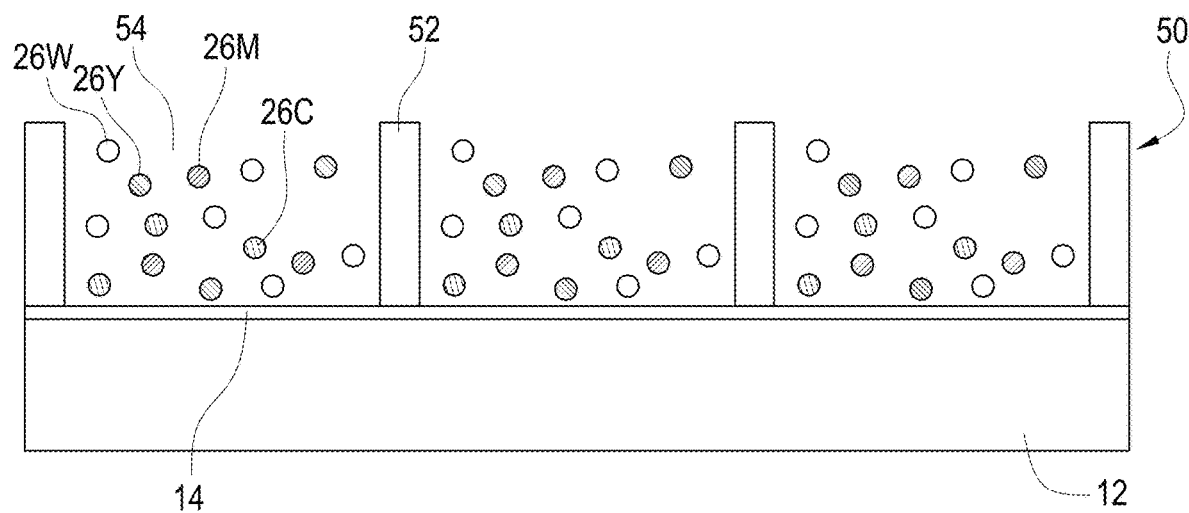
Figure 14C:
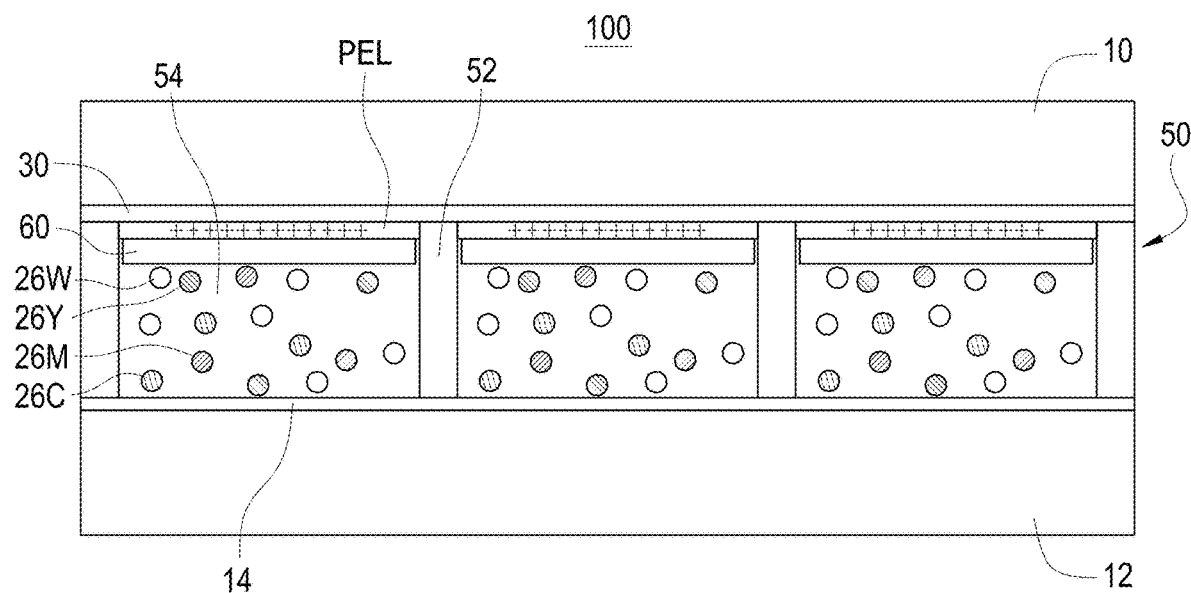

Refer to FIG. 14A to FIG. 14C which are flowcharts of the production of the micro-partition structure in accordance with another embodiment of the present disclosure. As shown in FIG. 14A, first, the common electrode layer 14 and the optional insulation layer are formed on the opposite substrate 12, and then the manufacturing process of the partition wall 52 of FIG. 17A to FIG. 17F is performed on the common electrode layer 14. The insulation layer may be made on the common electrode layer 14 by using a deposition method using a silicon nitride material, a silicon oxide material, or a composite stack of both.

In the embodiment, the manufacturing process of the partition wall 52 of FIG. 17A to FIG. 17F may be performed on the common electrode layer 14, or the manufacturing process of the partition wall 52 of FIG. 17A to FIG. 17F may be performed after the flat layer PLN is made on the common electrode layer 14. The material of the above flat layer PLN may be organic insulating material, inorganic insulating material, or a combination thereof.

Refer to FIG. 14B, the process fills in the colloidal solution within the sunken space 54 defined by the partition wall 52 when the partition wall 52 of the micro-partition structure 50 is under vacuum working conditions. The colloidal solution includes the charged cyan particle 26C, the charged magenta particle 26M, the charged yellow particle 26Y and, the charged white particle 26W. Refer to FIG. 14C, the process makes a control substrate 10 having the micro tenon 60, and fixes the control substrate 10 onto the opposite substrate 12 by registering this micro tenon 60 with the chamber 54 defined by the partition wall 52. As a result, the two substrates are tightly combined and may further fill the entire chamber 54 with the colloidal solution. More specifically, first, the process grows the driving circuit layer 30 on the control substrate 10, such as the driving circuit layer 30 with a high aperture ratio in the present disclosure. Then, the process forms the control electrode layer PEL, and forms the micro tenon 60 on the control electrode layer PEL. Furthermore, details of the micro tenon 60 are described below.

5. The Micro Tenon

During the manufacturing process of electronic paper, filling the electronic ink into the micro cup or encapsulating it in microcapsules is the part that has the greatest impact on yield in the entire manufacturing process, and is also the part with the highest investment in production equipment. Since electronic ink is made by mixing the colloidal solution with the charged color particles, in order to achieve the ability of particle suspension, the density and viscosity of the colloidal solution need to be increased. In the manufacturing process of filling in the micro cup or the micro-partition in the colloidal solution, due to the large surface tension and viscosity of the colloidal solution, the colloidal solution may not easily fill the entire micro cup or the micro-partition, which may cause gaps at the bottom. This gap may cause image quality degradation, which is a key factor in the poor yield of electronic paper production. This problem may be solved by using the micro tenon of the present disclosure. The colloidal solution may be further squeezed into the micro-partition and packed into the micro-partition internal space by using the micro tenon to stuck into the micro-partition, the gap problem may be solved by adjusting the thickness of the micro tenon to determine the compressed volume which may greatly contribute to improving production yield. In addition, the micro tenon that is stuck into the micro-partition may also prevent air from entering, so after filling the colloidal solution in a vacuum environment, the process uses frame glue to the bond area around the panel to replace the optical adhesives. The process presses the two substrates with the micro-partition and the micro tenon together evenly and tightly by using atmospheric pressure. Even if there is air leakage due to defects in the frame glue, the air may be blocked by the micro tenon and the micro-partition, which may not affect the pressing force of the substrate. Without the thickness of the optical adhesives may reduce the distance between the charged color particle and the control electrode, increase the screen refresh speed, and reduce the driving voltage. All kinds of benefits are built on the ingenious design of the micro tenon.

Figure 14D:
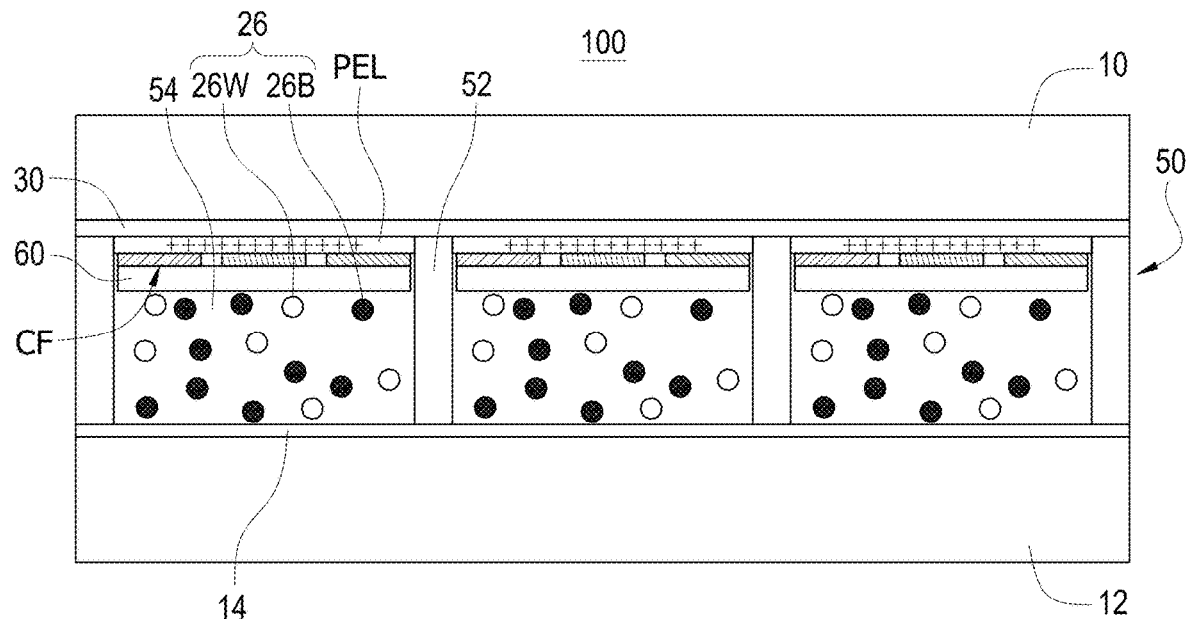
FIG. 14D is a cross-section diagram of the micro-partition structure in accordance with another embodiment of the present disclosure.
Figure 14E:
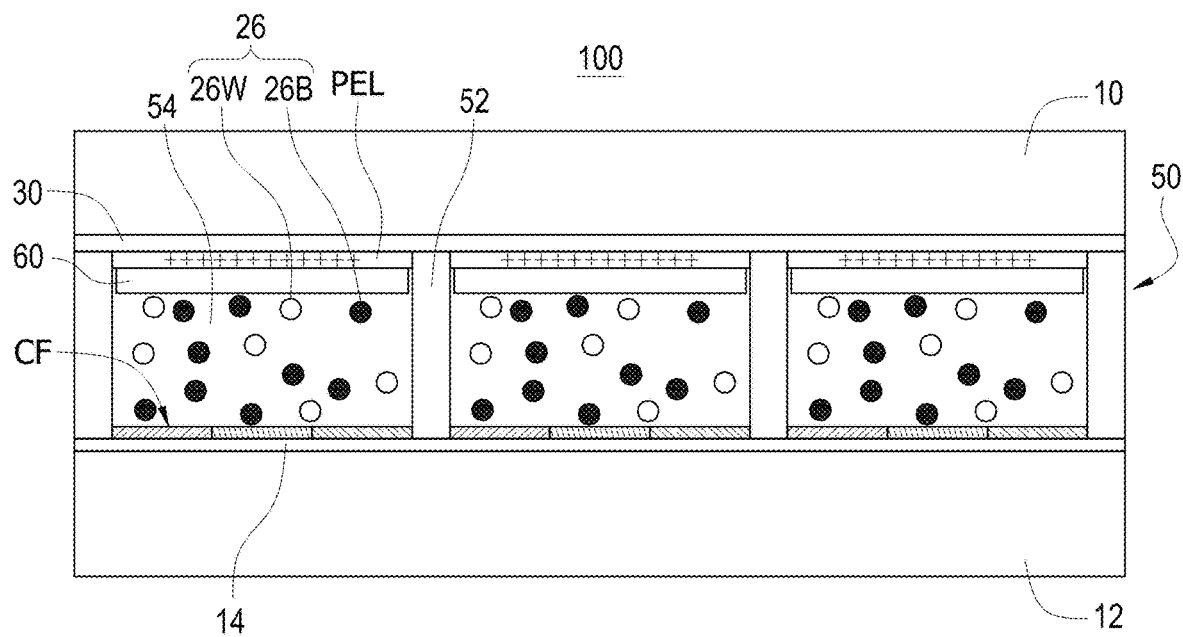
FIG. 14E is a cross-section diagram of the micro-partition structure in accordance with another embodiment of the present disclosure.
Figure 14F:
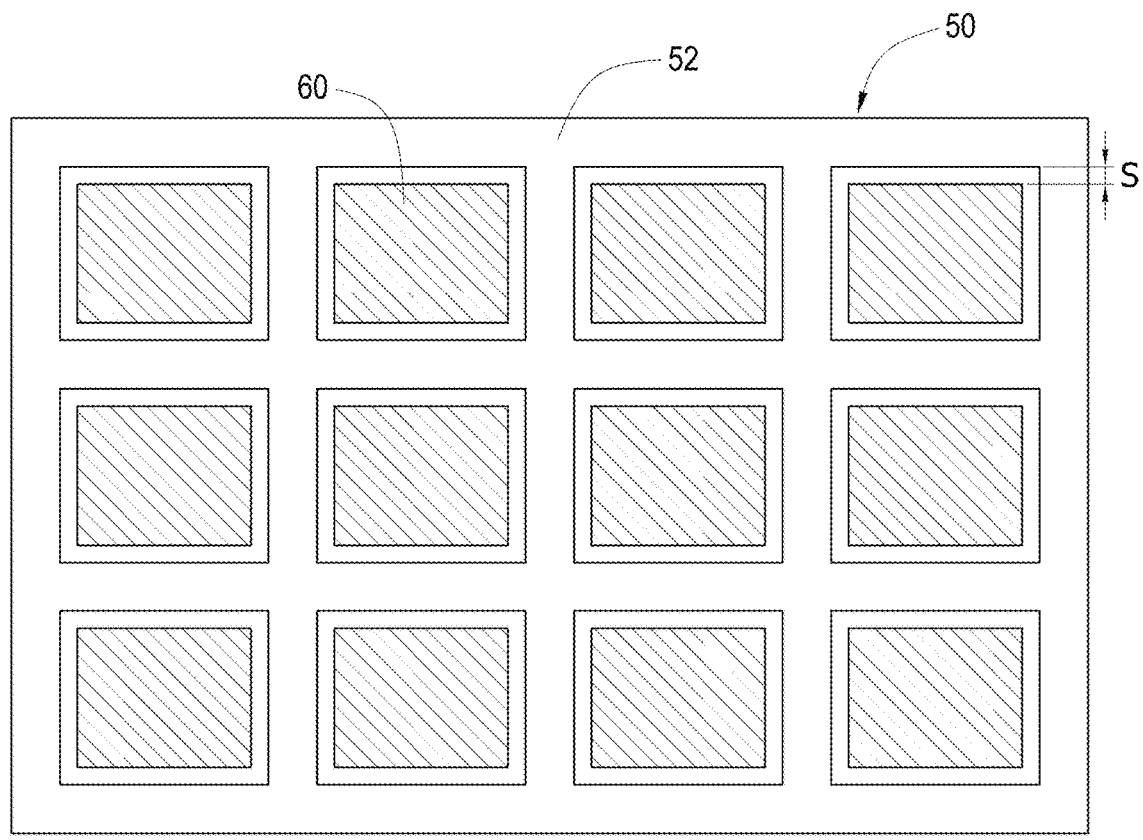
FIG. 14F is a top-view diagram of the micro tenon in accordance with an embodiment of the present disclosure.

Refer to FIG. 14F, the micro tenon 60 may adopt the area of the micro tenon remaining after the photoresist is exposed and developed, and the rest area is washed away. The micro tenon may also be replaced by the color filter layer. In addition, the production of the micro tenon may adopt the area of the micro tenon remaining from the flat layer PLN after the photolithography process. A certain gap S may be maintained between the micro tenon 60 and the side walls of the chamber 54 of the micro-partition as an alignment margin. This gap S is, for example, 1~50 μm. According to an embodiment of the present disclosure, this gap range is between 1~5 μm, depending on the accuracy of the photomask alignment when bonding the substrate. This gap is used as the error tolerance range during alignment and bonding to avoid damage caused by a collision between the micro-partition and the micro tenon due to errors during alignment and bonding. The thickness of the micro tenon may be 0.5~50 μm. The thicker the thickness, the stronger the sealing, but it may affect the attractive force or repulsive force of the control electrode, so the degree of sealing and the electrical effect need to be properly distributed. According to an embodiment of the present disclosure, the thickness range of the micro tenon 60 is also between 1~5 μm.

Refer to FIG. 14D, which is a schematic diagram of making the micro-partition structure 50 in accordance with another embodiment of the present disclosure. In this embodiment, the micro-partition structure 50 is formed after a conductive layer (e.g. the common electrode layer 14). The conductive layer includes the insulation layer (not shown in the figures) for electrical insulation from the charged color particle. As shown in FIG. 14D, first, the process forms the common electrode layer 14 and the insulation layer on the opposite substrate 12. The insulation layer may be made on the common electrode layer 14 by using a deposition method using a silicon nitride material, a silicon oxide material, or a composite stack of both. Then, the process makes the partition wall 52 of the micro-partition structure 50 by using photoresist and exposure and development processes on the common electrode layer 14 and the insulation layer. The manufacturing process of the partition wall 52 may be in the manufacturing process of the partition wall 52 as shown in FIG. 17A to FIG. 17F. As shown in FIG. 14D, the process fills in the colloidal solution including the charged particles between the partition wall 52 of the micro-partition structure 50, for example, the colloidal solution including the charged black particles 26B and the charged white particles 26W. Refer to FIG. 14D, this embodiment further includes making a control substrate 10 having the micro tenon 60 and fixing the control substrate 10 onto the opposite substrate 12 by registering this micro tenon 60 with the chamber 54 defined by the partition wall 52. As a result, the two substrates are combined. More specifically, first, the process grows the driving circuit layer 30 on the control substrate 10, such as the driving circuit layer 30 with a high aperture ratio in the present disclosure. Then, the process forms the control electrode layer PEL, and forms the color filter layer CF on the control electrode layer PEL. The process makes the micro tenon 60 on the color filter layer CF. If the thickness of the color filter layer meets the requirements, the color filter layer may be used as the micro tenon 60.

Refer to FIG. 14F, the micro tenon may adopt the area of the micro tenon remaining after the photoresist is exposed and developed, and the rest area is washed away. The micro tenon may also be replaced by the color filter layer in the embodiment of FIG. 14D. In addition, the production of the micro tenon may adopt the area of the micro tenon remaining from the flat layer PLN after the photolithography process. A certain gap S may be maintained between the micro tenon 60 and the side walls of the chamber 54 of the micro-partition as an alignment margin. This gap S is, for example, 1~50 μm. According to an embodiment of the present disclosure, this gap range is between 1~5 μm, depending on the accuracy of the photomask alignment. This gap is used as the error tolerance range during alignment and bonding to avoid damage caused by a collision between the micro-partition and the micro tenon due to errors during alignment and bonding. The thickness of the micro tenon may be 0.5~50 μm. The thicker the thickness, the stronger the sealing, but it may affect the attractive force or repulsive force of the control electrode, so the degree of sealing and the electrical effect need to be properly distributed. According to an embodiment of the present disclosure, the thickness range of the micro tenon 60 is also between 1~5 μm.

Refer to FIG. 14E, which is a schematic diagram of making the micro-partition structure 50 in accordance with another embodiment of the present disclosure. In this embodiment, the micro-partition structure 50 is formed on a conductive layer (e.g. the common electrode layer 14). As shown in FIG. 14E, first, the process forms the common electrode layer 14 on the opposite substrate 12. Then, the process makes the color filter layer CF on the common electrode layer 14, and then uses transparent photoresist and exposure and development process to make the partition wall 52 of the micro-partition structure 50.

In the embodiment, the manufacturing process of the partition wall 52 of FIG. 17A to FIG. 17F may be performed on the color filter layer CF, or the manufacturing process of the partition wall 52 of FIG. 17A to FIG. 17F may be performed after the flat layer PLN is made on the color filter layer CF. The material of the above flat layer PLN may be organic insulating material, inorganic insulating material, or a combination thereof.

As shown in FIG. 14E, the process fills in the colloidal solution including the charged color particles between the partition wall 52 of the micro-partition structure 50, for example, the colloidal solution including the charged black particles 26B and the charged white particles 26W. Refer to FIG. 14E, this embodiment further includes making a control substrate 10 having the micro tenon 60 and fixing the control substrate 10 onto the opposite substrate 12 by registering this micro tenon 60 with the chamber 54 defined by the partition wall 52. As a result, the two substrates are combined. More specifically, first, the process grows the driving circuit layer 30 on the control substrate 10, such as the driving circuit layer 30 with a high aperture ratio in the present disclosure. Then, the process forms the control electrode layer PEL, and forms the micro tenon 60 on the control electrode layer PEL.

Refer to FIG. 14F, the micro tenon may adopt the area of the micro tenon remaining after the photoresist is exposed and developed, and the rest area is washed away. In addition, the production of the micro tenon may adopt the area of the micro tenon remaining from the flat layer PLN after the photolithography process. A certain gap S may be maintained between the micro tenon 60 and the side walls of the chamber 54 of the micro-partition as an alignment margin. This gap S is, for example, 1~50 μm. According to an embodiment of the present disclosure, this gap range is between 1~5 μm, depending on the accuracy of the photomask alignment. This gap is used as the error tolerance range during alignment and bonding to avoid damage caused by a collision between the micro-partition and the micro tenon due to errors during alignment and bonding. The thickness of the micro tenon may be 0.5~50 μm. The thicker the thickness, the stronger the sealing, but it may affect the attractive force or repulsive force of the control electrode, so the degree of sealing and the electrical effect need to be properly distributed. According to an embodiment of the present disclosure, the thickness range of the micro tenon 60 is also between 1~5 μm.

In the above embodiment, the partition wall 52 of the micro-partition structure 50 may be made of a high-hardness polymer material, for example, the hardness of the high-hardness polymer material is more than 3 H. As a result, the average thickness of the partition wall 52 may be not more than 5 μm and the partition wall 52 still maintain sufficient support capacity. Furthermore, although FIGS. 11A-11C, 12A-12C, 13A-13C, and 14A-14E are not clearly shown, those skilled in the art may know that in these figures, the color filter layer CF may have a structure as shown in FIG. 18A of the present disclosure. That is, the color filter layer CF may have a structure as shown in the present disclosure in FIG. 18A, that is, the color filter layer CF includes a plurality of color filter blocks (CFR, CFG, CFB) with different colors. The color filter block includes a plurality of holes H and at least one hole H includes an area of not more than 100 μm².

In addition, in the electrophoretic display 100 of the embodiments shown in FIGS. 11A-11C, FIGS. 12A-12C, FIGS. 13A-13C, and FIGS. 14A-14E, may include the structure of the control electrode layer PEL and the structure of the driving circuit layer 30 as shown in FIGS. 3A-3C, FIGS. 4A-4C, FIG. 5A and FIG. 5C to increase the aperture ratio of the electrophoretic display 100. In addition, the design of the thin film transistor 32 and the gate channel width/the gate channel width may also be adopted by the structure of the thin film transistor 32 partially built on the gate line GL and the design of the gate channel width/the gate channel width as shown in FIG. 6C.

More specifically, in the electrophoretic display 100 of the embodiment shown in FIGS. 11A-11C, FIGS. 12A-12C, FIGS. 13A-13C, and FIGS. 14A-14E, the control electrode layer PEL, and the driving circuit layer 30 may adopt the structure shown in FIGS. 3B-3C, FIGS. 4A-4C, and FIGS. 5A-5C. The control electrode layer PEL further includes a plurality of storage capacitors Cs, and the driving circuit layer 30 further includes a plurality of common voltage lines Ve. The common voltage lines Ve are respectively disposed corresponding to the storage capacitors Cs and are substantially parallel to the gate lines GL or the data lines DL. According to one embodiment of the present disclosure, the structure of the electrophoretic display 100 of the embodiment shown in FIGS. 11A-11C, FIGS. 12A-12C, FIGS. 13A-13C, and FIGS. 14A-14E, may also be the structure as shown in FIG. 19. The common voltage line Ve of the electrophoretic display 100 is electrically connected to a display driver 200 or a display touch integrated driver 200. During the touch operation of the electrophoretic display 100, the display touch integrated driver 200 electrically connects a plurality of data lines DL together as a single touch-transmitting electrode. The display touch integrated driver 200 electrically connects a plurality of common voltage lines Ve together as a single touch-receiving electrode. Alternatively, the touch-transmitting electrode above-mentioned and the touch-receiving electrode may be interchanged with each other.

6. A Translucent Electrophoretic Display

The related-art of electronic paper displays (such as an electrophoretic display) may not be used as a translucent display. Translucent displays may be used to display information on car windows, on display cabinet glass for product descriptions, on windows for exterior wall advertising, on indoor stained glass, etc. Currently, the only technologies that may be used as a translucent display are the organic light-emitting diode (OLED) and the micro light-emitting diode (micro LED). However, traditional LCD does not work well because LCD requires a backlight. The related-art of the electrophoretic display may not be used in the above scenarios because it is opaque, but either OLED or micro LED may consume a lot of energy. More specifically, most of the area of the related-art of the electrophoretic display is used for electronic ink display, and electronic ink includes a variety of charged color particles. As a result, the related-art of the electrophoretic display is opaque.

The advantage of adopting the electrophoretic display as a translucent display is that the electrophoretic display may be used for outdoor display windows, car windows (e.g. the rear windshield may display messages to remind cars behind, or advertisements) for external display, exterior wall advertisements on windows that may be seen outside the house, indoor stained glass that may transmit light, etc. The advantage of adopting an electrophoretic display without power consumption is a great choice now when energy is short.

Figure 15A:
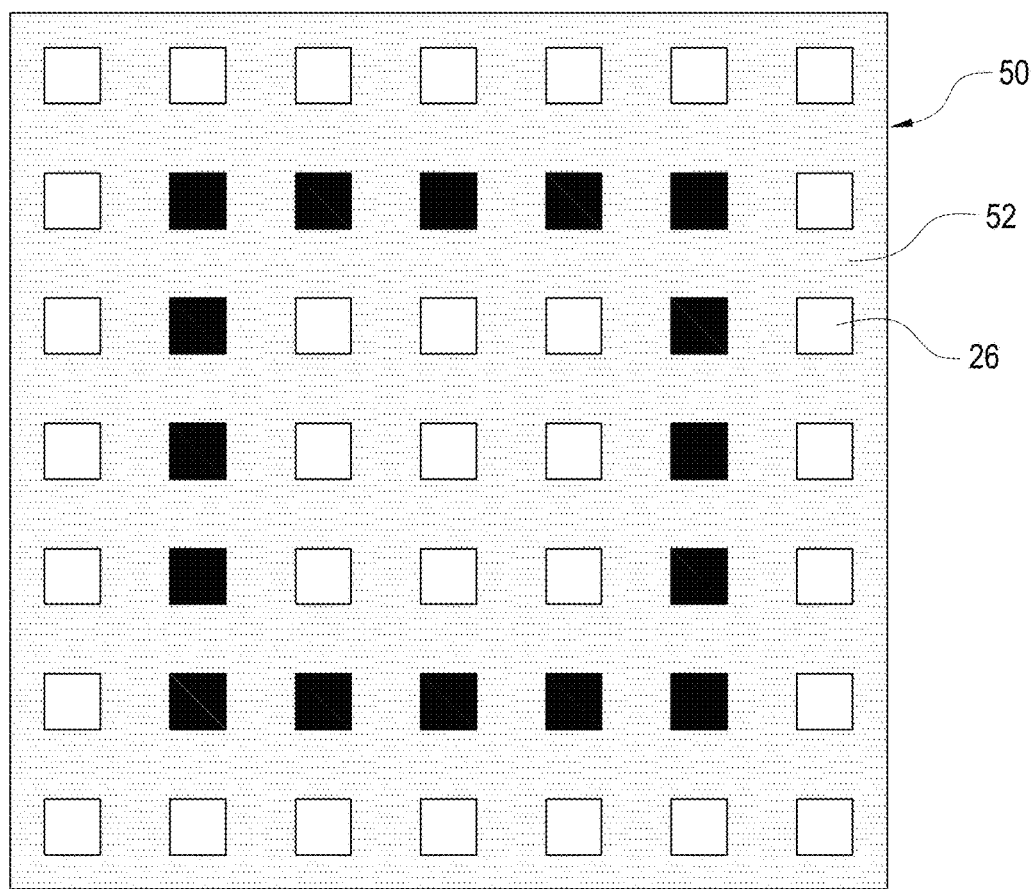
FIG. 15A is a partial top-view diagram of the electrophoretic display with transparent and two-color made in accordance with the present disclosure.

Refer to FIG. 15A, which is a top-view diagram of the electrophoretic display with translucent and semi-dual-color made in accordance with the present disclosure. According to the present disclosure, when making the electrophoretic display with transparent and two-color, the process makes the micro-partition structure 50 with the partition walls 52 on the control substrate 10, or makes the micro-partition structure 50 after making the color filter layer, or makes the micro-partition structure 50 after making the conductive substrate. The partition wall 52 of the micro-partition structure 50 may be made into a rectangular structure close to color pixels or a square structure close to black-and-white pixels, and may also match the boundaries of pixels without affecting the display. According to the present disclosure, for example, the photomask may be used to develop a transparent photoresist pattern to create a transparent micro-partition wall. The material of the transparent photoresist may use materials with higher hardness (i.e. the transparent photoresist made of acrylic). The process makes the partition wall 52 of the micro-partition structure 50 on the transparent photoresist. Since there are no charged color particles on the wall of the micro-partition, the scenery on the back of the display may be penetrated. The transparent area may be increased by increasing the thickness of the partition wall 52 to increase the transparent part (viewed from the operating surface) of the electrophoretic display with transparent and two-color. The light transmittance of transparent photoresist is very high, more than 90%. The micro-partition structure 50 with high light transmittance is combined with the control substrate 10 of the driving circuit layer 30 with a high aperture ratio of the present disclosure and the opposite substrate with a transparent conductive layer 12, to make a translucent electrophoretic display 100. The degree of transparency of this translucent electrophoretic display 100 depends on the ratio of the area (opaque area including electronic ink) of the container in the micro-partition to the entire display surface. The area of the container in the micro-partition filled with electronic ink (including colloidal solution with the charged color particle) is an opaque area, and the remaining area is a transparent area. In other words, the gray areas in FIG. 15A are all partition wall 52 of the micro-partition, which are transparent areas, and the remaining areas are opaque areas filled with electronic ink.

Figure 15B:
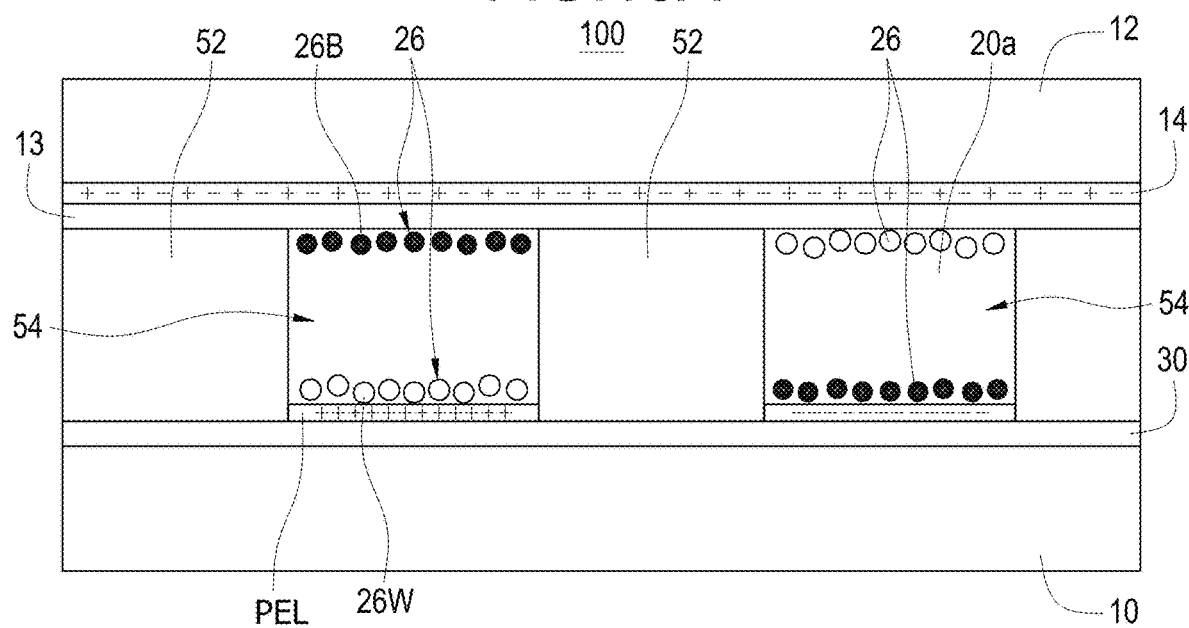
FIG. 15B to FIG. 15D are partial cross-section diagrams of the electrophoretic display with transparent and two-color/colorful made in accordance with the present disclosure.

Refer to FIG. 15B, which is a cross-sectional diagram of the electrophoretic display 100 with translucent and two-color made according to an embodiment of the present disclosure. To achieve the degree of transparency on both sides of the electrophoretic display, the control substrate 10 of the driving circuit layer 30 with a high aperture ratio of the present disclosure and the opposite substrate 12 with a transparent conductive layer may be used. In addition, the manufacturing process of the partition wall 52 of FIG. 17A to FIG. 17F is performed on the electrophoretic display 100 with transparent and two-color (two-color transparent electrophoretic display 100), and the thickness of the partition wall is increased to increase transparency. According to one embodiment of the present disclosure, the total area of the thickness of the partition wall 52 of the micro-partition is not less than 10% of the entire display range area of the electrophoretic display 100. According to another embodiment of the present disclosure, the total area of the thickness of the partition wall 52 of the micro-partition is not less than 35% of the entire display range area of the electrophoretic display 100. As shown in FIG. 15B, the electrophoretic display 100 with translucent and two-color includes, from top to bottom, an opposite substrate 12 (i.e. a second substrate, for example, a transparent plastic substrate or a glass substrate), a common electrode layer 14 (i.e. a transparent conductive electrode layer), an electrophoresis layer 20a, a control electrode layer PEL, a driving circuit layer 30 with a high aperture ratio (which is abbreviated as the driving circuit layer 30 below) and a control substrate 10 (e.g. a glass substrate). In addition, as shown in FIG. 15B, the electrophoresis layer 20a includes a micro-partition structure 50 including a plurality of partition walls 52 which define a plurality of chamber 54 (there are two chamber 54 as shown in figures), and a colloidal solution 24 including a plurality of charged color particles (e.g. the charged black particle 26B and the charged white particle 26W) filled in each chamber 54. According to one embodiment of the present disclosure, the first electrode CE1/the second electrode CE2 of the storage capacitor Cs of the driving circuit layer 30 with a high aperture ratio is made of transparent conductive material to enhance the aperture ratio of the electrophoretic display 100. In addition, the above is further helpful for users to view this electrophoretic display 100 from the control substrate 10 side, so that the control electrode layer PEL close to the viewing side may attract the required charged black particle 26B and the charged white particle 26W, achieving a faster screen refresh speed. The driving circuit layer 30 shown in FIG. 15B may be implemented by, for example, the driving circuit layer 30 shown in FIGS. 3B-3C, FIGS. 4A-4C, and FIGS. 5A-5C.

Figure 15C:
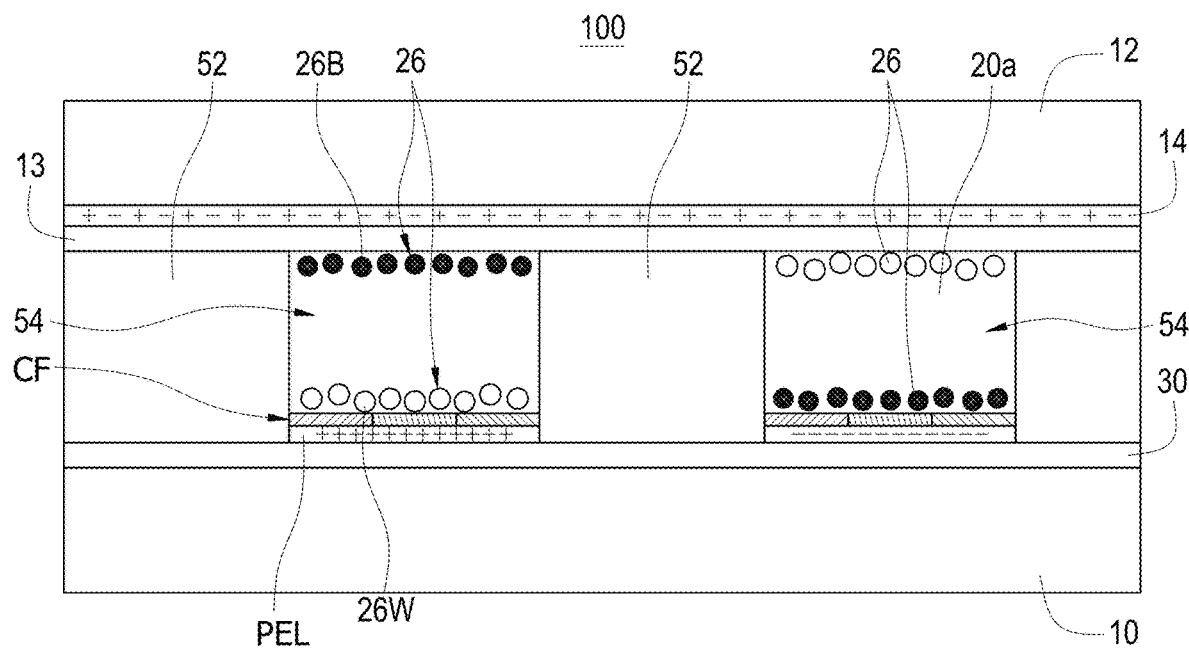

Refer to FIG. 15C which is a cross-sectional diagram of a color translucent electrophoretic display 100 made according to another embodiment of the present disclosure. This embodiment may display a color image on one side, while the other side is a black-and-white image. First, the process makes the color filter layer CF on the control substrate 10 with the transparent control electrode layer PEL and the driving circuit layer 30 with a high aperture ratio, then, performs, the manufacturing process of the partition wall 52 of FIG. 17A to FIG. 17F. Then, the process fills in the colloidal solution including two-color charged particles 26 (such as the charged black particle 26B and the charged white particle 26W). Then, the process bonds the transparent opposite substrate 12 (second substrate) of the transparent common electrode layer 14. Similarly, for the electrophoretic display 100 shown in FIG. 15C, the process makes the partition wall 52 of the micro-partition structure by the transparent photoresist and increases the thickness of the partition wall to increase transparency. According to one embodiment of the present disclosure, the total area of the thickness of the partition wall 52 of the micro-partition is not less than 10% of the entire display range area of the electrophoretic display 100. According to another embodiment of the present disclosure, the total area of the thickness of the partition wall 52 of the micro-partition is not less than 35% of the entire display range area of the electrophoretic display 100. As shown in FIG. 15C, the color translucent electrophoretic display 100 includes, from top to bottom, an opposite substrate 12 (i.e. a transparent plastic substrate or a glass substrate), a common electrode layer 14 (i.e. a transparent conductive electrode layer), an electrophoresis layer 20a, a color filter layer CF, a control electrode layer PEL, a driving circuit layer 30 with a high aperture ratio (which is abbreviated as the driving circuit layer 30 below) and a control substrate 10 (e.g. a glass substrate). In addition, as shown in FIG. 15C, the electrophoresis layer 20a includes a micro-partition structure 50 including a plurality of partition walls 52 which define a plurality of chamber 54 (there are two chamber 54 as shown in figures), and a colloidal solution 24 including a plurality of charged color particles (e.g. the charged black particle 26B and the charged white particle 26W) filled in each chamber 54. According to one embodiment of the present disclosure, the first electrode CE1/the second electrode CE2 of the storage capacitor Cs of the driving circuit layer 30 with a high aperture ratio is made of transparent conductive material to enhance the aperture ratio of the electrophoretic display 100. In addition, the above is further helpful for users to view this electrophoretic display 100 from the control substrate 10 side, so that the control electrode layer PEL close to the viewing side may attract the required charged black particle 26B and the charged white particle 26W, achieving a faster screen refresh speed, and many other advantages. The driving circuit layer 30 shown in FIG. 15C may be implemented by, for example, the driving circuit layer 30 shown in FIGS. 3B-3C, FIGS. 4A-4C, and FIGS. 5A-5C.

Figure 15D:
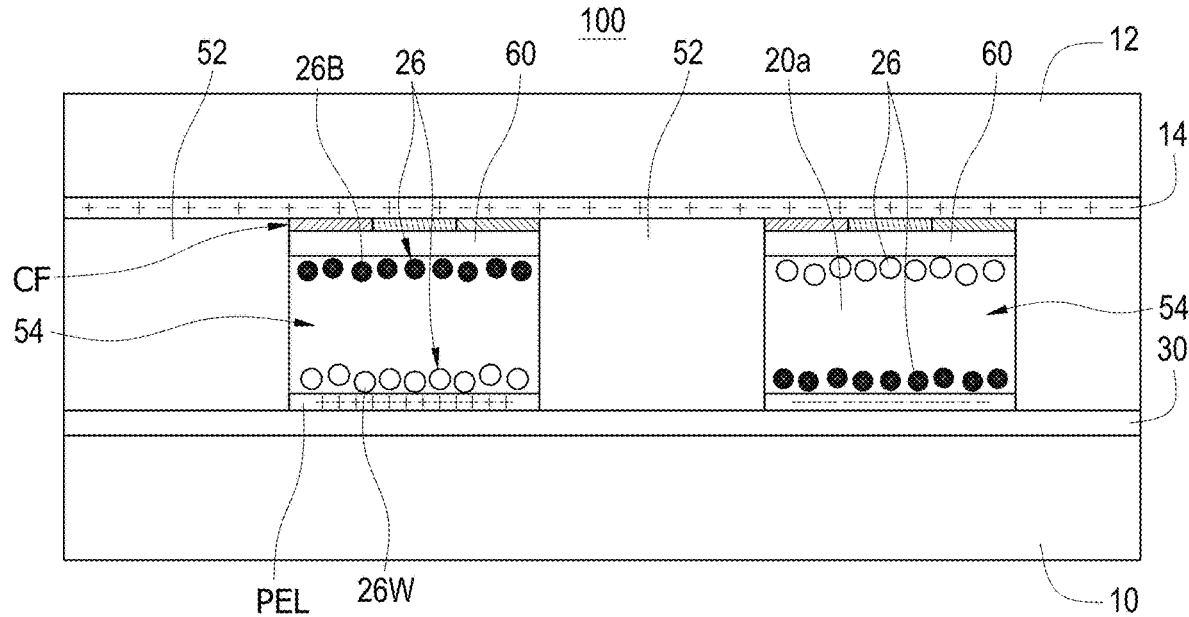

Refer to FIG. 15D which is a cross-sectional view of the electrophoretic display 100 with translucent and color made according to another embodiment of the present disclosure. For the electrophoretic display 100, first, the process makes the control substrate 10 with transparent control electrode layer PEL and the driving circuit layer 30 with a high aperture ratio are made. Then, the process performs the manufacturing process of the partition wall 52 of FIG. 17A to FIG. 17F by a polymer material (e.g. a transparent photoresist material). Then, the process fills in the colloidal solution including charged particles 26 with two-color (such as the charged black particle 26B and the charged white particle 26W). Then, the process bonds the transparent opposite substrate 12 of the transparent common electrode layer 14. The process makes the color filter layer CF and the micro tenon 60 on the common electrode layer 14 for this transparent opposite substrate 12. Refer to FIG. 14F, the micro tenon 60 may adopt the area of the micro tenon remaining after the photoresist is exposed and developed, and the rest area is washed away. In addition, the production of the micro tenon may adopt the area of the micro tenon remaining from the flat layer PLN after the photolithography process. A predetermined gap S may be maintained between the micro tenon 60 and the side walls of the chamber 54 of the micro-partition structure 50 as an alignment margin. This gap S is, for example, 1~50 μm. According to an embodiment of the present disclosure, this gap range is between 1~5 μm, depending on the accuracy of the photomask alignment when bonding the substrate. This gap is used as the error tolerance range during alignment and bonding to avoid damage caused by collision between the micro-partition and the micro tenon due to errors during alignment and bonding. The thickness of the micro tenon may be 0.5~50 μm. The thicker the thickness, the stronger the sealing, but it may affect the attractive force or repulsive force of the control electrode, so the degree of sealing and the electrical effect need to be properly distributed. According to an embodiment of the present disclosure, the thickness range of the micro tenon 60 is also between 1~5 μm.

Similarly, for the electrophoretic display 100 shown in FIG. 15D, the process makes the partition wall 52 of the micro-partition structure by the transparent photoresist and increases the thickness of the partition wall to increase transparency. According to one embodiment of the present disclosure, the total area of the thickness of the partition wall 52 of the micro-partition is not less than 10% of the entire display range area of the electrophoretic display 100. According to another embodiment of the present disclosure, the total area of the thickness of the partition wall 52 of the micro-partition is not less than 35% of the entire display range area of the electrophoretic display 100. As shown in FIG. 15D, the electrophoretic display 100 with transparent and color includes, from top to bottom, an opposite substrate 12 (i.e. a transparent plastic substrate or a glass substrate), a common electrode layer 14 (i.e. a transparent conductive electrode layer), a color filter layer CF, a micro tenon 60, an electrophoresis layer 20a, a control electrode layer PEL, a driving circuit layer 30 with a high aperture ratio (which is abbreviated as the driving circuit layer 30 below) and a control substrate 10 (e.g. a glass substrate). In addition, as shown in FIG. 15D, the electrophoresis layer 20a includes a micro-partition structure 50 including a plurality of partition walls 52 which define a plurality of chambers 54 (there are two chambers 54 as shown in figures), and a colloidal solution 24 including a plurality of charged color particles (e.g. the charged black particle 26B and the charged white particle 26W) filled in each chamber 54. In addition, the opposite substrate 12 further includes the color filter layer CF and the micro tenon 60 located on the common electrode layer 14 and facing the electrophoresis layer 20a. The micro tenon 60 is adapted to be embedded within the corresponding chamber 54 of the micro-partition structure 50. According to one embodiment of the present disclosure, the first electrode CE1/the second electrode CE2 of the storage capacitor Cs of the driving circuit layer 30 with a high aperture ratio is made of transparent conductive material to enhance the aperture ratio of the electrophoretic display 100. In addition, the above is further helpful for users to view this electrophoretic display 100 from the control substrate 10 side, so that the control electrode layer PEL close to the viewing side may attract the required charged black particle 26B and the charged white particle 26W, achieving a faster screen refresh speed. The driving circuit layer 30 shown in FIG. 15D may be implemented by, for example, the driving circuit layer 30 shown in FIGS. 3B-3C, FIGS. 4A-4C, and FIGS. 5A-5C.

Figure 16A:
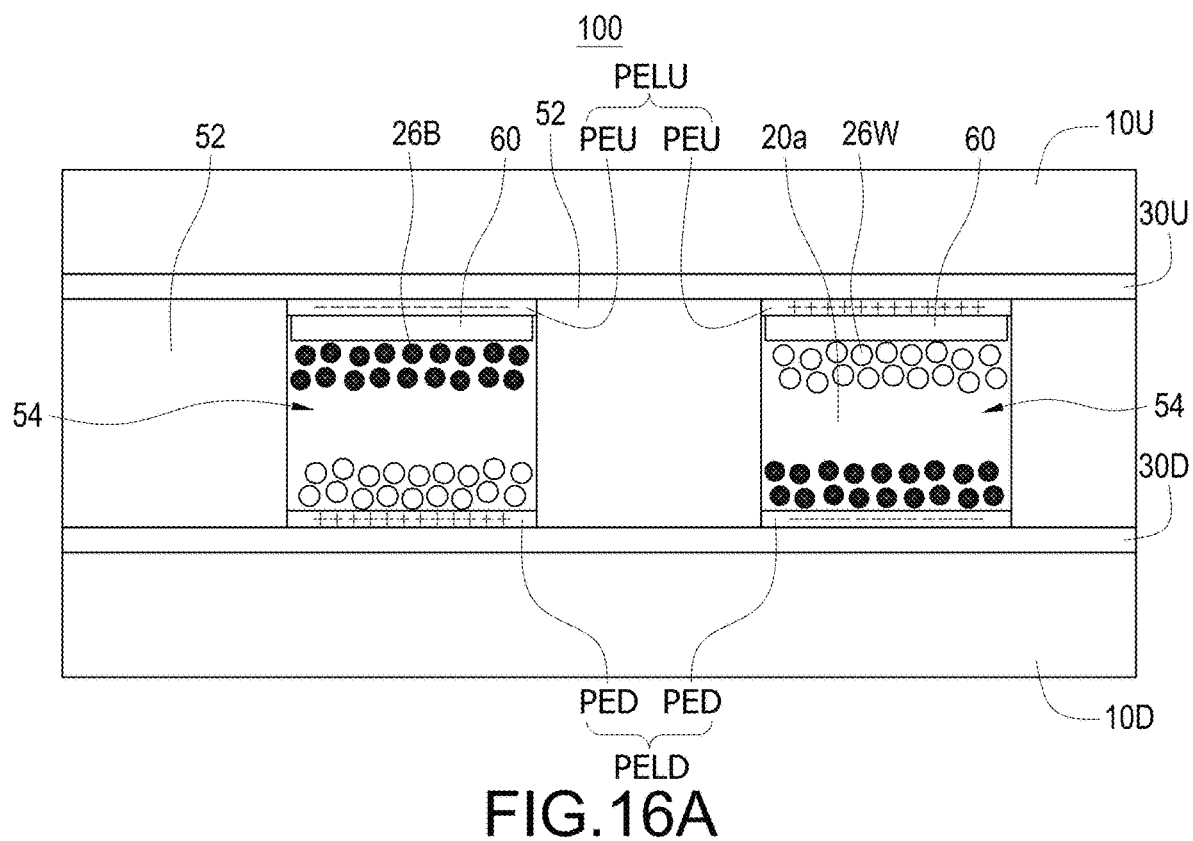
FIG. 16A to FIG. 16D are cross-section diagrams of the electrophoretic display with transparent and dual-side made in accordance with another embodiment of the present disclosure.

Refer to FIG. 16A which is a cross-sectional diagram of an electrophoretic display 100 with translucent, two-color, and double-sided made according to another embodiment of the present disclosure. This electrophoretic display 100 may display different images on both sides. The structure of this embodiment is partially similar to the structure shown in FIG. 15B, but the opposite substrate 12 is replaced by a second control substrate 10U. The second control substrate 10U is also a transparent substrate and is combined with the first control substrate 10D by the micro tenon 60 embedded in the corresponding chamber 54 of the micro-partition structure 50. Furthermore, the second control substrate 10U also has the driving circuit layer (the second driving circuit layer) 30U with a high aperture ratio above and the control electrode layer (the second control electrode layer) PELU above. This second control electrode layer PELU has a plurality of second control electrodes PEU. Furthermore, the first control substrate 10D has the driving circuit layer (the first control electrode layer) 30D with a high aperture ratio below and the control electrode layer (the first control electrode layer) PELD below. This first control electrode layer PELD has the plurality of first control electrodes PED.

Similarly, the micro tenon 60 may adopt the area of the micro tenon remaining after the photoresist is exposed and developed, and the rest area is washed away. In addition, the production of the micro tenon may adopt the area of the micro tenon remaining from the flat layer PLN after the photolithography process. A certain gap S may be maintained between the micro tenon 60 and the side walls of the chamber 54 of the micro-partition structure 50 as an alignment margin. This gap S is, for example, 1~50 μm. According to an embodiment of the present disclosure, this gap range is between 1~5 μm, depending on the accuracy of the photomask alignment when bonding the substrate. This gap is used as the error tolerance range during alignment and bonding to avoid damage caused by collision between the micro-partition and the micro tenon due to errors during alignment and bonding. The thickness of the micro tenon may be 0.5~50 μm. The thicker the thickness, the stronger the sealing, but it may affect the attractive force or repulsive force of the control electrode, so the degree of sealing and the electrical effect need to be properly distributed. According to an embodiment of the present disclosure, the thickness range of the micro tenon 60 is also between 1~5 μm.

For the electrophoretic display 100 shown in FIG. 16A, the manufacturing process of the partition wall 52 of FIG. 17A to FIG. 17F is performed and the thickness of the partition wall is increased to increase transparency. According to one embodiment of the present disclosure, the total area of the thickness of the partition wall 52 of the micro-partition is not less than 10% of the entire display range area of the electrophoretic display 100. According to another embodiment of the present disclosure, the total area of the thickness of the partition wall 52 of the micro-partition is not less than 35% of the entire display range area of the electrophoretic display 100. According to one embodiment of the present disclosure, the first electrode CE1/the second electrode CE2 of the storage capacitor Cs of the driving circuit layer 30U, 30D with a high aperture ratio are made of transparent conductive material to enhance the aperture ratio of the electrophoretic display 100. In addition, the above is further helpful for users to view this electrophoretic display 100 from the first control substrate 10D and the second control substrate 10U side, so that the control electrode layer PELU, PELD close to the viewing side may attract the required charged black particle 26B and the charged white particle 26W, achieving a faster screen refresh speed. The driving circuit layer 30U or 30D shown in FIG. 16A may be implemented by, for example, the driving circuit layer 30 shown in FIGS. 3B-3C, FIGS. 4A-4C, and FIGS. 5A-5C. Furthermore, the control electrode layer PELU and the control electrode layer PELD may also be implemented by the control electrode layer PEL shown in FIGS. 3B-3C, FIGS. 4A-4C, and FIGS. 5A-5C.

Refer to FIG. 16A, when the upper driving circuit layer 30U with a high aperture ratio controls the electrode (the second control electrode PEU) of the second control substrate 10U to carry negative charges, and the lower driving circuit 30D layer with a high aperture ratio controls the corresponding electrode (the first control electrode PED) of the first control substrate 10D to carry positive charges, black particles 26B with positive charge may move to the upper second control electrode PEU, so that, the position of the upper electrode displays black pixels and white particles 26W with negative charges may move to the lower first control electrode PED, so that, the position of the lower electrode displays white pixels. When the polarity of the upper and lower electrodes are swapped, the colors of the display pixels are also swapped.

Figure 16B:
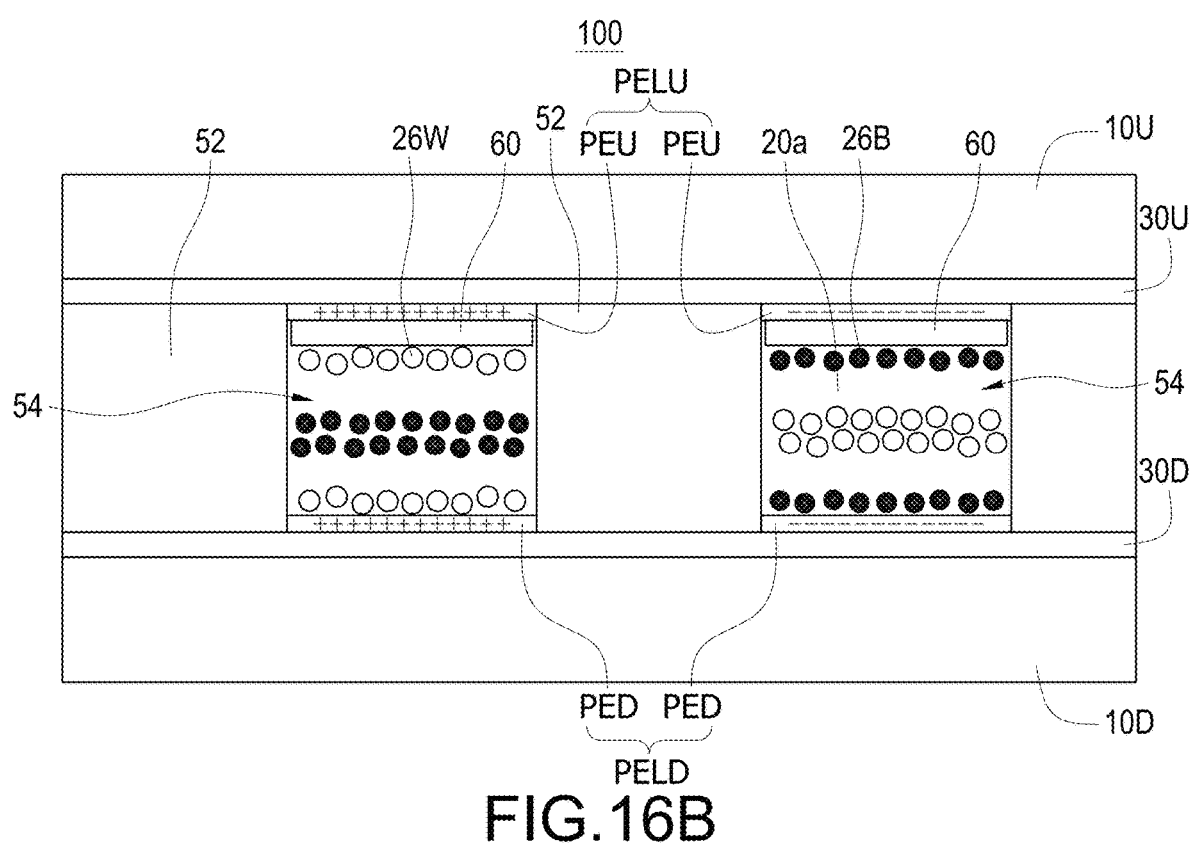

Refer to FIG. 16B, corresponding to the structure of FIG. 16A, when the upper and lower electrodes (the second control electrode PEU above and corresponding the lower first control electrode PED) have the same polarity, for example, when they are both positively charged, the white particles 26W with negative charges may move to the upper and lower electrodes, so that, the upper and lower electrodes to display white pixels, and the black particles 26B with positive charge move toward the center and are hidden by the white particles 26W and may not be seen. On the contrary, when both the upper and lower electrodes are negatively charged, the black particles 26B with positive charge may move to the upper and lower electrodes, and the white particles 26W may move to the middle and are hidden by the black particles 26B and may not be seen. At this time, the upper and lower electrodes display black pixels.

Figure 16C:
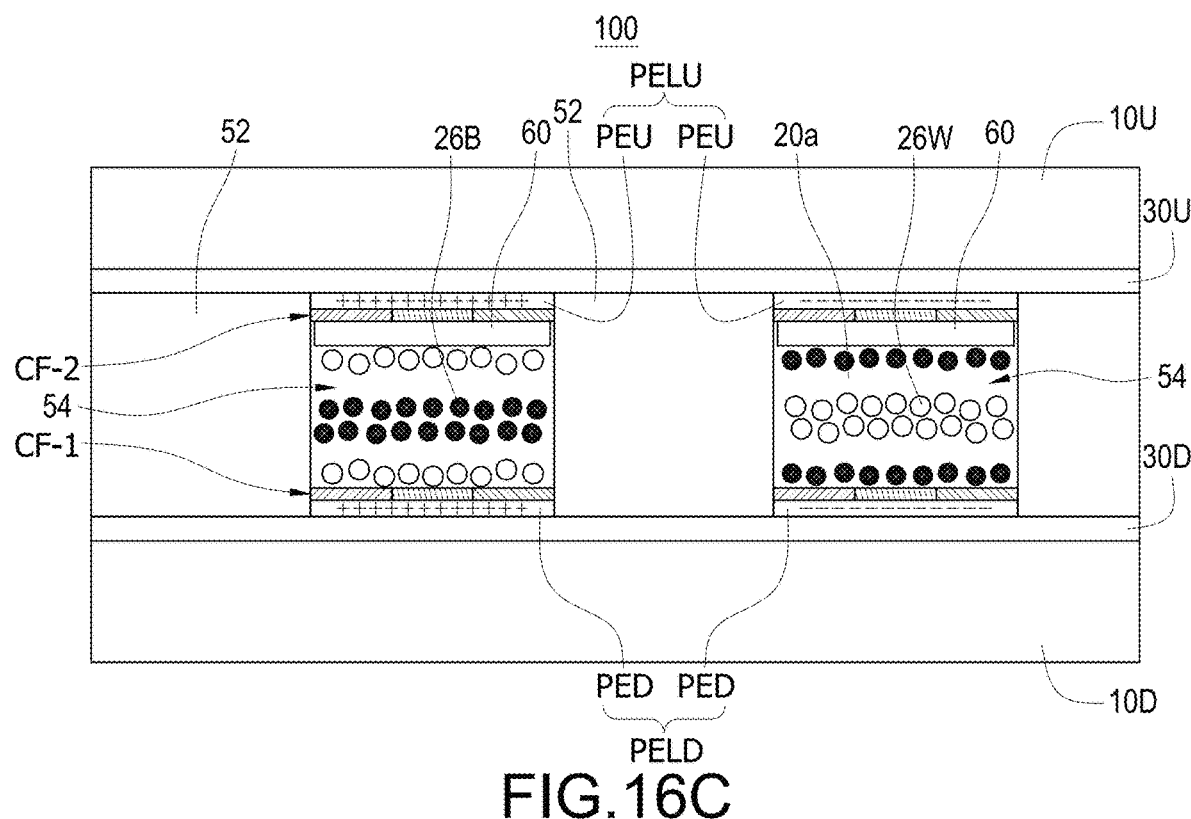

Refer to FIG. 16C which is a cross-sectional diagram of an electrophoretic display 100 with translucent, color, and double-sided made according to another embodiment of the present disclosure. This electrophoretic display 100 may display different color images on both sides. For this electrophoretic display 100, first, the process makes the first color filter layer CF-1 on the first control substrate 10D which with the transparent first control electrode layer PELD (with the first control electrode PED) and the driving circuit layer 30D with a high aperture ratio. Then, the process performs the manufacturing process of the partition wall 52 of FIG. 17A to FIG. 17F. Then, the process fills in the colloidal solution including two-color charged particles 26 (such as the charged black particle 26B and the charged white particle 26W). Then, the process presses the transparent second control substrate 10U with the micro tenon 60. In addition, as shown in FIG. 16C, the transparent second control substrate 10U also has a driving circuit layer 30U with a high aperture ratio above, a transparent second control electrode layer PELU (with the second control electrode PEU), and a transparent second color filter layer CF-2 formed on the second control electrode layer PELU.

Refer to FIG. 14F, the micro tenon 60 may adopt the area of the micro tenon remaining after the photoresist is exposed and developed, and the rest area is washed away. In addition, the production of the micro tenon may adopt the area of the micro tenon remaining from the flat layer PLN after the photolithography process. A certain gap S may be maintained between the micro tenon 60 and the side walls of the chamber 54 of the micro-partition structure 50 as an alignment margin. This gap S is, for example, 1~50 μm. According to an embodiment of the present disclosure, this gap range is between 1~5 μm, depending on the accuracy of the photomask alignment. This gap is used as the error tolerance range during alignment and bonding to avoid damage caused by a collision between the micro-partition and the micro tenon due to errors during alignment and bonding. The thickness of the micro tenon may be 0.5~50 μm. The thicker the thickness, the stronger the sealing, but it may affect the attractive force or repulsive force of the control electrode, so the degree of sealing and the electrical effect need to be properly distributed. According to an embodiment of the present disclosure, the thickness range of the micro tenon 60 is also between 1~5 μm.

Similarly, for the electrophoretic display 100 shown in FIG. 16C, the process makes the partition wall 52 of the micro-partition structure by the transparent photoresist and increases the thickness of the partition wall to increase transparency. According to one embodiment of the present disclosure, the total area of the thickness of the partition wall 52 of the micro-partition is not less than 10% of the entire display range area of the electrophoretic display 100. According to another embodiment of the present disclosure, the total area of the thickness of the partition wall 52 of the micro-partition is not less than 35% of the entire display range area of the electrophoretic display 100. According to one embodiment of the present disclosure, the first electrode CE1/the second electrode CE2 of the storage capacitor Cs of the driving circuit layer 30U, 30D with a high aperture ratio are made of transparent conductive material to enhance the aperture ratio of the electrophoretic display 100. In addition, the above is further helpful for users to view this electrophoretic display 100 from the first control substrate 10D and the second control substrate 10U side, so that the control electrode layer PELU, PELD close to the viewing side may attract the required charged black particle 26B and the charged white particle 26W, achieving a faster screen refresh speed and many other advantages. The driving circuit layer 30U or 30D shown in FIG. 16C may be implemented by, for example, the driving circuit layer 30 shown in FIGS. 3B-3C, FIGS. 4A-4C, and FIGS. 5A-5C. Furthermore, the control electrode layer PELU and the control electrode layer PELD may also be implemented by the control electrode layer PEL shown in FIGS. 3B-3C, FIGS. 4A-4C, and FIGS. 5A-5C.

Figure 16D:
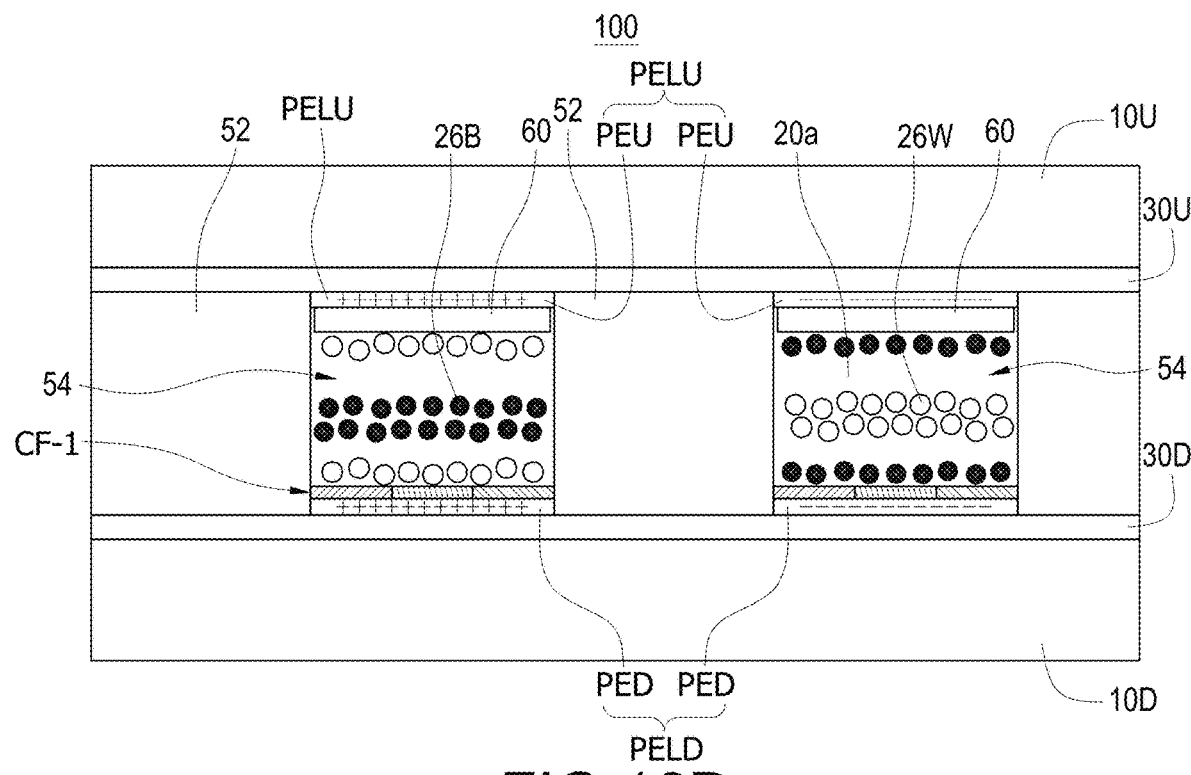

Refer to FIG. 16D which is a cross-sectional diagram of an electrophoretic display 100 with translucent, and double-sided made according to another embodiment of the present disclosure. This electrophoretic display 100 may display color on one side and black-and-white on the other side. The electrophoretic display 100 of this embodiment is similar to the electrophoretic display shown in FIG. 16C, but does not have the color filter layer on the second control substrate 10U side. Therefore, a black-and-white image may be displayed on the second control substrate 10U side, and a color image may be displayed on the first control substrate 10D side. Similarly, the second control substrate 10U has the micro tenon 60 formed thereon, and the first control substrate 10D has the micro-partition structure 50 (with the chamber 54) formed thereon. Similarly, the process forms the micro-partition structure 50 on the second control substrate 10U, and forms the micro tenon 60 on the first control substrate 10D are within the scope of the present disclosure. Moreover, the second control substrate 10U is combined with the first control substrate 10D by the micro tenon 60 embedded in the corresponding chamber 54 of the micro-partition structure 50. On the contrary, the first control substrate 10D is combined with the second control substrate 10U by the micro tenon 60 embedded in the corresponding chamber 54 of the micro-partition structure 50. The micro tenon 60 may be made by the exposure and development processes. In addition, the production of the micro tenon may adopt the area of the micro tenon remaining from the flat layer PLN after the photolithography process. A certain gap S may be maintained between the micro tenon 60 and the side walls of the chamber 54 of the micro-partition structure 50 as an alignment margin. This gap S is, for example, 1~50 μm. According to an embodiment of the present disclosure, the gap range is between 1~5 μm, depending on the accuracy of the alignment. This gap is used as the error tolerance range during the photomask alignment and bonding to avoid damage caused by a collision between the micro-partition and the micro tenon due to errors during alignment and bonding. The thickness of the micro tenon may be 0.5~50 μm. The thicker the thickness, the stronger the sealing, but it may affect the attractive force or repulsive force of the control electrode, so the degree of sealing and the electrical effect need to be properly distributed. According to an embodiment of the present disclosure, the thickness range of the micro tenon 60 is also between 1~5 μm.

Similarly, for the electrophoretic display 100 shown in FIG. 16D, the process makes the partition wall 52 of the micro-partition structure by the transparent photoresist and increases the thickness of the partition wall to increase transparency. According to one embodiment of the present disclosure, the total area of the thickness of the partition wall 52 of the micro-partition is not less than 10% of the entire display range area of the electrophoretic display 100. According to another embodiment of the present disclosure, the total area of the thickness of the partition wall 52 of the micro-partition is not less than 35% of the entire display range area of the electrophoretic display 100. According to one embodiment of the present disclosure, the first electrode CE1/the second electrode CE2 of the storage capacitor Cs of the driving circuit layer 30U, 30D with a high aperture ratio are made of transparent conductive material to enhance the aperture ratio of the electrophoretic display 100. In addition, the above is further helpful for users to view this electrophoretic display 100 from the first control substrate 10D and the second control substrate 10U side, so that the control electrode layer PELU, PELD close to the viewing side may attract the required charged black particle 26B and the charged white particle 26W, achieving a faster screen refresh speed. The driving circuit layer 30U or 30D shown in FIG. 16D may be implemented by, for example, the driving circuit layer 30 shown in FIGS. 3B-3C, FIGS. 4A-4C, and FIGS. 5A-5C. Furthermore, the control electrode layer PELU and the control electrode layer PELD may also be implemented by the control electrode layer PEL shown in FIGS. 3B-3C, FIGS. 4A-4C, and FIGS. 5A-5C.

7. A Color Filter Layer with a Hole

As shown in FIG. 7A, when the electronic paper displays adopt the color filter layer to display color images, there may be a light loss once the light enters the color filter layer, and there may be a light loss again after reflection. The two light losses may cause the visual brightness to decrease. In addition, due to the distance between the color filter layer and the reflective particles, the color area entered by the incident light is different from the color area reflected. After filtering with different colors, there may be almost no light penetrates and is completely absorbed. As a result, the visual brightness is decreased.

Refer to FIG. 18A, according to an embodiment of the present disclosure, a plurality of holes H may respectively be disposed on the color filter block, such as the red color filter block CFR, the green color filter block CFG, and the blue color filter block CFB, of the color filter layer CF. According to one embodiment, the area of at least one hole H is not more than 100 $\mu m^2$, or the area of most holes H is not more than 100 $\mu m^2$. In addition, according to another embodiment, the total area of the hole H within the same color is not less than 10% of the total area of the color. For example, for the red color filter block CFR, the total area of the hole H within its range is not less than 10% of the total area of the red color filter block CFR. By disposing of the hole H and designing the individual area and total area of the hole, the light loss of the color filter layer CF may be reduced.

Figure 18B:
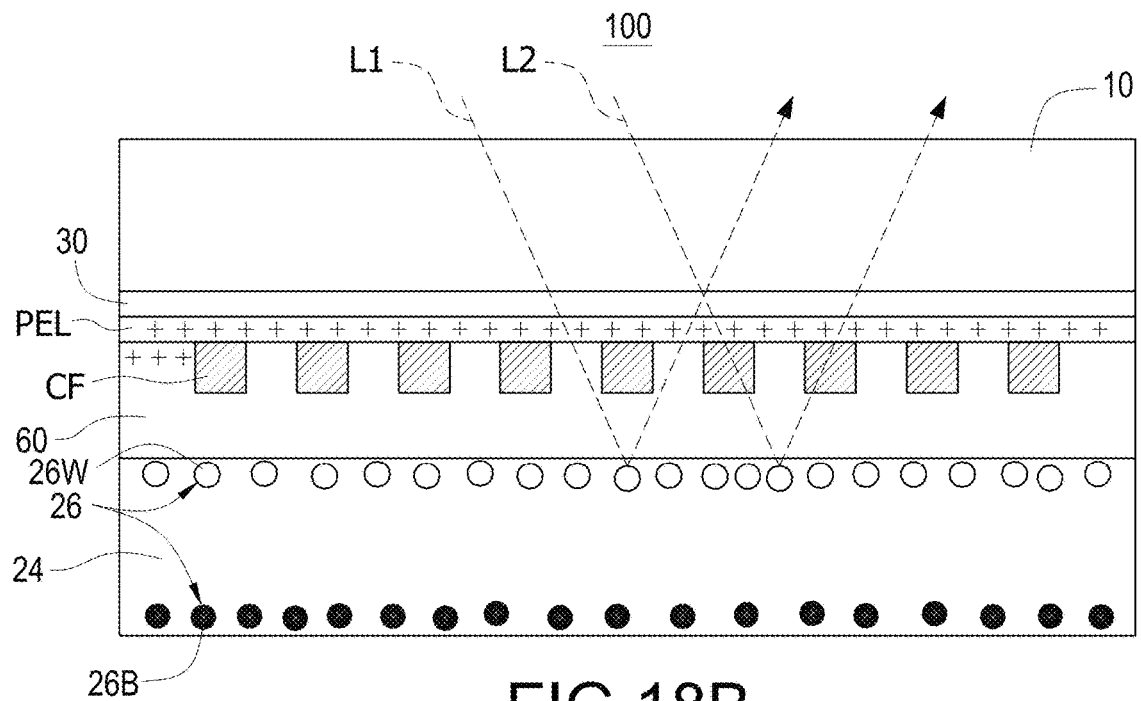
FIG. 18B is an operation diagram of FIG. 18A.

As shown in FIG. 18B, when the incident light L2 enters a colored area (e.g. red the color filter block CFR) and the reflected light is also reflected in a colored area (e.g. red the color filter block CFR), the light is filtered twice, so the attenuation is high. When the incident light L1 enters a colored area (e.g. the red color filter block CFR) and the reflected light is reflected in an uncolored area (e.g. corresponding to the hole H), the light is only filtered once, so the attenuation is low. When the incident light enters an uncolored area (e.g. corresponding to the hole H) and the reflected light is reflected in a colored area (e.g. the red color filter block CFR), the light is only filtered once, so the attenuation is low. When the incident light and reflected light are both in an uncolored area (e.g. corresponding to the hole H) without filter attenuation, but the outgoing color is the color of the charged color particle 26. However, the probability of the above situation is the lowest. It may only occur when light is incident near a vertical angle or at a special angle. The color filter layer CF with the hole H may increase the saturation and brightness of the color, which can significantly improve the color display of electronic paper.

Figure 2A:
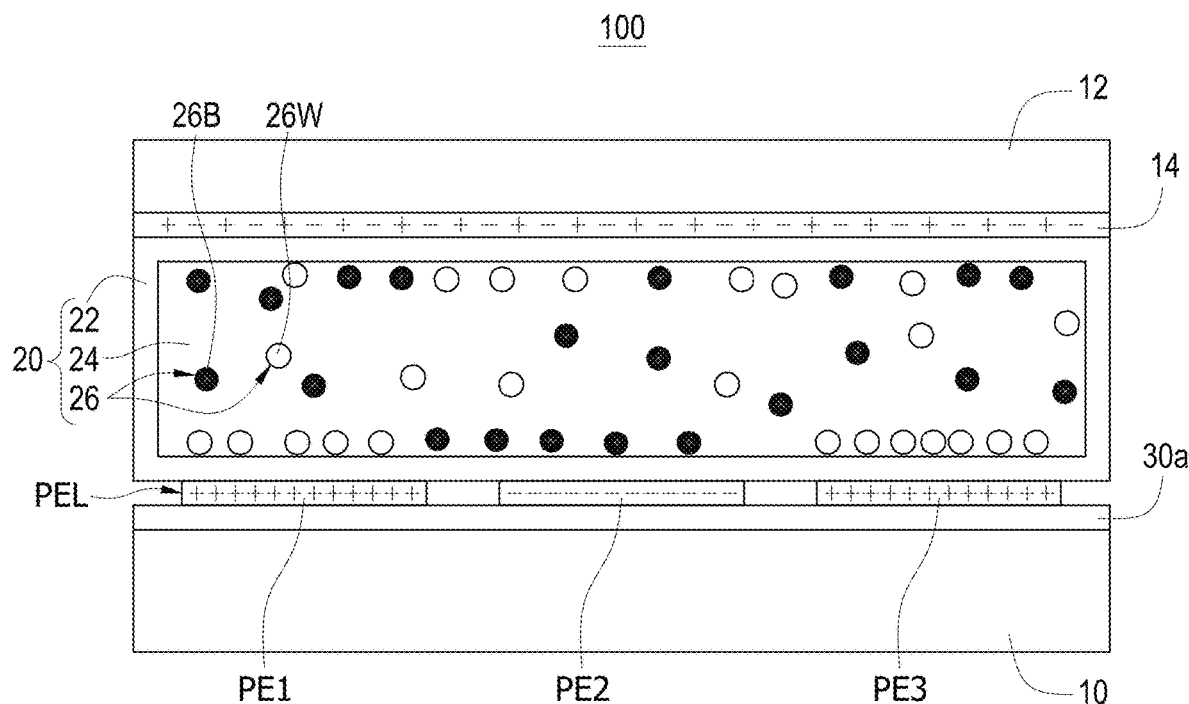
FIG. 2A illustrates an operation diagram of the black-and-white electrophoretic display 100 of a related-art of FIG. 1A.
Figure 2B:
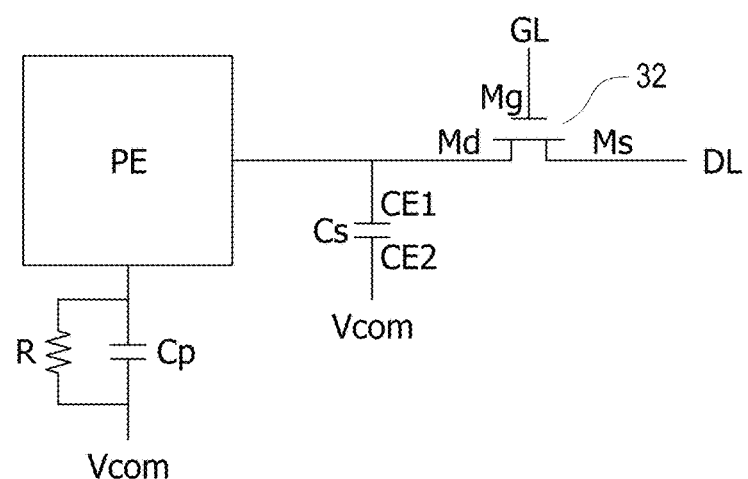
Figure 2C:
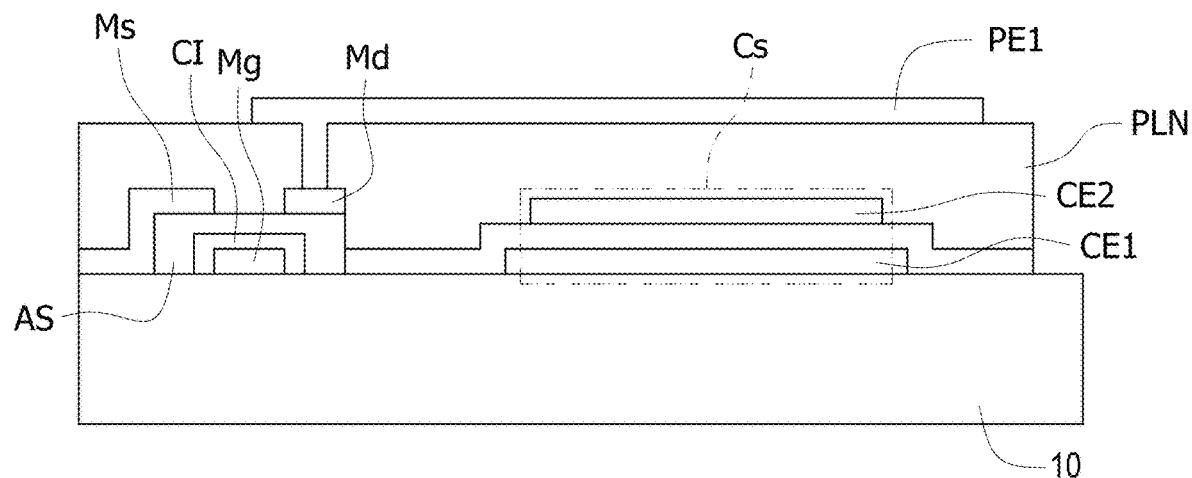
FIG. 2C illustrates the design of the storage capacitor.

The above color filter layer CF with the hole H may be applied in the related-art of the electrophoretic display 100, such as the electrophoretic display 100 shown in FIG. 2A; or may be applied in the electrophoretic display 100 with color including the driving circuit layer 30 with a high aperture ratio shown in FIGS. 3B-3C, FIGS. 4A-4C, and FIGS. 5A-5C in the present disclosure; or may be applied in the electrophoretic display 100 including the thin film transistor and color which may improve the aperture ratio shown in FIG. 6C in the present disclosure; or may be applied in the electrophoretic display 100 including the color filter layer CF on the side close to the control substrate shown in FIGS. 7B-7C and FIGS. 8A-8B in the present disclosure; or may be applied in the electrophoretic display 100 with color including the micro-partition structure 50 shown in FIGS. 12A-12C, FIGS. 13A-13C, FIG. 14D and FIG. 14E in the present disclosure; or may be applied in the electrophoretic display 100 with color and translucency shown in FIGS. 15C-15D, and FIGS. 16C-16D in the present disclosure. Therefore, the color filter layer CF used in the above-mentioned various embodiments and their combinations are within the protection scope of the present disclosure.

8. An Electrophoretic Display with an Embedded Touch

Refer to FIG. 19 which is a schematic diagram of the embedded touch of the electrophoretic display 100 in accordance with the present disclosure. Refer to the embodiments shown in FIG. 4A and FIG. 4B of the present disclosure. As shown in FIG. 4B, the common voltage line Ve of the transparent conductive electrode ITO1 (CE2) used to provide the second electrode of the storage capacitor Cs extends in a direction substantially parallel to the gate line GL. Furthermore, the data line DL made of the second metal layer M2 is substantially perpendicular to the common voltage line Ve. The insulation layer is disposed between the first electrode and the second electrode which are used to provide the storage capacitor Cs. The insulation layer between the data lines and the common voltage lines is in the same layer with an insulation layer of the storage capacitors (e.g. the insulation layer CI of the storage capacitor Cs, or the insulation layer of the thin film transistor 32 or extensions thereof). Therefore, the common voltage line Ve made of the data line DL and transparent conductive material may provide a capacitive touch sensing structure, so that the electrophoretic display 100 has the embedded touch function. Refer to FIG. 19, a plurality of common voltage lines Ve which are lined along the gate line GL extend to the peripheral edge of the display surface of the electrophoretic display 100 and are connected together in more than one line as a group inside or outside the display touch integrated driver 200 (TDDI). The following is an example of how four common voltage lines Ve may be electrically connected together into a group. However, according to the present disclosure of other feasible embodiments, other numbers of the common voltage lines Ve may also be electrically connected together into a group. Therefore, the following examples of the present disclosure are only examples and are not intended to be limiting the scope of the present disclosure. For example, if there are 4M common voltage lines Ve and every four common voltage lines Ve is a group and electrical connected together with one another, there are a total of M groups of the touch-receiving electrodes (Rx), and respectively electrically connected to the display touch integrated driver 200 (TDDI). In other words, according to one embodiment of the present disclosure, there are a total of 4M common voltage lines Ve which are electrically connected to the display touch integrated driver 200 (TDDI). Inside the display touch integrated driver 200 (TDDI), every four common voltage lines Ve are electrically connected together as a group through a plurality of switches to form M groups of the touch-receiving electrodes (Rx). Furthermore, according to another embodiment of the present disclosure, there are a total of 4M common voltage lines Ve, and every four common voltage lines Ve are electrically connected together. As a result, M groups of the touch-receiving electrodes (Rx) are formed. M groups of the touch-receiving electrodes (Rx) are electrically connected to the display touch integrated driver 200 (TDDI).

Furthermore, the data lines DL are disposed inside the display touch integrated driver 200 (TDDI) through the electrophoretic display 100 and are connected together in more than one line as a group by a plurality of switches. The following is an example of how four data line DL may be electrically connected together into a group. However, according to the present disclosure of other feasible embodiments, other numbers of the data line DL may also be electrically connected together into a group. Therefore, the following examples of the present disclosure are only examples and are not intended to be limiting the scope of the present disclosure. For example, if there are 4N data lines DL, and after the 4N data lines DL are electrically connected to the display touch integrated driver 200 (TDDI), every four data lines DL may be selectively electrically connected as a group in the display touch integrated driver 200 (TDDI) to form N groups of the touch-transmitting electrodes (Tx). In addition, the above-mentioned selective electrical connector specifically is that the display touch integrated driver 200 (TDDI) may selectively electrically connect every four data lines DL together as a group or selectively electrically disconnect every four data lines DL according to the required operations. By the above structure, an embedded touch with a resolution of M×N may be provided in the electrophoretic display.

During the image display stage of the electrophoretic display 100, the M groups of the touch-receiving electrodes (Rx) are electrically connected together inside the display touch integrated driver 200 (TDDI) as the common voltage line Ve (i.e. providing Vcom) uses. Moreover, the display touch integrated driver 200 (TDDI) controls all 4N data lines DL separated as a control signal for the output image. In the touch stage, M groups of the touch-receiving electrodes (Rx) are respectively used as touch input signal terminals, that is, after the display touch integrated driver 200 (TDDI) connects these common voltage lines Ve in groups and receives signals, and then sends them to a touch sensing circuit for subsequent processing. Furthermore, the display touch integrated driver 200 (TDDI) controls 4N data lines DL so that every four data lines DL are electrically connected as a group to provide N groups of the touch-transmitting electrodes (Tx) and provide emission signals from a touch drive circuit. As a result, an embedded touch structure with M×N is formed. In addition, the touch driver integrated circuit and the display driver integrated circuit are integrated into a display touch integrated driver 200 (TDDI) (Touch with Display Driver) may simplify the structure of the electrophoretic display 100 when providing touch and image display.

According to another embodiment of the present disclosure, these 4M common voltage lines Ve may also form M groups of the touch-transmitting electrodes (Tx). In contrast, these 4N data lines DL may also form N groups of the touch-receiving electrodes (Rx). For example, after 4N data lines DL electrically connected to the display touch integrated driver 200 (TDDI), every four data lines DL as a group may be selectively electrically connected in the display touch integrated driver 200 (TDDI) to form N groups of the touch-receiving electrodes (Rx). During the image display stage of the electrophoretic display 100, the M groups of the touch-transmitting electrodes (Tx) are electrically connected together inside the display touch integrated driver 200 (TDDI) as the common voltage line Ve (i.e. providing Vcom) uses. Moreover, the display touch integrated driver 200 (TDDI) controls all 4N data lines DL separated as a control signal for the output image. In the touch stage, a touch drive circuit provides emitting signals to the M groups of the touch-transmitting electrodes (Tx). Furthermore, the display touch integrated driver 200 (TDDI) controls 4N data lines DL so that every four data lines DL are electrically connected as a group to provide N groups of the touch-receiving electrodes (Rx), that is, after the display touch integrated driver 200 (TDDI) connects these data lines in groups and receives signals, and then sends them to a touch sensing circuit for subsequent processing. As a result, an embedded touch structure with M×N is formed. In addition, the touch driver integrated circuit and the display driver integrated circuit are integrated into a display touch integrated driver 200 (TDDI) (Touch with Display Driver) may simplify the structure of the electrophoretic display 100 when providing touch and image display. In addition, the display touch integrated driver 200 may also implement the touch sensing circuit and drive circuit on other chips, which is also within the scope of the present disclosure.

Integrating the above description, when performing touch operations, the display touch integrated driver electrically connects the data lines together as a single touch-transmitting electrode; and the display touch integrated driver electrically connects the common voltage lines together as a single touch-receiving electrode. Alternatively, when performing touch operations, the display touch integrated driver electrically connects the data lines together as a single touch-receiving electrode, and the display touch integrated driver electrically connects the common voltage lines together as a single touch-transmitting electrode. The above two manners are within the scope of the present disclosure.

In the above description, although 4M common voltage lines Ve are taken as an example, and every four common voltage lines Ve are electrically connected to one another as a group to form M groups of the touch-receiving electrodes (Rx) or M groups of the touch-transmitting electrodes (Tx) as an explanation, the above example should not be intended to be limiting the scope of the present disclosure. Those skilled in the art may design a group of the common voltage lines Ve to be electrically connected to one another in different numbers (at least more than one). In the above description, although 4N data lines DL are taken as an example, and every four data lines DL are electrically connected to one another as a group to form N groups of the touch-transmitting electrodes (Tx) or N groups of the touch-receiving electrodes (Rx) as an explanation, the above example should not be intended to be limiting the scope of the present disclosure. Those skilled in the art may design a group of the data lines DL to be electrically connected to one another in different numbers (at least more than one).

The electrophoretic display with an embedded touch shown in FIG. 19 may have a driving circuit layer 30 with a high aperture ratio and the structure of the control electrode layer PEL, as shown in the present disclosure FIGS. 3B-3C, FIGS. 4A-4C, and FIGS. 5A-5C. Furthermore, the electrophoretic display with an embedded touch shown in FIG. 19 may have the micro-partition structure 50 and the corresponding structure of the micro tenon 60, as shown in the present disclosure FIGS. 12A-12C, FIGS. 13A-13C, and FIGS. 14A-14E.

9. An Electrophoretic Display with Double-Sided Control Substrates

Figure 20A:
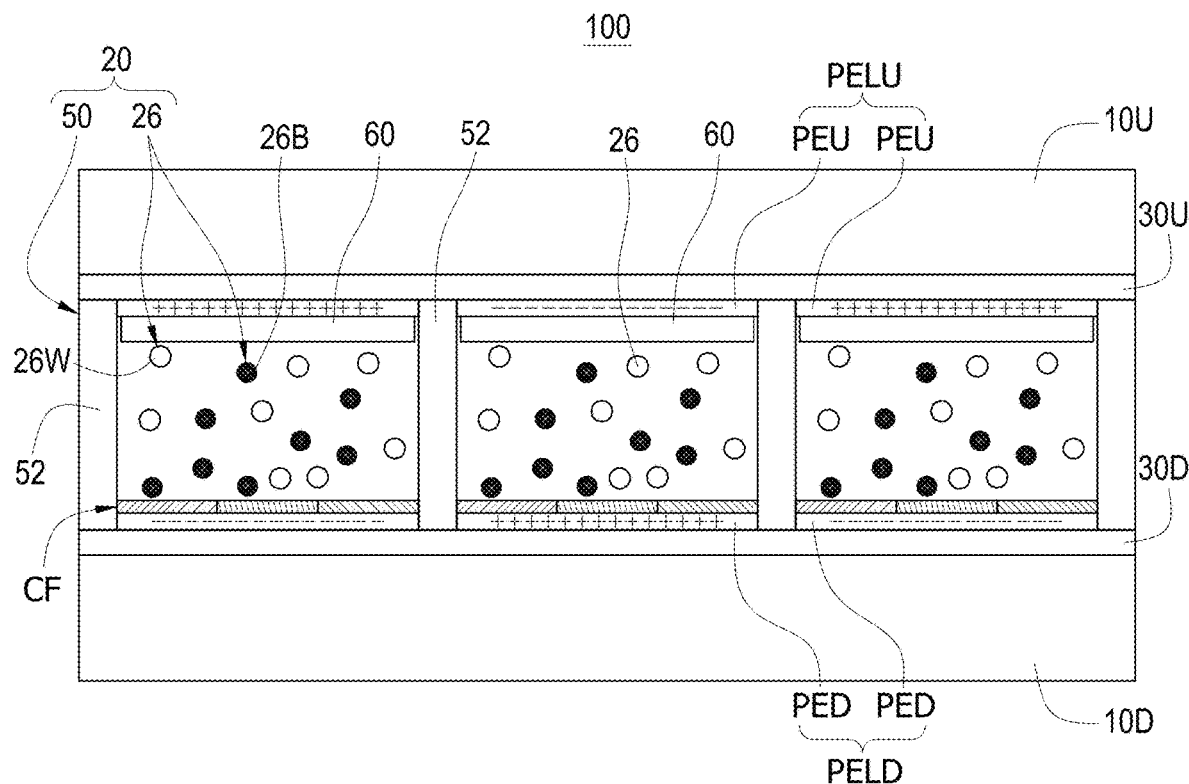
FIG. 20A to FIG. 20C is a schematic diagram of the electrophoretic display with the double-sided control substrate in accordance with an embodiment of the present disclosure.

FIG. 20A is the electrophoretic display with a double-sided control substrate in accordance with an embodiment of the present disclosure. This electrophoretic display 100 with double-sided control substrates includes, from top to bottom, a second control substrate 10U, a micro-partition structure 50, and a first control substrate 10D. Furthermore, the first control substrate 10D includes a first face and a second face closing to the micro-partition structure 50. The second face of the first control substrate 10D includes a first driving circuit layer 30D with a high aperture ratio and a first control electrode layer PELD (with a plurality of first control electrodes PED), on the second face. Furthermore, the second control substrate 10U includes a fourth face and a third face closing to the micro-partition structure 50. The third face of the second control substrate 10U includes a second driving circuit layer 30U with a high aperture ratio and a second control electrode layer PELU (with a plurality of second control electrodes PEU), on the third face. According to one embodiment of the present disclosure, when making the electrophoretic display 100 with double-sided control substrates, the micro-partition structure 50 with a plurality of partition walls 52 is made on the side of the first control substrate 10D. In more detail, first, the process makes the first driving circuit layer 30D, the first transparent control electrode layer PELD, and the insulating protective layer (not shown in figures) on the first control substrate 10D. Then the process makes the color filter layer CF. In the embodiment, the manufacturing process of the partition wall 52 of FIG. 17A to FIG. 17F may be performed after the color filter layer CF is made, or the manufacturing process of the partition wall 52 of FIG. 17A to FIG. 17F may be performed after the flat layer PLN is made on the color filter layer CF. The material of the above flat layer PLN may be organic insulating material, inorganic insulating material, or a combination thereof. After making the partition wall 52, the process fills in the colloidal solution in the chamber 54 defined by the partition wall 52 may be under vacuum conditions. The colloidal solution includes the charged black particles 26B and the charged white particles 26W. Then, the process performs the manufacturing process of bonding the second control substrate 10U; that is, the process provides a second control substrate 10U including a second driving circuit layer 30U with a high aperture ratio and a second control electrode layer PELU. In addition, as shown in FIG. 20A, the second control electrode layer PELU has the micro tenon 60 corresponding to the shape of the chamber 54.

Refer to FIG. 14F, the micro tenon 60 may adopt the area of the micro tenon remaining after the photoresist is exposed and developed, and the rest area is washed away. In addition, the production of the micro tenon may adopt the area of the micro tenon remaining from the flat layer PLN after the photolithography process. A certain gap S may be maintained between the micro tenon 60 and the side walls of the chamber 54 of the micro-partition structure 50 as an alignment margin. This gap S is, for example, 1~50 μm. According to an embodiment of the present disclosure, this gap range is between 1~5 μm, depending on the accuracy of the photomask alignment. This gap is used as the error tolerance range during alignment and bonding to avoid damage caused by collision between the micro-partition and the micro tenon due to errors during alignment and bonding. The thickness of the micro tenon may be 0.5~50 μm. The thicker the thickness, the stronger the sealing, but it may affect the attractive force or repulsive force of the control electrode, so the degree of sealing and the electrical effect need to be properly distributed. According to an embodiment of the present disclosure, the thickness range of the micro tenon 60 is also between 1~5 μm.

As shown in FIG. 20A, using the first control electrode PED and the second control electrode PEU to apply voltages of different polarities during driving may accelerate the movement of charged particles, dissociate the agglomeration phenomenon caused by the agglomeration of positively and negatively charged particles, speeding up the screen refresh speed, and improving the reflectivity. When the upper second driving circuit layer 30U controls the electrode (the second control electrode PEU) of the second control substrate 10U to be negatively charged, and the lower first driving circuit layer 30D controls the corresponding electrode (the first control electrode PED) of the first control substrate 10D to be positively charged, the black particles 26B with positive charge may move to the upper second control electrode PEU and the white particles 26W with negative charges may move to the lower first control electrode PED. As a result, the position of the lower first control electrode PED matches the corresponding color filter block of the color filter layer CF to display color pixels. More specifically, since the lower first driving circuit layer 30D controls this first control electrode PED to generate an attractive force for the white particles 26W with negative charges, the white particles are attached to the surface of the first control electrode PED. As a result, the color of the light that passes through the color filter block after being reflected by the white particles may be seen from the first face of the first control substrate 10D. Since the upper second driving circuit layer 30U controls the second control electrode PEU to generate a repulsive force for the white particles 26W with negative charges, the movement of white particles towards the first control electrode PED is accelerated. As a result, the screen refresh speed of the electrophoretic display with double-sided control substrates is accelerated. The above operation takes the viewing surface on the first face as an example. A color image with a better screen refresh speed may be displayed at the first face. Similarly, if the viewing surface is on the fourth surface (the side furthest from the first face) of the second control substrate 10U, a black-and-white image with a better refresh speed may be displayed on the fourth surface. In addition, the attractive and repulsive forces generated by the two substrates are much greater than those of the related-art, and may effectively dissociate the agglomeration phenomenon caused by the agglomeration of positively and negatively charged particles. As a result, a higher-density of charged particles may be used, and the number of stacked layers of particles in the control electrode PEU and PED may be increased to increase the light reflectivity.

Figure 20B:
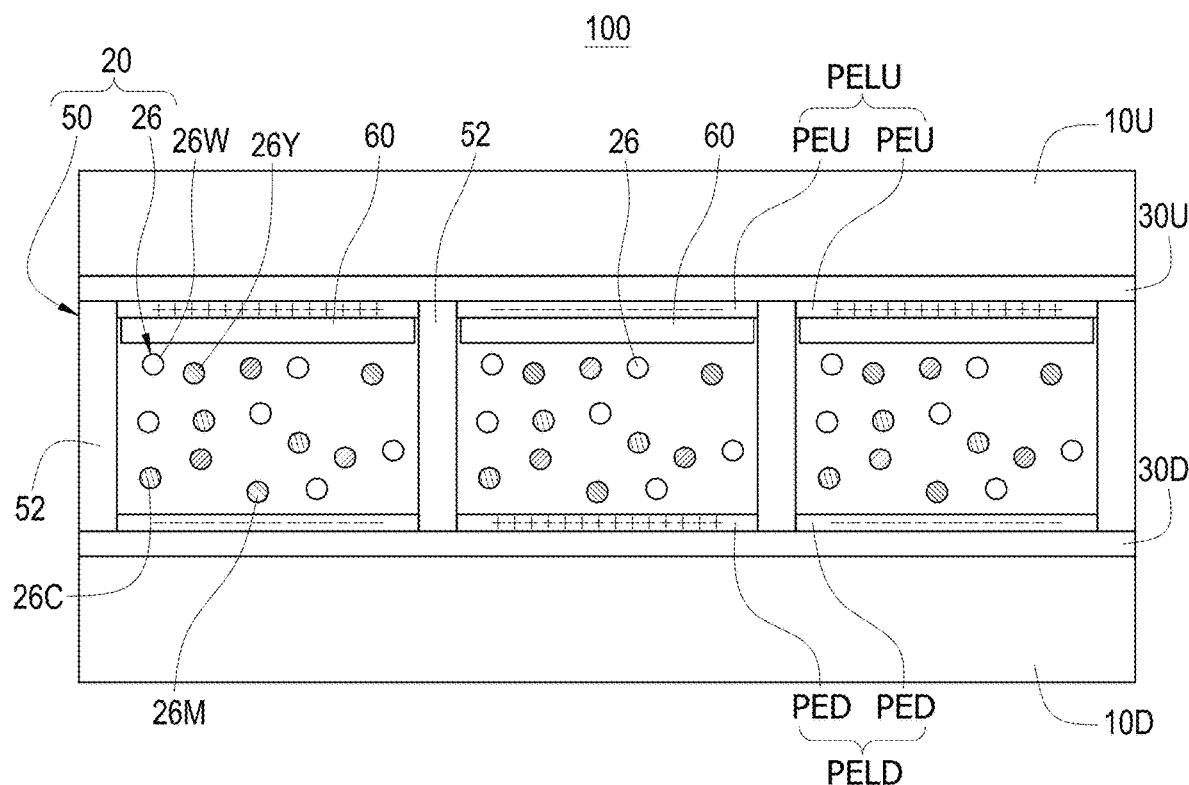

FIG. 20B is the electrophoretic display with double-sided control substrates in accordance with another embodiment of the present disclosure. This electrophoretic display 100 with double-sided control substrates includes, from top to bottom, a second control substrate 10U, a micro-partition structure 50, and a first control substrate 10D. Furthermore, the first control substrate 10D includes a first face and a second face close to the micro-partition structure 50. The second face of the first control substrate 10D includes a first driving circuit layer 30D with a high aperture ratio and a first control electrode layer PELD (with a plurality of first control electrodes PED) on the second face. Furthermore, the second control substrate 10U includes a fourth face and a third face close to the micro-partition structure 50. The third face of the second control substrate 10U includes a second driving circuit layer 30U with a high aperture ratio and a second control electrode layer PELU (with a plurality of second control electrodes PEU) on the third face. According to one embodiment of the present disclosure, when making the electrophoretic display 100 with double-sided control substrates, the micro-partition structure 50 with a plurality of partition walls 52 is made on the side of the first control substrate 10D. In more detail, first, the process makes the first driving circuit layer 30D, the first transparent control electrode layer PELD, and the insulating protective layer (not shown in figures) on the first control substrate 10D. Then, the manufacturing process of the partition wall 52 of FIG. 17A to FIG. 17F may be performed on the first control electrode layer PELD, or the manufacturing process of the partition wall 52 of FIG. 17A to FIG. 17F may be performed after the flat layer PLN is made on the first control electrode layer PELD. The material of the above flat layer PLN may be organic insulating material, inorganic insulating material, or a combination thereof. After making the partition wall 52, the process fills in the colloidal solution in the chamber 54 defined by the partition wall 52 may be under vacuum conditions. The colloidal solution includes the charged cyan particles 26C, the charged magenta particles 26M, the charged yellow particles 26Y, and the charged white particles 26W. Then, the process performs the manufacturing process of bonding the second control substrate 10U; that is, the process provides a second control substrate 10U including a second driving circuit layer 30U with a high aperture ratio and a second control electrode layer PELU. In addition, as shown in FIG. 20B, the second control electrode layer PELU has the micro tenon 60 corresponding to the shape of the chamber 54.

Refer to FIG. 14F, the micro tenon 60 may adopt the area of the micro tenon remaining after the photoresist is exposed and developed, and the rest area is washed away. In addition, the production of the micro tenon may adopt the area of the micro tenon remaining from the flat layer PLN after the photolithography process. A certain gap S may be maintained between the micro tenon 60 and the side walls of the chamber 54 of the micro-partition structure 50 as an alignment margin. This gap S is, for example, 1~50 μm. According to an embodiment of the present disclosure, this gap range is between 1~5 μm, depending on the accuracy of the photomask alignment. This gap is used as the error tolerance range during alignment and bonding to avoid damage caused by collision between the micro-partition and the micro tenon due to errors during alignment and bonding. The thickness of the micro tenon may be 0.5~50 μm. The thicker the thickness, the stronger the sealing, but it may affect the attractive force or repulsive force of the control electrode, so the degree of sealing and the electrical effect need to be properly distributed. According to an embodiment of the present disclosure, the thickness range of the micro tenon 60 is also between 1~5 μm.

As shown in FIG. 20B, when the upper second driving circuit layer 30U controls the electrode (the second control electrode PEU) of the second control substrate 10U to be negatively charged, and the lower first driving circuit layer 30D controls the corresponding electrode (the first control electrode PED) of the first control substrate 10D to be positively charged, the charged cyan particles 26C (positive charge), the charged magenta particles 26M (positive charge), the charged yellow particles 26Y (negative charges) and the charged white particles 26W (negative charges) may be controlled to move in corresponding directions. For example, since the lower first driving circuit layer 30D controls this first control electrode PED to generate an attractive force for the negatively charged white particles 26W and the yellow particles 26Y, and to generate a repulsive force for the positively charged magenta particles 26M and cyan particle 26C. the upper first driving circuit layer 30U controls this second control electrode PEU to generate an attractive force for the positively charged magenta particles 26M and cyan particle 26C, and to generate a repulsive force for the negatively charged white particles 26W and the yellow particles 26Y. And because the attractive force may be different depending on the number of charges, the movement behavior of the four charged particles may be controlled by changes in voltage and polarity. Due to the different charge polarities of the double-sided control electrode PED and PEU, the charge may move several times faster than the related-art, to speed up the screen refresh speed, and to solve the agglomeration phenomenon that occurs when the density of charged particles is high. The colloidal solution of higher-density charged particles may be used to increase the number of particle stack layers contacting the surfaces of the control electrode PED and PEU and increase light reflectivity. The shortcoming of insufficient reflectivity of related-art may be improved, and the advantages of better screen refresh speed and reflectivity of the electrophoretic display 100 with double-sided control substrates may be achieved.

Figure 20C:
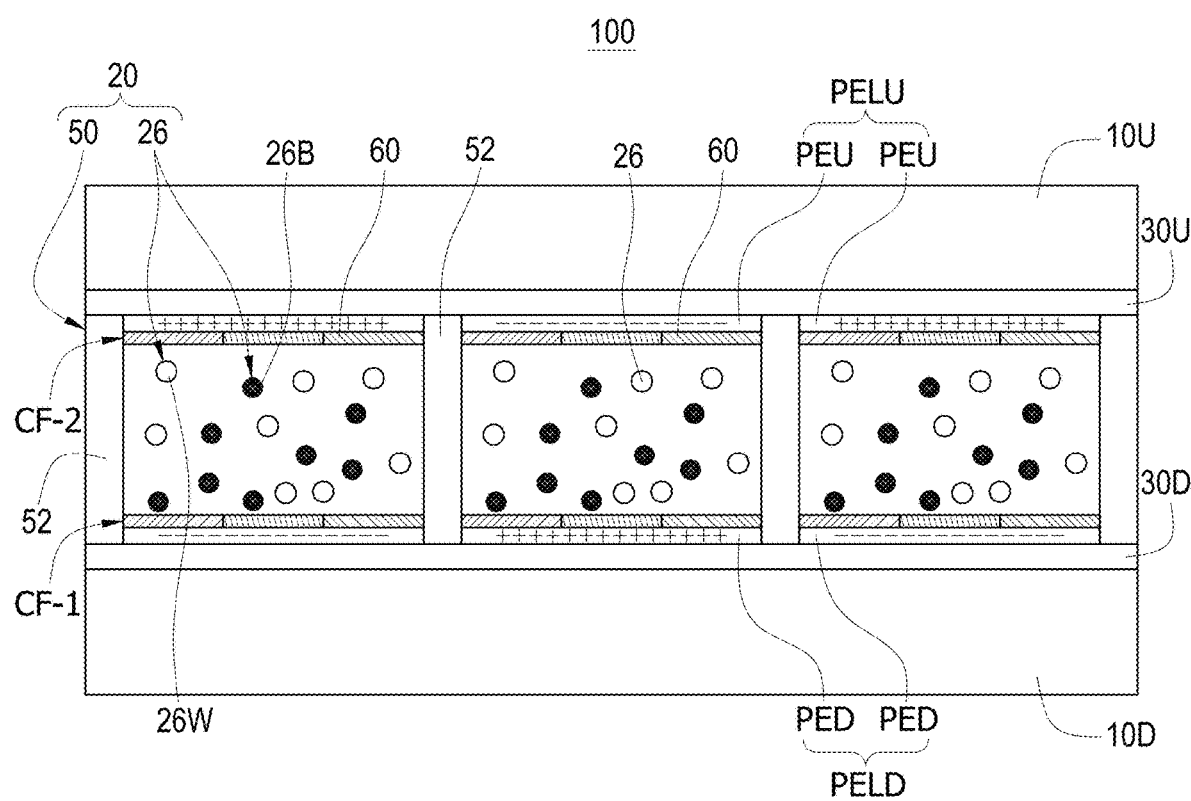

FIG. 20C is the electrophoretic display with double-sided control substrates in accordance with another embodiment of the present disclosure. This electrophoretic display 100 with double-sided control substrates includes, from top to bottom, a second control substrate 10U, a micro-partition structure 50, and a first control substrate 10D. Furthermore, the first control substrate 10D includes a first face and a second face close to the micro-partition structure 50. The second face of the first control substrate 10D includes a first driving circuit layer 30D with a high aperture ratio and a first control electrode layer PELD (with a plurality of first control electrodes PED), on the second face. Furthermore, the second control substrate 10U includes a fourth face and a third face close to the micro-partition structure 50. The third face of the second control substrate 10U includes a second driving circuit layer 30U with a high aperture ratio and a second control electrode layer PELU (with a plurality of second control electrodes PEU), on the third face. According to one embodiment of the present disclosure, when making the electrophoretic display 100 with double-sided control substrates, the micro-partition structure 50 with a plurality of partition walls 52 is made on the side of the first control substrate 10D. In more detail, first, the process makes the first driving circuit layer 30D, the first transparent control electrode layer PELD, and the insulating protective layer (not shown in figures) on the first control substrate 10D. Then, the process makes the first color filter layer CF-1. In the embodiment, the manufacturing process of the partition wall 52 of FIG. 17A to FIG. 17F may be performed after the first color filter layer CF-1 is made, or the manufacturing process of the partition wall 52 of FIG. 17A to FIG. 17F may be performed after the flat layer PLN is made on the first color filter layer CF-1. The material of the above flat layer PLN may be organic insulating material, inorganic insulating material, or a combination thereof. After making the partition wall 52, the process fills in the colloidal solution in the chamber 54 defined by the partition wall 52 under vacuum conditions. The colloidal solution includes the charged black particle 26B and the charged white particle 26W. Then, the process performs the manufacturing process of bonding the second control substrate 10U; that is, the process provides a second control substrate 10U including a second driving circuit layer 30U with a high aperture ratio and a second control electrode layer PELU. In addition, as shown in FIG. 20C, the second control electrode layer PELU has a second color filter layer CF-2 thereon. Moreover, the process uses the optical adhesives between the second control substrate 10U and the partition wall 52 or applies the frame glue on the four borders of the display area and then bonds them. Then, the process puts the two substrates into the gas pressure chamber to be heated and pressurized. Then, the process squeezes the colloidal solution and fills the gaps within the micro-partition structure 50. Finally, the process solidifies the optical adhesives or the frame glue to complete the finished product of the electrophoretic display 100.

As shown in FIG. 20C, when the upper second driving circuit layer 30U controls the electrode (the second control electrode PEU) of the second control substrate 10U to be negatively charged, and the lower first driving circuit layer 30D controls the corresponding electrode (the first control electrode PED) of the first control substrate 10D to be positively charged, the black particles 26B with positive charge may move to the upper second control electrode PEU and the white particles 26W with negative charges may move to the lower first control electrode PED. As a result, the position of the lower first control electrode PED matches the corresponding color filter block of the color filter layer CF to display color pixels. More specifically, since the lower first driving circuit layer 30D controls this first control electrode PED to generate an attractive force for the white particles 26W with negative charges and the upper second driving circuit layer 30U controls the second control electrode PEU to generate a repulsive force for the white particles 26W with negative charges, the movement speed of white particles 26W may be accelerated and better screen refresh speed of the electrophoretic display with double-sided control substrates 100 may be achieved. In addition, the attractive and repulsive forces generated by the two substrates are much greater than those of the related-art, and may effectively dissociate the agglomeration phenomenon caused by the agglomeration of positively and negatively charged particles. As a result, a higher-density of charged particles may be used, and the number of stacked layers of particles in the control electrode PEU and PED may be increased to increase the light reflectivity.

As shown in FIG. 20C, when the upper second driving circuit layer 30U controls the electrode (the second control electrode PEU) of the second control substrate 10U, and the lower first driving circuit layer 30D controls the corresponding electrode (the first control electrode PED) of the first control substrate 10D, the charges of PEU and PED form the voltage required for their respective display screens, it may be used as an electrophoretic display with different color images on both sides of an embodiment of the present disclosure. When the upper and lower electrodes (the second control electrode PEU above and corresponding the lower first control electrode PED) have the same polarity, for example, when they are both positively charged, the white particles 26W with negative charges may move to the upper and lower electrodes, so that, the upper and lower electrodes display the color of the color filter reflected by the white pixels, and the black particles 26B with positive charge move toward the center and are hidden by the white particles 26W and may not be seen. On the contrary, when both the upper and lower electrodes are negatively charged, the black particles 26B with positive charge may move to the upper and lower electrodes, and the white particles 26W may move to the middle and are hidden by the black particles 26B and may not be seen. At this time, the upper and lower electrodes display black pixels. For example, when the charge polarities of the upper and lower electrodes are reversed, the positively charged black particles 26B may move toward the negatively charged control electrode and display black and the negatively charged white particles 26W may move toward the positively charged control electrode and display the color of the color filter reflected by the white pixels. As a result, the image seen on the first face of 10D may be different from the image seen on the fourth surface of 10U, to present an electrophoretic display 100 with different color images on both sides.

However, the above are only preferred embodiments of the invention, and the scope of implementation of the invention cannot be limited. That is, all equal changes and modifications made in accordance with the scope of the patent application of the invention should still fall within the scope of the patent scope of the invention. The invention may have various other embodiments, without departing from the spirit and essence of the invention, those skilled in the art can make various corresponding changes and modifications according to the invention. However, these corresponding changes and modifications should all fall within the protection scope of the patent application scope attached to the invention. In summary, the invention is known to have Industrially Applicable, Novelty, and Non-Obviousness. Moreover, the structure of the invention has not been seen in similar products and used in public, fully complies with the requirements for the application for an invention patent, and is filed in accordance with the Patent Law.

What is claimed is:

1. An electrophoretic display with a high aperture ratio, comprising:
    a control substrate, comprising a first face and a second face;
    a driving circuit layer, arranged on the second face of the control substrate and comprising a plurality of thin film transistors, a plurality of gate lines, and a plurality of data lines, at least one of the gate lines electrically connected to gates of the thin film transistors, at least one of the data lines electrically connected to drains or sources of the thin film transistors;
    a control electrode layer, arranged on a side of the driving circuit layer away from the control substrate and comprising a plurality of transparent control electrodes, at least one of the transparent control electrodes electrically connected to the source or the drain of one of the thin film transistors;
    an electrophoresis layer, comprising an electrophoresis material, the electrophoresis material comprising a plurality of charged color particles, the charged color particles arranged in a colloidal solution and moving through the colloidal solution under the influence of an electric field, the charged color particles comprising positively charged color particles and/or negatively charged color particles; and
    an opposite substrate, arranged on a side of the electrophoresis layer away from the control substrate;
    wherein, the first face is a viewing face of the electrophoretic display;
    wherein, a semiconductor part of the thin film transistor at least partially overlaps with one of the gate lines or one of the data lines in a projection direction.

2. The electrophoretic display with a high aperture ratio of claim 1, wherein, along a direction looking from the first face of the control substrate into a display region of the electrophoretic display, an aperture ratio of the control substrate of the electrophoretic display is not less than 80%.

3. The electrophoretic display with a high aperture ratio of claim 1, wherein, the driving circuit layer further comprises a plurality of storage capacitors, at least the storage capacitor in a viewing area of the electrophoretic display comprises a first electrode being transparent, a second electrode being transparent, and an insulation layer between the first electrode and the second electrode.

4. The electrophoretic display with a high aperture ratio of claim 3, wherein, the first electrode and the second electrode are between a second metal layer and the electrophoresis layer.

5. The electrophoretic display with a high aperture ratio of claim 3, wherein, the first electrode and the second electrode are between a semiconductor part of the thin film transistor and the electrophoresis layer.

6. The electrophoretic display with a high aperture ratio of claim 3, wherein, the first electrode and the second electrode are between the control substrate and the control electrode layer.

7. The electrophoretic display with a high aperture ratio of claim 3, wherein, the first electrode and the second electrode are between the control substrate and a flat layer.

8. The electrophoretic display with a high aperture ratio of claim 3, wherein, the second electrode extended in a direction parallel to the gate line.

9. The electrophoretic display with a high aperture ratio of claim 3, wherein, the second electrode extended in a direction parallel to the data line.

10. The electrophoretic display with a high aperture ratio of claim 1, wherein, the gate lines are partially made of a transparent conductive material or the data lines are partially made of a transparent conductive material; along a direction looking from the first face of the control substrate into a display region of the electrophoretic display, an aperture ratio of the control substrate of the electrophoretic display is not less than 90%.

11. The electrophoretic display with a high aperture ratio of claim 1, wherein, an overlapping area of the semiconductor part of one of the thin film transistors and one of the data lines in a projection direction is more than 5 square micrometers ($\mu m^2$).

12. The electrophoretic display with a high aperture ratio of claim 1, wherein, an overlapping area of the semiconductor part of one of the thin film transistors and one of the gate lines in a projection direction is more than 20 square micrometers ($\mu m^2$).

13. The electrophoretic display with a high aperture ratio of claim 1, wherein, an area of the semiconductor part of the thin film transistor is less than 1000 square micrometers ($\mu m^2$).

14. The electrophoretic display with a high aperture ratio of claim 1, wherein, a gate channel length of the thin film transistor is not more than 5 $\mu m$.

15. The electrophoretic display with a high aperture ratio of claim 1, wherein, a gate channel length of the thin film transistor is less than 10 $\mu m$.

16. The electrophoretic display with a high aperture ratio of claim 1, wherein, a gate channel width of the thin film transistor is not more than 5 times of a gate channel length of the thin film transistor.

17. The electrophoretic display with a high aperture ratio of claim 1, wherein, a gate channel width of the thin film transistor is not more than 25 $\mu m$.

18. The electrophoretic display with a high aperture ratio of claim 1, wherein, a gate channel width of the thin film transistor is not more than 50 $\mu m$.

19. The electrophoretic display with a high aperture ratio of claim 1, further comprising:
a common electrode layer, disposed on the opposite substrate, the electrophoresis layer comprising a micro-partition structure disposed on the common electrode layer, the micro-partition structure comprising a plurality of partition walls to define a plurality of chambers configured to fill with the electrophoresis material.

20. The electrophoretic display with a high aperture ratio of claim 19, further comprising:
a plurality of micro tenons, each of the micro tenons arranged on the control electrode layer and embedded in one of the chambers.

21. The electrophoretic display with a high aperture ratio of claim 1, further comprising:
a color filter layer, disposed on the second face.

22. The electrophoretic display with a high aperture ratio of claim 21, wherein, the color filter layer comprises a plurality of color filter blocks with different colors, a plurality of holes is disposed on the color filter blocks, and an area of at least one of the holes is not more than 100 $\mu m^2$.

23. The electrophoretic display with a high aperture ratio of claim 1, wherein, the driving circuit layer, further comprises:
a plurality of storage capacitors and a plurality of common voltage lines, the common voltage lines respectively disposed corresponding to the storage capacitors and substantially parallel to the gate lines or the data lines, the common voltage lines electrically connected to a display touch integrated driver.

24. The electrophoretic display with a high aperture ratio of claim 23, wherein, during a touch operation of the electrophoretic display, the display touch integrated driver electrically connects a plurality of the data lines together as a single touch-transmitting electrode; the display touch integrated driver electrically connects a plurality of the common voltage lines together as a single touch-receiving electrode.

25. The electrophoretic display with a high aperture ratio of claim 23, wherein, during a touch operation of the electrophoretic display, the display touch integrated driver electrically connects a plurality of the data lines together as a single touch-receiving electrode; the display touch integrated driver electrically connects a plurality of the common voltage lines together as a single touch-transmitting electrode.

26. The electrophoretic display with a high aperture ratio of claim 1, wherein, charges on the transparent control electrodes attract the charged color particles with different charge polarities to accumulate on a surface of the electrophoresis layer close to the transparent control electrodes to form an image on the viewing face.

* * * * *